US008703384B2

(12) United States Patent
Kobayashi et al.

(10) Patent No.: US 8,703,384 B2
(45) Date of Patent: Apr. 22, 2014

(54) POSITIVE RESIST COMPOSITION AND PATTERNING PROCESS

(75) Inventors: Tomohiro Kobayashi, Joetsu (JP); Eiji Fukuda, Joetsu (JP); Takayuki Nagasawa, Joetsu (JP); Ryosuke Taniguchi, Joetsu (JP); Youichi Ohsawa, Joetsu (JP); Masayoshi Sagehashi, Joetsu (JP); Yoshio Kawai, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 133 days.

(21) Appl. No.: 13/303,302

(22) Filed: Nov. 23, 2011

(65) Prior Publication Data

US 2012/0135350 A1    May 31, 2012

(30) Foreign Application Priority Data

Nov. 25, 2010    (JP) ................. 2010-262389

(51) Int. Cl.
*G03F 7/00*    (2006.01)
*G03F 7/004*    (2006.01)

(52) U.S. Cl.
USPC ......... 430/270.1; 430/913; 430/919; 430/920

(58) Field of Classification Search
USPC ................. 430/270.1, 913, 919, 920
See application file for complete search history.

(56) References Cited

U.S. PATENT DOCUMENTS

| 4,268,681 | A  | * | 5/1981  | Sasse et al. ............. 548/333.5 |
| 4,493,842 | A  | * | 1/1985  | Furuzawa et al. ............. 514/397 |
| 4,902,705 | A  | * | 2/1990  | Hirota et al. .............. 514/397 |
| 5,484,916 | A  | * | 1/1996  | Bruchmann et al. .......... 540/202 |
| 5,623,023 | A  | * | 4/1997  | Nishikubo .................. 525/327.3 |
| 6,174,985 | B1 | * | 1/2001  | Hall-Goulle ................ 528/117 |
| 6,312,867 | B1 |   | 11/2001 | Kinsho et al. |
| 6,322,949 | B2 |   | 11/2001 | Suwa et al. |
| 6,359,145 | B1 | * | 3/2002  | Terasaka et al. ........... 548/333.5 |
| 6,455,662 | B2 | * | 9/2002  | Hall-Goulle ................ 528/117 |
| 6,908,940 | B2 | * | 6/2005  | Tsuji et al. ................ 514/400 |
| 7,252,925 | B2 | * | 8/2007  | Watanabe et al. ........... 430/270.1 |
| 7,261,995 | B2 | * | 8/2007  | Watanabe et al. ........... 430/270.1 |
| 7,511,169 | B2 |   | 3/2009  | Ohsawa et al. |
| 7,569,326 | B2 | * | 8/2009  | Ohsawa et al. ............. 430/270.1 |
| 7,771,913 | B2 |   | 8/2010  | Kaneko et al. |
| 7,771,914 | B2 |   | 8/2010  | Hatakeyama et al. |
| 8,048,610 | B2 | * | 11/2011 | Ohsawa et al. ............. 430/270.1 |
| 8,057,985 | B2 | * | 11/2011 | Ohashi et al. .............. 430/270.1 |
| 8,105,748 | B2 | * | 1/2012  | Ohashi et al. .............. 430/270.1 |
| 8,114,571 | B2 | * | 2/2012  | Ohashi et al. .............. 430/270.1 |
| 8,361,693 | B2 | * | 1/2013  | Masunaga et al. .......... 430/270.1 |
| 2006/0149051 | A1 | * | 7/2006 | Schlama et al. ............. 536/25.3 |
| 2007/0149702 | A1 | * | 6/2007 | Ando et al. ................. 524/556 |
| 2007/0242120 | A1 | * | 10/2007 | Tsuchimura et al. ......... 347/100 |
| 2009/0081588 | A1 |   | 3/2009  | Hatakeyama et al. |
| 2009/0208867 | A1 |   | 8/2009  | Harada et al. |
| 2009/0208873 | A1 |   | 8/2009  | Harada et al. |
| 2009/0274978 | A1 |   | 11/2009 | Ohashi et al. |
| 2009/0280434 | A1 |   | 11/2009 | Harada et al. |
| 2010/0075256 | A1 | * | 3/2010  | Joo et al. ................... 430/286.1 |
| 2010/0112482 | A1 |   | 5/2010  | Watanabe et al. |
| 2010/0136482 | A1 |   | 6/2010  | Harada et al. |
| 2011/0189607 | A1 | * | 8/2011  | Ohashi et al. .............. 430/270.1 |
| 2012/0045724 | A1 | * | 2/2012  | Ohsawa et al. ............. 430/325 |
| 2012/0052441 | A1 | * | 3/2012  | Sagehashi et al. .......... 430/270.1 |
| 2012/0100487 | A1 | * | 4/2012  | Hirano et al. .............. 430/325 |
| 2012/0135357 | A1 | * | 5/2012  | Kobayashi et al. .......... 430/326 |

FOREIGN PATENT DOCUMENTS

| EP | 2112554 A2 | * | 10/2009 |
| JP | 2000-336121 A |   | 12/2000 |
| JP | 3632410 B2 |   | 3/2005 |
| JP | 2007-145797 A |   | 6/2007 |
| JP | 3995575 B2 |   | 10/2007 |
| JP | 2007-297590 A |   | 11/2007 |
| JP | 2007-298569 A |   | 11/2007 |
| JP | 2008-122932 A |   | 5/2008 |
| JP | 2008-133448 A |   | 6/2008 |
| JP | 2008-299069 A |   | 12/2008 |
| JP | 2009-98638 A |   | 5/2009 |
| JP | 2009-191151 A |   | 8/2009 |
| JP | 2009-192784 A |   | 8/2009 |
| JP | 2009-269953 A |   | 11/2009 |
| JP | 2009-276363 A |   | 11/2009 |
| JP | 2010-20204 A |   | 1/2010 |
| JP | 2010-107695 A |   | 5/2010 |
| JP | 2010-134012 A |   | 6/2010 |

OTHER PUBLICATIONS

B. J. Lin: Semiconductor Foundry, Lithography, and Partners, Micropatterning Division, TSMC, Inc., Proc. SPIE, vol. 4690, pp. xxix-xlii, (2002).

Soichi Owa et al.: "Immersion lithography; its potential performance and issues", Optical Microlithography XVI, Proceedings of SPIE vol. 5040, pp. 724-733, (2003).

* cited by examiner

*Primary Examiner* — Amanda C. Walke
(74) *Attorney, Agent, or Firm* — Birch, Stewart, Kolasch & Birch, LLP

(57) ABSTRACT

A positive resist composition comprising (A) a polymer comprising recurring units of a specific structure adapted to generate an acid in response to high-energy radiation and acid labile units, the polymer having an alkali solubility that increases under the action of an acid, and (B) a sulfonium salt of a specific structure exhibits a high resolution in forming fine size patterns, typically trench patterns and hole patterns. Lithographic properties of profile, DOF and roughness are improved.

6 Claims, No Drawings

US 8,703,384 B2

POSITIVE RESIST COMPOSITION AND PATTERNING PROCESS

CROSS-REFERENCE TO RELATED APPLICATION

This non-provisional application claims priority under 35 U.S.C. §119(a) on Patent Application No. 2010-262389 filed in Japan on Nov. 25, 2010, the entire contents of which are hereby incorporated by reference.

TECHNICAL FIELD

This invention relates to a positive resist composition which lends itself to lithography using ArF excimer laser with wavelength 193 nm for micropatterning in the fabrication of semiconductor devices or the like, especially immersion lithography where water is interposed between a projection lens and a wafer, and a pattern forming process using the composition.

BACKGROUND ART

In the recent drive for higher integration densities and operating speeds in LSI devices, the pattern rule is made drastically finer. The photolithography which is currently on widespread use in the art is approaching the essential limit of resolution determined by the wavelength of light.

As the exposure light used in the lithography for resist pattern formation, g-line (436 nm) or i-line (365 nm) from a mercury lamp was widely used in the past. Reducing the wavelength of exposure light was believed effective as the means for further reducing the feature size. For the mass production process of 64 MB dynamic random access memories (DRAM, processing feature size 0.25 µm or less) and later ones, the exposure light source of i-line (365 nm) was replaced by a KrF excimer laser having a shorter wavelength of 248 nm.

However, for the fabrication of DRAM with a degree of integration of 256 MB and 1 GB or more requiring a finer patterning technology (processing feature size 0.2 µm or less), a shorter wavelength light source was required. Photolithography using ArF excimer laser light (193 nm) has been under active investigation.

It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices.

For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the $F_2$ lithography was postponed and instead, the early introduction of ArF immersion lithography was advocated (see Proc. SPIE Vol. 4690 xxix).

In the ArF immersion lithography, water is held between the projection lens and the wafer. Since water has a refractive index of 1.44 at 193 nm, pattern formation is possible even using a lens with NA of 1.0 or greater. Theoretically the NA of lens can be increased to 1.35. The resolution is improved by an increment of NA. A combination of a lens having NA of at least 1.2 with strong super-resolution technology suggests a way to the 45-nm node (see Proc. SPIE Vol. 5040, p 724).

However, as the circuit line width is reduced, the influence of contrast being degraded by acid diffusion becomes more serious for the resist material. The reason is that the pattern feature size is approaching the diffusion length of acid, and this causes a lowering of mask fidelity and a degradation of pattern rectangularity. Accordingly, to gain more benefits from a reduction of exposure light wavelength and an increase of lens NA, the resist material is required to increase a dissolution contrast or restrain acid diffusion, as compared with the prior art materials.

For restraining acid diffusion, an attempt was made to bind a photoacid generator in a base polymer. Among others, the polymer which is designed such that an acid generated upon light exposure is bound in its structure is advantageous in that acid diffusion is substantially restrained, and exposure dose dependency and pattern density dependency are improved (see JP-A 2008-133448).

However, the full restraint of acid diffusion leads to the inhibition of acid catalyzed reaction or chemical amplification, which may, in turn, lead to a lowering of sensitivity and dissolution contrast, with a risk of resolution being degraded. Particularly in the case of fine trench patterns and hole patterns which tend to have a low optical contrast, the lowering of dissolution contrast can degrade lithography properties such as depth of focus (DOF).

Meanwhile, sulfonium salts are generally used as the photoacid generator in the ArF lithography. Several attempts were made to improve dissolution contrast by modifying the cation structure of sulfonium salts. For example, JP 3632410 describes a sulfonium salt having 4-alkoxynaphthyl-1-tetrahydrothiophenium cation. JP 3995575 discloses a resist composition comprising a resin having a plurality of acid labile groups in combination with the sulfonium salt.

On the other hand, the attempt to improve dissolution contrast has some harmful influences including an influence on pattern profile. The enhancement of dissolution contrast is expected to form patterns of rectangular profile, but has a propensity that profile changes occur due to volatilization and re-deposition (or chemical flare) of components in a sub-surface layer of a resist film during the bake step. In particular, the trench pattern has a propensity that the resist film sub-surface layer is clogged by chemical flare, as compared with the line-and-space pattern. As a matter of concern, a shortage of DOF and edge roughness can be problems.

It would be desirable to have a resist composition which has properly suppressed acid diffusion, a high dissolution contrast, and resistance to chemical flare so that the resist composition may perform satisfactorily when processed by the lithography to form fine trench patterns and hole patterns.

CITATION LIST

Patent Document 1: JP-A 2008-133448 (U.S. Pat. No. 7,569,326)
Patent Document 2: JP 3632410
Patent Document 3: JP 3995575
Non-Patent Document 1: Proc. SPIE Vol. 4690 xxix
Non-Patent Document 2: Proc. SPIE Vol. 5040 p. 724

DISCLOSURE OF INVENTION

An object of the invention is to provide a positive resist composition which meets both restrained acid diffusion and an improved dissolution contrast and has resistance to chemical flare so that it may exhibit improved lithographic properties (such as profile, DOF and edge roughness) in forming trench patterns and hole patterns; and a pattern forming process using the composition.

The inventors have found that a positive resist composition comprising (A) a polymer comprising recurring units of a specific structure adapted to generate an acid upon exposure to high-energy radiation and acid labile units, the polymer having an alkali solubility that increases under the action of an acid, and (B) a sulfonium salt of a specific structure exhibits a very high resolution in forming fine size patterns, typically trench patterns and hole patterns, and is improved in the lithographic properties of profile, DOF and roughness.

It is believed that better lithographic performance is exerted because the low diffusion of acid generated in polymer (A) upon exposure, combined with the high transparency and high dissolution contrast attributable to the sulfonium salt (B), establishes a high latent image contrast even under low optical contrast conditions, and because the binding of the generated acid within polymer (A) inhibits chemical flare due to volatilization of acid in the resist film sub-surface layer.

Briefly stated, the invention provides a positive resist composition comprising both (A) a polymer comprising recurring units of a specific structure adapted to generate an acid upon exposure to high-energy radiation and acid labile units, the polymer having an alkali solubility that increases under the action of an acid, and (B) a sulfonium salt of a specific structure; and a pattern forming process using the composition.

In one aspect, the invention provides a positive resist composition comprising (A) a polymer comprising recurring units of a specific structure adapted to generate an acid in response to high-energy radiation selected from UV, deep UV, electron beam, x-ray, excimer laser, γ-ray and synchrotron radiation, and acid labile units, the polymer having an alkali solubility that increases under the action of an acid, and (B) a sulfonium salt of a specific structure. The recurring unit of a structure adapted to generate an acid in polymer (A) has the general formula (1-1) or (1-2):

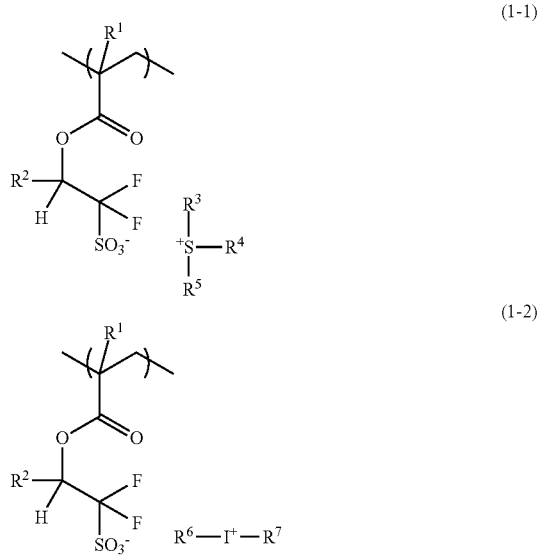

wherein $R^1$ is hydrogen or methyl, $R^2$ is hydrogen or trifluoromethyl, $R^3$, $R^4$, and $R^5$ are each independently a substituted or unsubstituted, straight, branched or cyclic $C_1$-$C_{10}$ alkyl, alkenyl or oxoalkyl group, or substituted or unsubstituted $C_6$-$C_{18}$ aryl, aralkyl or aryloxoalkyl group, any two of $R^3$, $R^4$, and $R^5$ may bond together to form a ring with the sulfur atom, $R^6$ and $R^7$ are each independently a substituted or unsubstituted $C_6$-$C_{18}$ aryl group. The sulfonium salt (B) has the general formula (2-1) or (2-2):

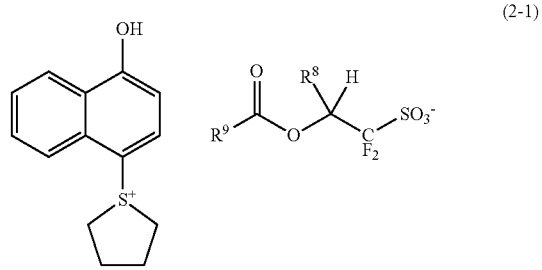

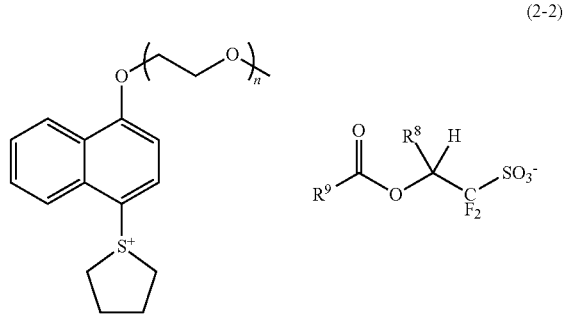

wherein $R^8$ is hydrogen or trifluoromethyl, $R^9$ is a straight, branched or cyclic, monovalent hydrocarbon group of 4 to 30 carbon atoms which may contain a heteroatom, and n is an integer of 1 to 4.

In a preferred embodiment, the polymer (A) further comprises recurring units of a lactone ring-containing structure, in addition to the recurring units of formula (1-1) or (1-2) and the acid labile units.

In a preferred embodiment, the resist composition may further comprise (C) a nitrogen-containing organic compound having the general formula (3):

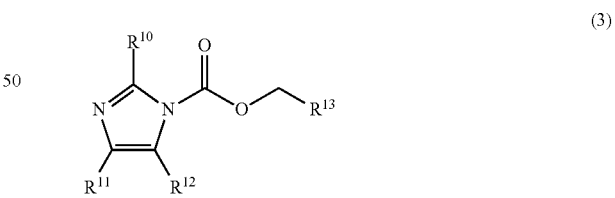

wherein $R^{10}$ is hydrogen, a straight, branched or cyclic $C_1$-$C_{15}$ alkyl group, or $C_6$-$C_{15}$ aryl group, $R^{11}$ and $R^{12}$ are each independently hydrogen, a straight, branched or cyclic $C_1$-$C_{10}$ alkyl group, or $C_6$-$C_{15}$ aryl group, or $R^{11}$ and $R^{12}$ may bond together to form a $C_6$-$C_{14}$ aromatic ring, and $R^{13}$ is a $C_6$-$C_{15}$ aryl group.

In another aspect, the invention provides a pattern forming process comprising the steps of coating the positive resist composition defined above onto a substrate and heat treating to form a resist film, exposing the resist film to high-energy radiation, and developing with a developer.

The process may further include the step of post-exposure heat treatment prior to the development step, and various subsequent steps such as etching, resist removal, and cleaning.

In a preferred embodiment, the high-energy radiation has a wavelength in the range of 180 to 250 nm.

In a preferred embodiment, the exposing step is to expose the resist film to high-energy radiation via a liquid according to the immersion lithography. In a further preferred embodiment, a protective film is formed on the resist film, and in the exposing step of immersion lithography, a liquid is interposed between the protective film and a projection lens. Typically, the high-energy radiation has a wavelength in the range of 180 to 250 nm. Typically the liquid is water.

ADVANTAGEOUS EFFECTS OF INVENTION

The positive resist composition exhibits a high resolution in forming fine size patterns, typically trench patterns and hole patterns. Consequently, lithographic properties of profile, DOF and roughness are improved.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The acronym "PAG" stands for photoacid generator, "PEB" for post-exposure bake, and "DOF" for depth of focus.

The term "high-energy radiation" is intended to encompass ultraviolet (UV) radiation, deep UV, electron beam (EB), x-ray, excimer laser, γ-ray and synchrotron radiation.

One embodiment of the invention is a positive resist composition comprising (A) a polymer comprising recurring units of a structure adapted to generate an acid in response to high-energy radiation selected from UV, deep UV, electron beam, x-ray, excimer laser, γ-ray and synchrotron radiation, having the general formula (1-1) or (1-2) and acid labile units, the polymer having an alkali solubility that increases under the action of an acid, and (B) a sulfonium salt having the general formula (2-1) or (2-2).

The recurring units of a structure adapted to generate an acid in response to high-energy radiation have the general formula (1-1) or (1-2).

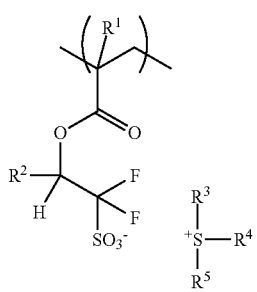

(1-1)

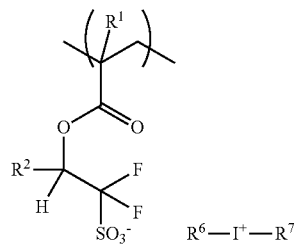

(1-2)

Herein $R^1$ is hydrogen or methyl, and $R^2$ is hydrogen or trifluoromethyl. In formula (1-1), $R^3$, $R^4$, and $R^5$ are each independently a substituted or unsubstituted, straight, branched or cyclic $C_1$-$C_{10}$ alkyl, alkenyl or oxoalkyl group, or a substituted or unsubstituted $C_6$-$C_{18}$ aryl, aralkyl or aryloxoalkyl group. Any two of $R^3$, $R^4$, and $R^5$ may bond together to form a ring with the sulfur atom. In formula (1-2), $R^6$ and $R^7$ are each independently a substituted or unsubstituted $C_6$-$C_{18}$ aryl group.

Specifically, in formulae (1-1) and (1-2), $R^1$ is hydrogen or methyl, and $R^2$ is hydrogen or trifluoromethyl. In formula (1-1), $R^3$, $R^4$, and $R^5$ are each independently a substituted or unsubstituted, straight, branched or cyclic $C_1$-$C_{10}$ alkyl, alkenyl or oxoalkyl group, or substituted or unsubstituted $C_6$-$C_{18}$ aryl, aralkyl or aryloxoalkyl group. Suitable alkyl groups include methyl, ethyl, n-propyl, isopropyl, n-butyl, tert-butyl, cyclopropyl, cyclopentyl, cyclohexyl, cyclopropylmethyl, 4-methylcyclohexyl, cyclohexylmethyl, norbornyl, and adamantyl. Suitable alkenyl groups include vinyl, allyl, propenyl, butenyl, hexenyl, and cyclohexenyl. Suitable oxoalkyl groups include 2-oxocyclopentyl, 2-oxocyclohexyl, 2-oxopropyl, 2-oxoethyl, 2-cyclopentyl-2-oxoethyl, 2-cyclohexyl-2-oxoethyl, and 2-(4-methylcyclohexyl)-2-oxoethyl. Suitable aryl groups include phenyl, naphthyl and thienyl, as well as hydroxyphenyl groups such as 4-hydroxyphenyl, alkoxyphenyl groups such as 4-methoxyphenyl, 3-methoxyphenyl, 2-methoxyphenyl, 4-ethoxyphenyl, 4-tert-butoxyphenyl, and 3-tert-butoxyphenyl, alkylphenyl groups such as 2-methylphenyl, 3-methylphenyl, 4-methylphenyl, 4-ethylphenyl, 4-tert-butylphenyl, 4-n-butylphenyl, and 2,4-dimethylphenyl, alkylnaphthyl groups such as methylnaphthyl and ethylnaphthyl, alkoxynaphthyl groups such as methoxynaphthyl and ethoxynaphthyl, dialkylnaphthyl groups such as dimethylnaphthyl and diethylnaphthyl, and dialkoxynaphthyl groups such as dimethoxynaphthyl and diethoxynaphthyl. Suitable aralkyl groups include benzyl, 1-phenylethyl, and 2-phenylethyl. Suitable aryloxoalkyl groups include 2-aryl-2-oxoethyl groups such as 2-phenyl-2-oxoethyl, 2-(1-naphthyl)-2-oxoethyl, and 2-(2-naphthyl)-2-oxoethyl. In these groups, some hydrogen atoms may be substituted by fluorine atoms or hydroxyl groups. Any two of $R^3$, $R^4$, and $R^5$ may bond together to form a ring with the sulfur atom in the formula. Suitable rings are shown below.

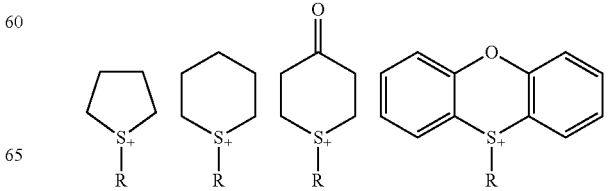

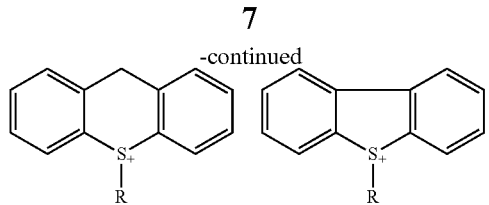

Herein R is as exemplified for $R^3$, $R^4$, and $R^5$.

In formula (1-2), $R^6$ and $R^7$ are each independently a substituted or unsubstituted $C_6$-$C_{18}$ aryl group. Exemplary aryl groups are the same as exemplified for $R^3$, $R^4$, and $R^5$.

The recurring unit of formula (1-1) or (1-2) may be obtained by copolymerizing a monomer having the general formula (1-1') or (1-2') with another monomer such as a monomer having an acid labile group.

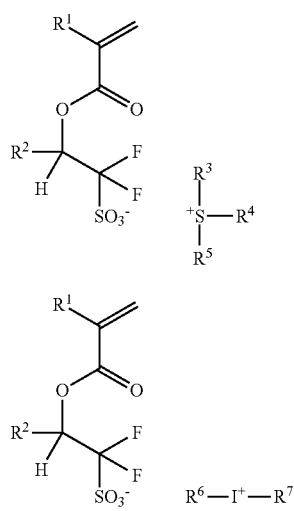

Herein $R^1$ to $R^7$ are as defined above.

Examples of the unit having formula (1-1) include compounds of the structure shown below, but are not limited thereto.

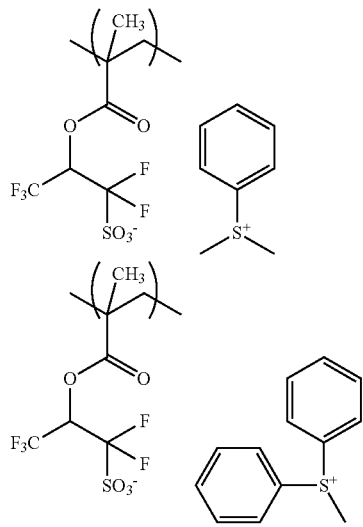

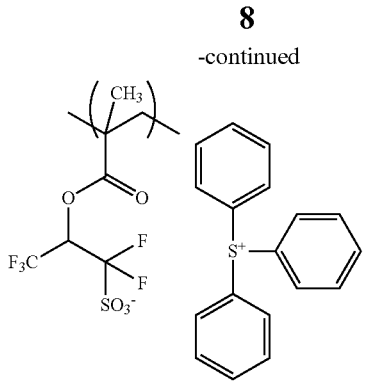

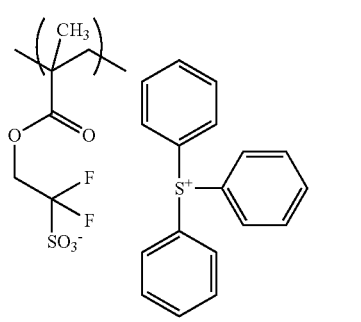

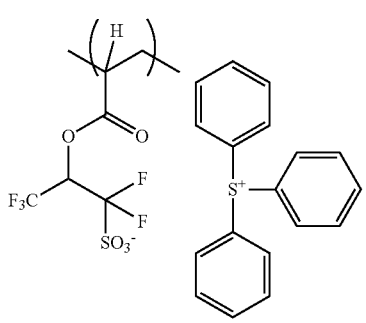

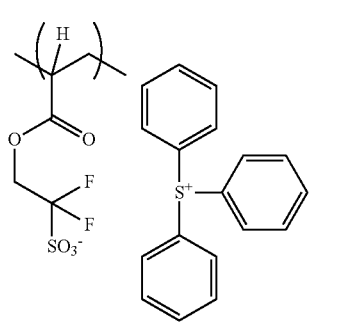

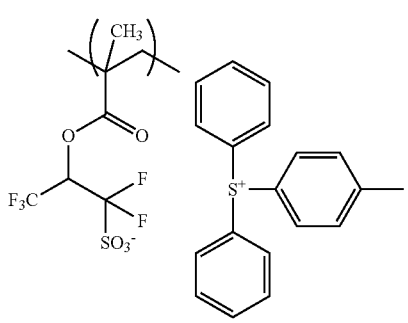

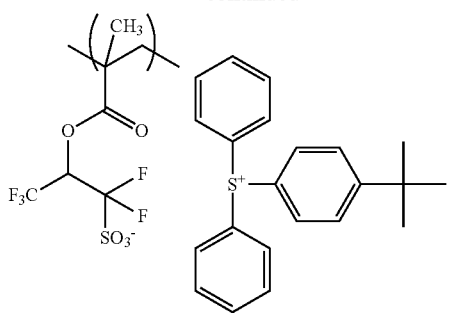
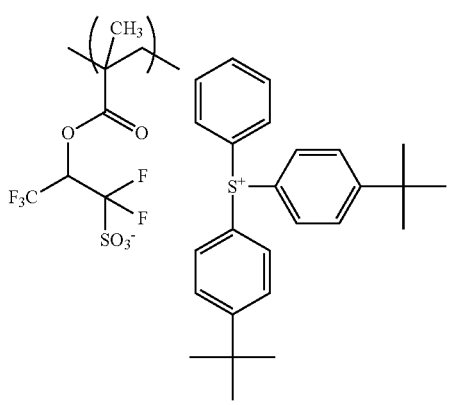
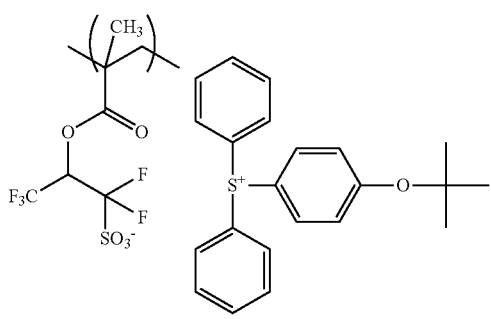
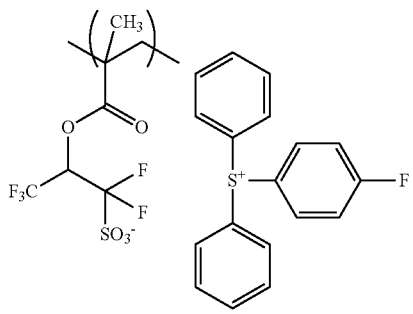
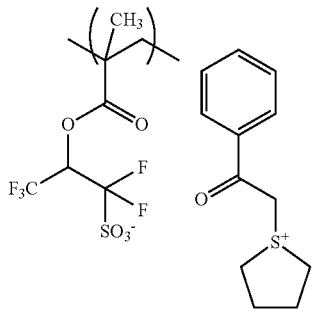
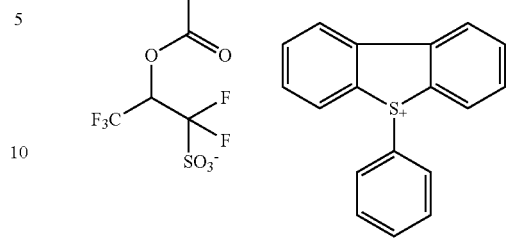
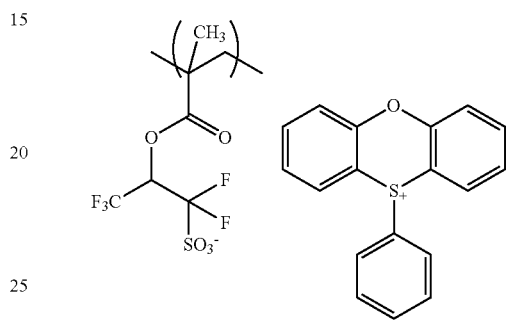
Examples of the unit having formula (1-2) include compounds of the structure shown below, but are not limited thereto.
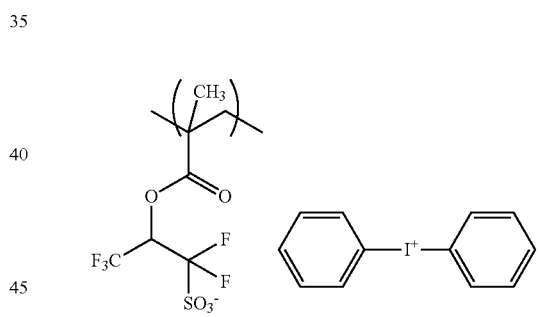
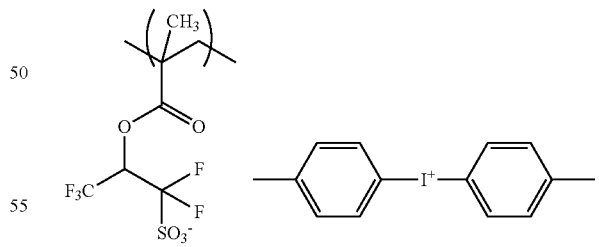
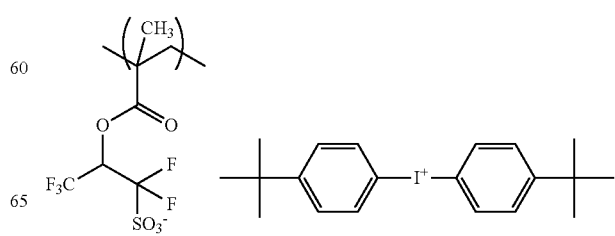

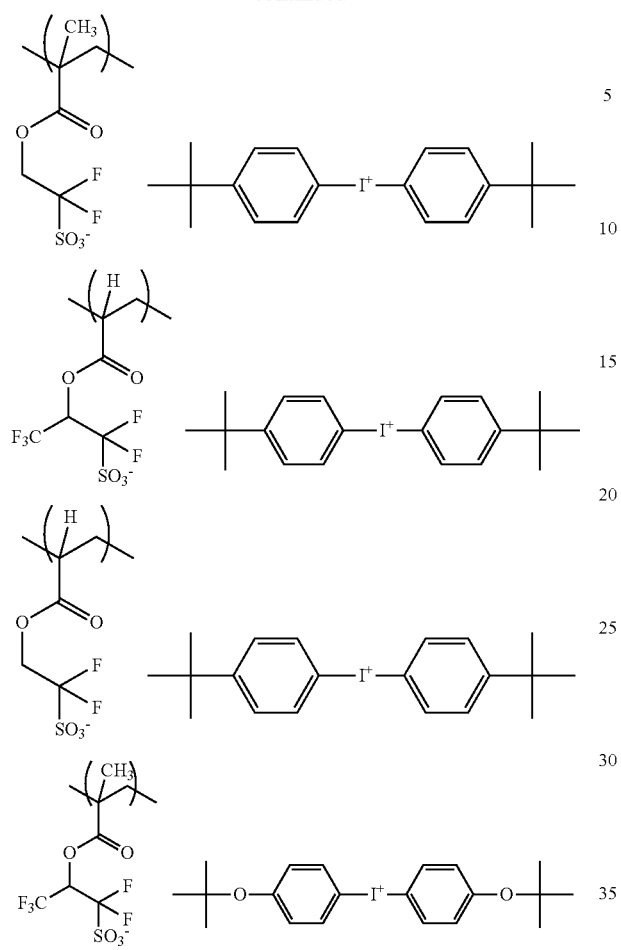

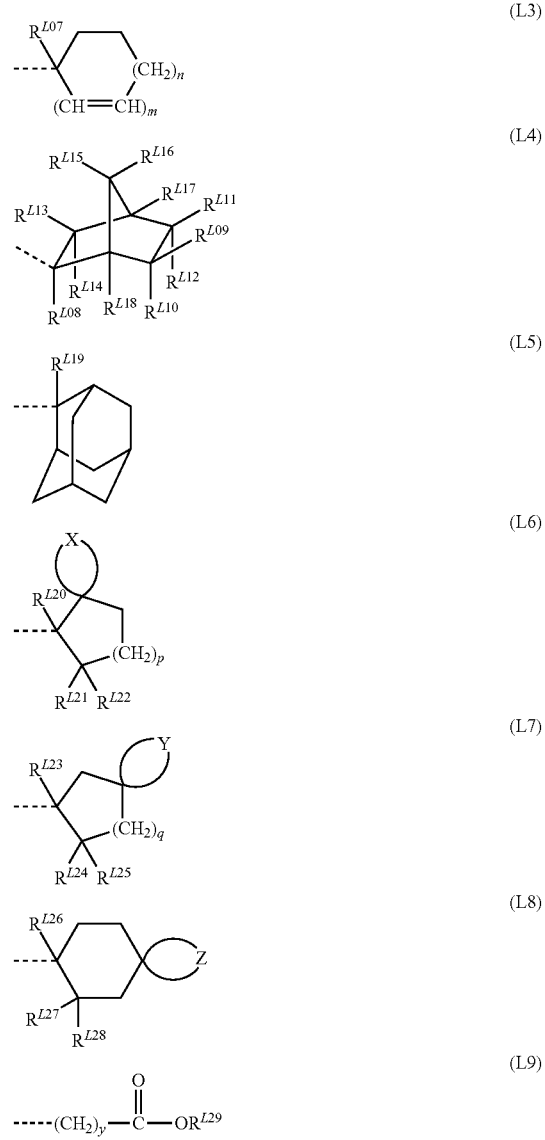

In addition to the acid-generating units, the polymer should comprise at least one acid labile unit. The acid labile unit is a recurring unit of the structure containing a carboxylic acid, phenol or fluoroalcohol having an acidic group which is protected with an acid labile group. Deprotection occurs under the action of an acid whereby the unit serves to improve the solubility of the polymer in an alkaline developer. The acid labile group may be selected from a variety of such groups. Specifically, suitable acid labile groups include alkoxymethyl groups of the following general formula (L1), tertiary alkyl groups of the following general formulae (L2) to (L8), and alkoxycarbonyl and alkoxycarbonylalkyl groups of the following general formula (L9), but are not limited thereto. More preferred acid labile groups are those of formulae (L2) to (L5).

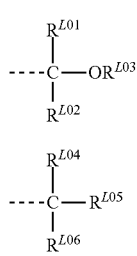

Herein and throughout the specification, the broken line denotes a valence bond.

In formula (L1), $R^{L01}$ and $R^{L02}$ are hydrogen or straight, branched or cyclic alkyl groups of 1 to 18 carbon atoms, preferably 1 to 10 carbon atoms, examples of which include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of these groups in which some hydrogen atoms are replaced by hydroxyl, alkoxy, oxo, amino, alkylamino or the like. Suitable straight, branched or cyclic alkyl groups are as exemplified for $R^{L01}$ and $R^{L02}$. Exemplary substituted alkyl groups are illustrated below.

-continued

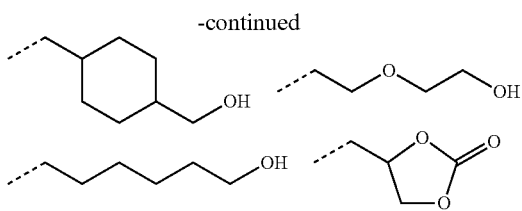

A pair of $R^{L01}$ and $R^{L02}$, $R^{L01}$ and $R^{L03}$, or $R^{L02}$ and $R^{L03}$ may bond together to form a ring with the carbon and oxygen atoms to which they are attached. Each of $R^{L01}$ and $R^{L02}$, $R^{L01}$ and $R^{L03}$, or $R^{L02}$ and $R^{L03}$ represents a straight or branched alkylene group of 1 to 18 carbon atoms, preferably 1 to 10 carbon atoms when they form a ring.

In formula (L2), $R^{L04}$, $R^{L05}$, and $R^{L05}$ are each independently a straight, branched or cyclic $C_1$-$C_{15}$ alkyl group. Suitable alkyl groups include methyl, ethyl, propyl, isopropyl, n-butyl, sec-butyl, tert-butyl, cyclopentyl, cyclohexyl, 2-ethylhexyl, n-octyl, 1-adamantyl, and 2-adamantyl.

In formula (L3), $R^{L07}$ is an optionally substituted, straight, branched or cyclic $C_1$-$C_{10}$ alkyl group or optionally substituted $C_6$-$C_{20}$ aryl group. Examples of the optionally substituted alkyl groups include straight, branched or cyclic ones such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl; and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups or in which one or more methylene moiety is replaced by an oxygen or sulfur atom. Exemplary optionally substituted aryl groups are phenyl, methylphenyl, naphthyl, anthryl, phenanthryl, and pyrenyl. In formula (L3), m is 0 or 1, n is 0, 1, 2 or 3, and 2m+n is equal to 2 or 3.

In formula (L4), $R^{L08}$ is an optionally substituted, straight, branched or cyclic $C_1$-$C_{10}$ alkyl group or optionally substituted $C_6$-$C_{20}$ aryl group. Examples are as exemplified for $R^{L07}$. $R^{L09}$ to $R^{L18}$ each independently denote hydrogen or a monovalent $C_1$-$C_{15}$ hydrocarbon group. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of the foregoing in which some hydrogen atoms are replaced by hydroxyl, alkoxy, carboxyl, alkoxycarbonyl, oxo, amino, alkylamino, cyano, mercapto, alkylthio, sulfo or other groups. Alternatively, a pair of $R^{L09}$ and $R^{L10}$, $R^{L09}$ and $R^{L11}$, $R^{L09}$ and $R^{L12}$, $R^{L10}$ and $R^{L12}$, $R^{L11}$ and $R^{L12}$, $R^{L13}$ and $R^{L14}$, $R^{L15}$ and $R^{L16}$, or $R^{L16}$ and $R^{L17}$ may bond together to form a ring. Each of $R^{L09}$ and $R^{L10}$, $R^{L09}$ and $R^{L11}$, $R^{L09}$ and $R^{L12}$, $R^{L10}$ and $R^{L12}$, $R^{L11}$ and $R^{L12}$, $R^{L13}$ and $R^{L14}$, $R^{L15}$ and $R^{L16}$, or $R^{L16}$ and $R^{L17}$ represents a divalent $C_1$-$C_{15}$ hydrocarbon group when they form a ring, examples of which are those exemplified above for the monovalent hydrocarbon groups, with one hydrogen atom being eliminated. Also a pair of $R^{L09}$ and $R^{L11}$, $R^{L11}$ and $R^{L17}$, or $R^{L15}$ and $R^{L17}$ which are attached to vicinal carbon atoms may bond together directly to form a double bond.

In formula (L5), $R^{L19}$ is an optionally substituted, straight, branched or cyclic $C_1$-$C_{10}$ alkyl group or optionally substituted $C_6$-$C_{20}$ aryl group. Examples are as exemplified for $R^{L07}$.

In formula (L6), $R^{L20}$ is an optionally substituted, straight, branched or cyclic $C_1$-$C_{10}$ alkyl group or optionally substituted $C_6$-$C_{20}$ aryl group. Examples are as exemplified for $R^{L07}$. X is a divalent group that forms an optionally substituted cyclopentane, cyclohexane or norbornane ring with the carbon atom to which it is attached. $R^{L21}$ and $R^{L22}$ are each independently hydrogen or a straight, branched or cyclic, monovalent hydrocarbon group of 1 to 10 carbon atoms. $R^{L21}$ and $R^{L22}$ may bond together to form a ring with the carbon atom to which they are attached, and in this case, $R^{L21}$ and $R^{L22}$ taken together represent a divalent group that forms an optionally substituted cyclopentane or cyclohexane ring. The subscript p is 1 or 2.

In formula (L7), $R^{L23}$ is an optionally substituted, straight, branched or cyclic $C_1$-$C_{10}$ alkyl group or optionally substituted $C_6$-$C_{20}$ aryl group. Examples are as exemplified for $R^{L07}$. Y is a divalent group that forms an optionally substituted cyclopentane, cyclohexane or norbornane ring with the carbon atom to which it is attached. $R^{L24}$ and $R^{L25}$ are each independently hydrogen or a straight, branched or cyclic, monovalent hydrocarbon group of 1 to 10 carbon atoms. $R^{L24}$ and $R^{L25}$ may bond together to form a ring with the carbon atom to which they are attached, and in this case, $R^{L24}$ and $R^{L25}$ taken together represent a divalent group that forms an optionally substituted cyclopentane or cyclohexane ring. The subscript q is 1 or 2.

In formula (L8), $R^{L26}$ is an optionally substituted, straight, branched or cyclic $C_1$-$C_{10}$ alkyl group or optionally substituted $C_6$-$C_{20}$ aryl group. Examples are as exemplified for $R^{L07}$. Z is a divalent group that forms an optionally substituted cyclopentane, cyclohexane or norbornane ring with the carbon atom to which it is attached. $R^{L27}$ and $R^{L28}$ are each independently hydrogen or a straight, branched or cyclic, monovalent hydrocarbon group of 1 to 10 carbon atoms. $R^{L27}$ and $R^{L28}$ may bond together to form a ring with the carbon atom to which they are attached, and in this case, $R^{L27}$ and $R^{L28}$ taken together represent a divalent group that forms an optionally substituted cyclopentane or cyclohexane ring.

In formula (L9), $R^{L29}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Suitable tertiary alkyl groups include, but are not limited to, tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Suitable trialkylsilyl groups include trimethylsilyl, triethylsilyl, and dimethyl-tert-butylsilyl. Suitable oxoalkyl groups include 3-oxocyclohexyl, 4-methyl-2-oxooxan-4-yl, and 5-methyl-2-oxooxolan-5-yl. The subscript y is an integer of 0 to 3.

Of the acid labile groups of formula (L1), the straight and branched ones are exemplified by the following groups.

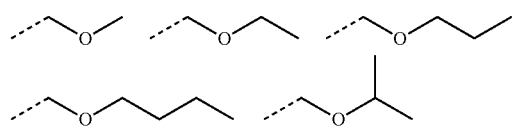

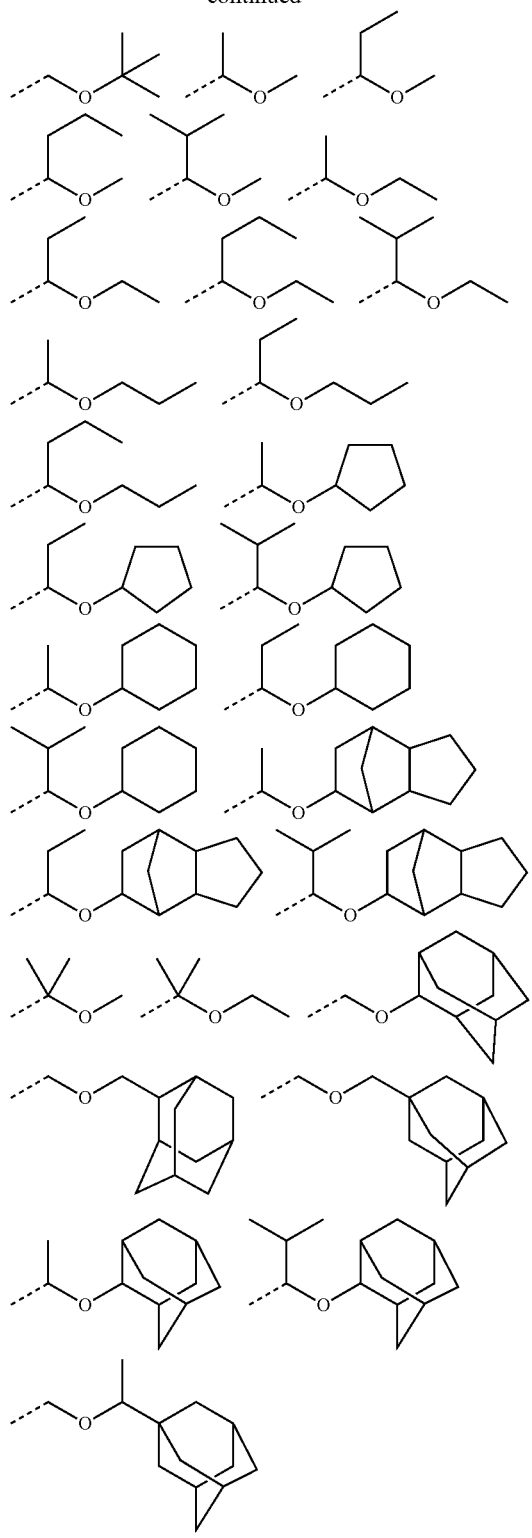

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.1.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are more preferred.

(L4-1)

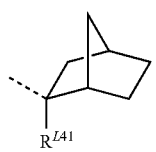

(L4-2)

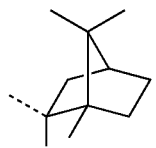

(L4-3)

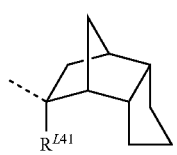

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile group of formula (L2) include tert-butyl, tert-amyl, and the groups shown below.

(L4-4)

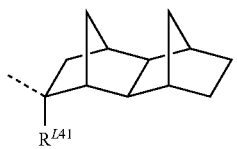

Herein $R^{L41}$ is as defined above.

In formulae (L4-1) to (L4-4), the broken line denotes a bonding site and direction. $R^{L41}$ is each independently selected from monovalent hydrocarbon groups, typically straight, branched or cyclic $C_1$-$C_{10}$ alkyl groups, for example, methyl, ethyl, propyl, isopropyl, n-butyl, sec-butyl, tert-butyl, tert-amyl, n-pentyl, n-hexyl, cyclopentyl, and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

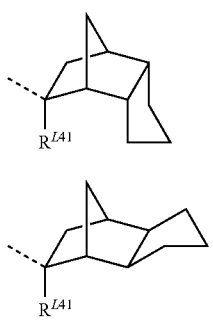

(L4-3-1)

(L4-3-2)

Herein $R^{L41}$ is as defined above.

Similarly, the general formula (L4-4) represents one or a mixture of two or more selected from groups having the following general formulas (L4-4-1) to (L4-4-4).

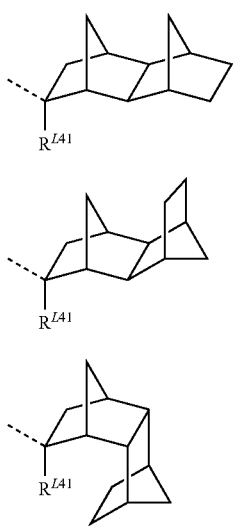

(L4-4-1)

(L4-4-2)

(L4-4-3)

(L4-4-4)

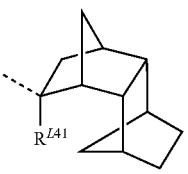

Herein $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane skeleton as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)

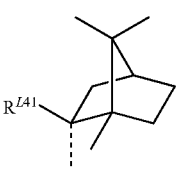

(L4-2-endo)

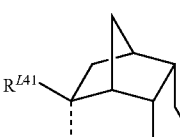

(L4-3-endo)

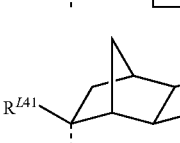

(L4-4-endo)

Herein $R^{L41}$ is as defined above.

Illustrative examples of the acid labile group of formula (L4) are given below, but not limited thereto.

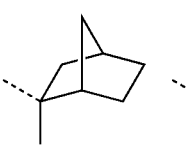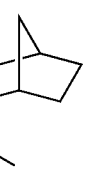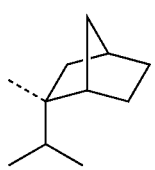

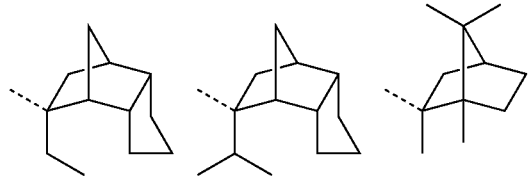
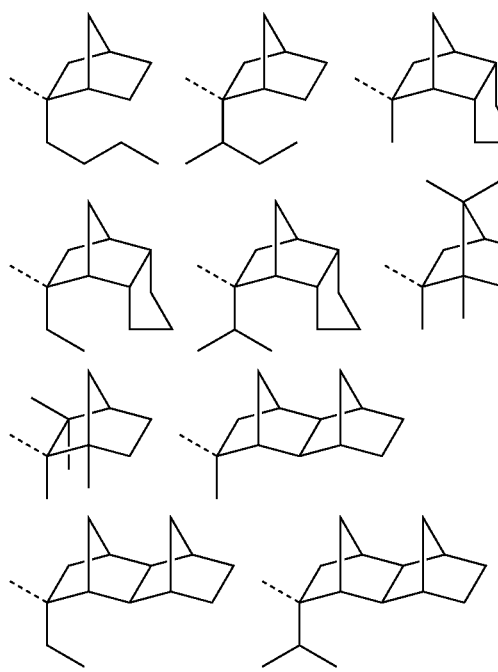
Examples of the acid labile group of formula (L5) are shown below.
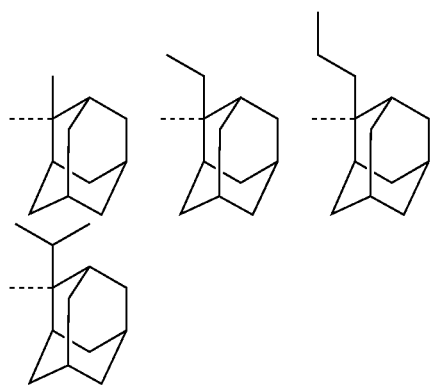
Examples of the acid labile group of formula (L6) are shown below.
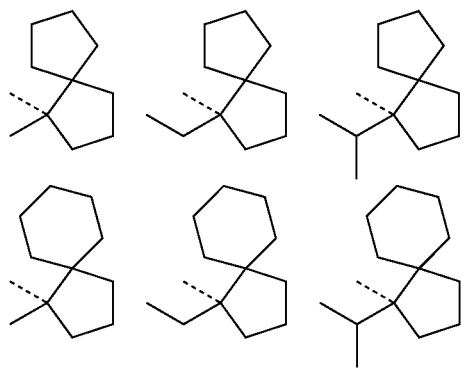
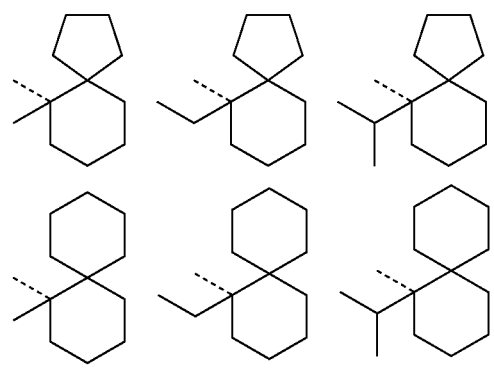
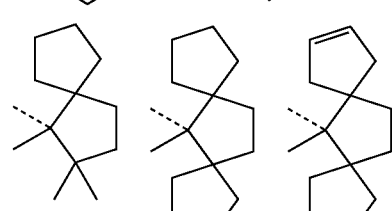
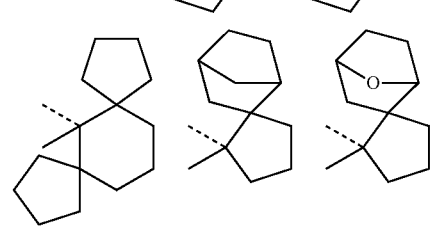
Examples of the acid labile group of formula (L7) are shown below.
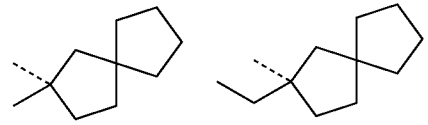
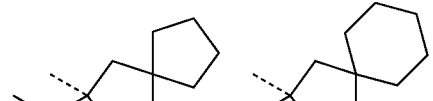
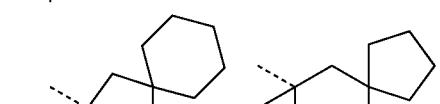
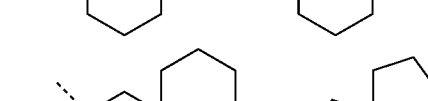
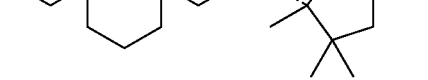

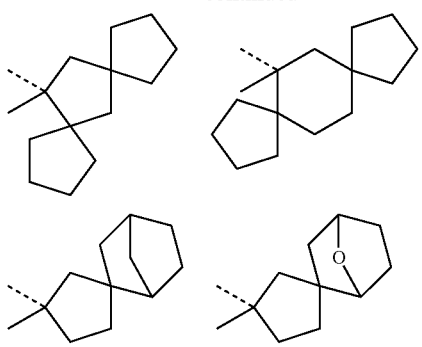
Examples of the acid labile group of formula (L8) are shown below.
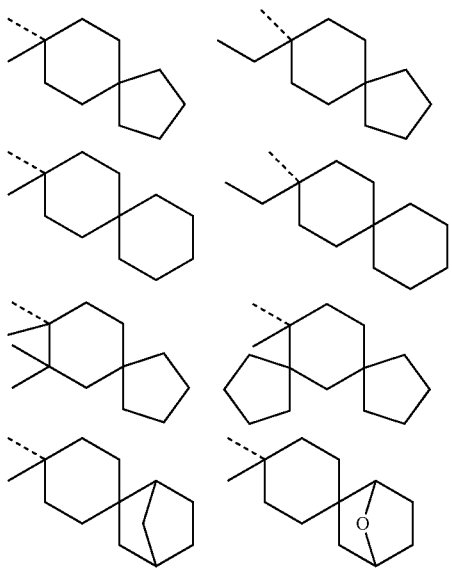
Examples of the acid labile group of formula (L9) are shown below.
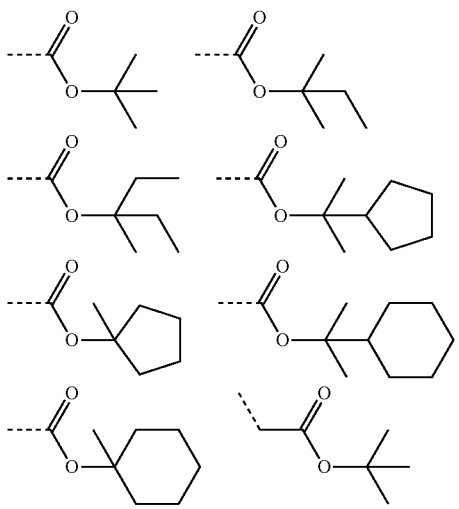
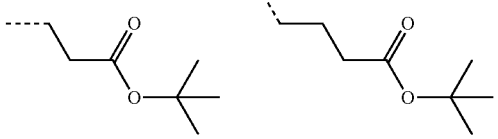
Illustrative, non-limiting examples of the acid labile unit having an acid labile group as exemplified above are shown below.
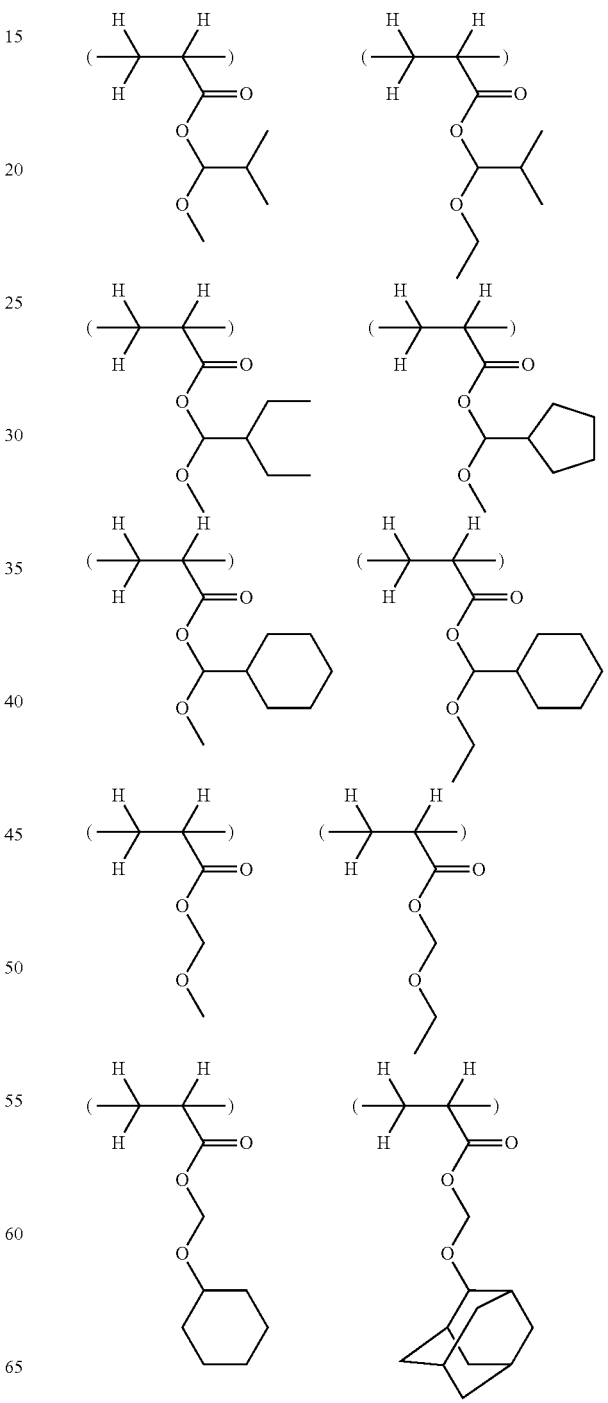

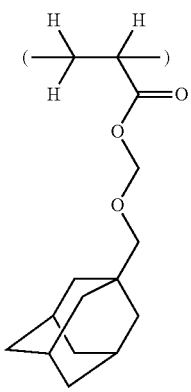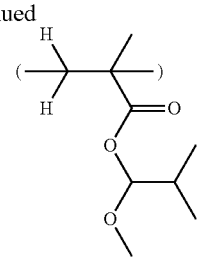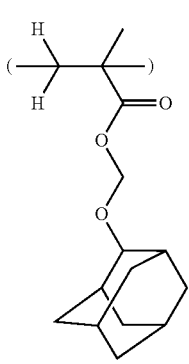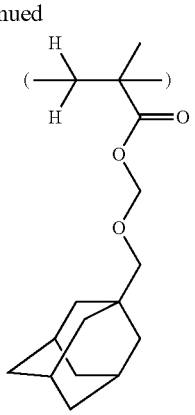
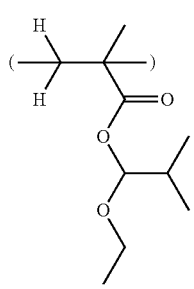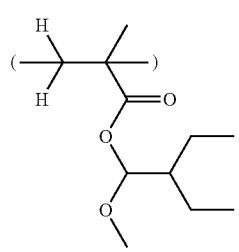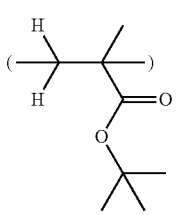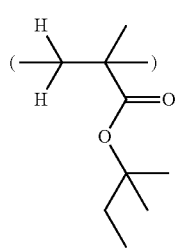
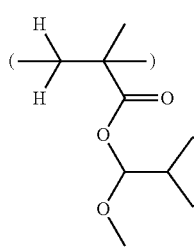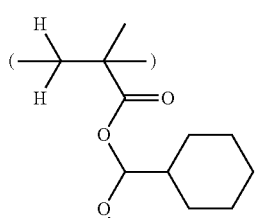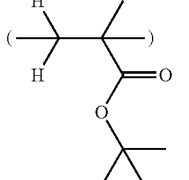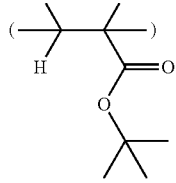
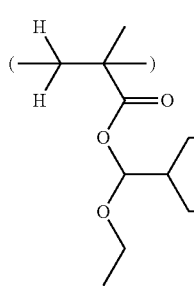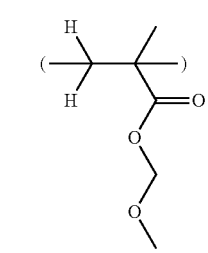
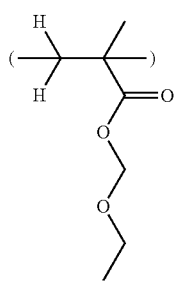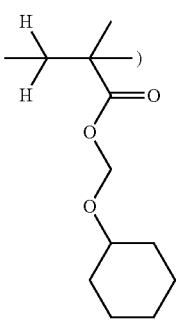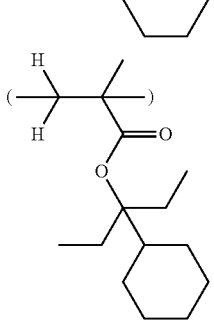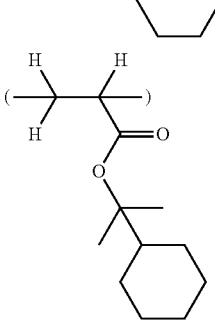

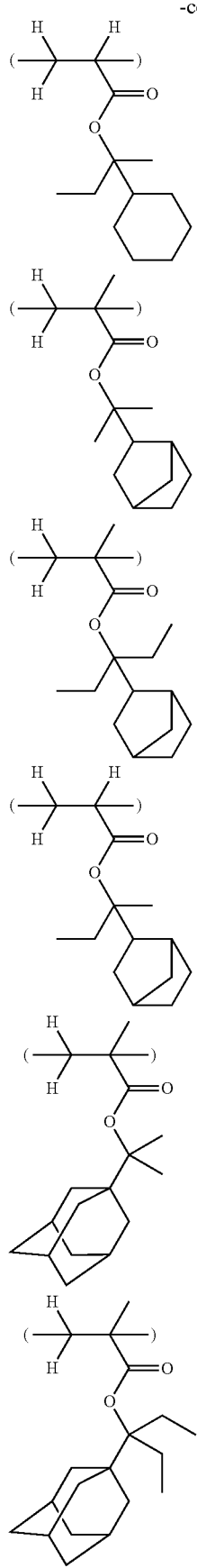
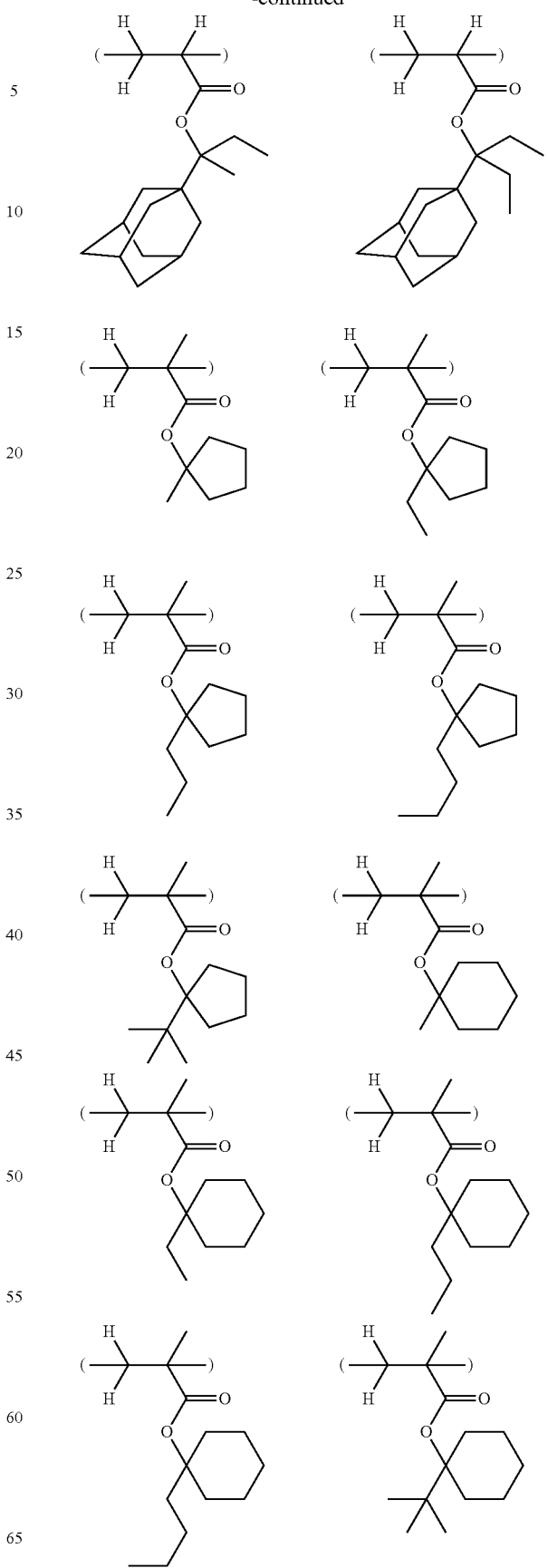

-continued
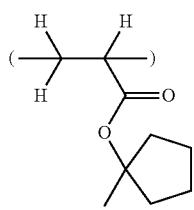 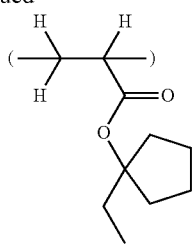
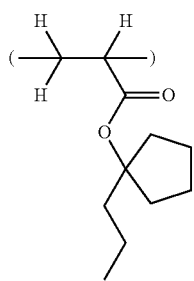 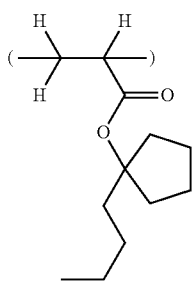
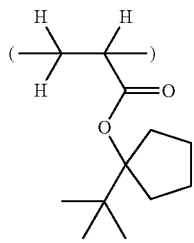 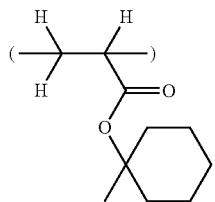
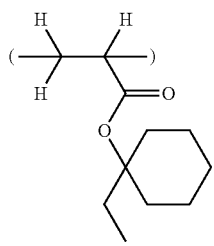 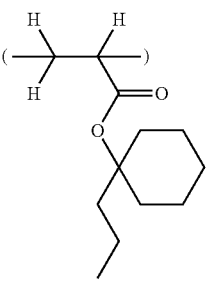
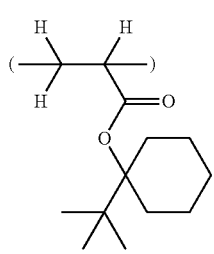 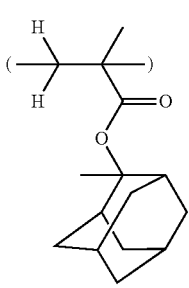
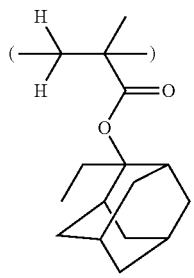 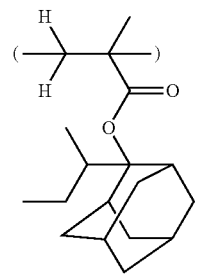
-continued
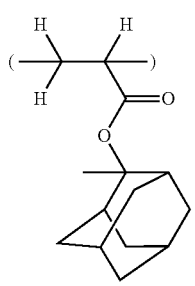 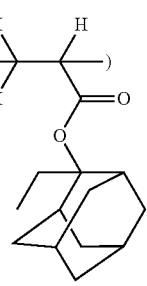
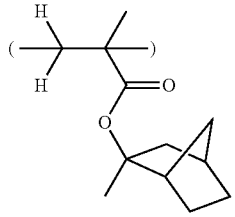 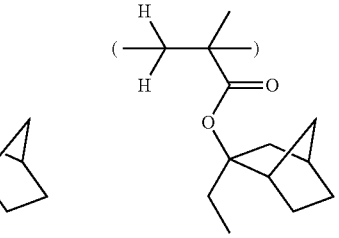
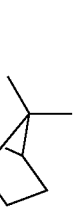
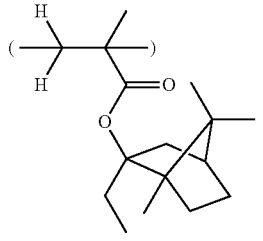
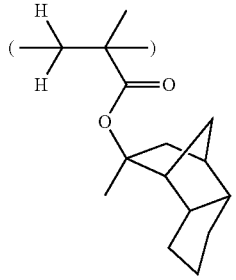 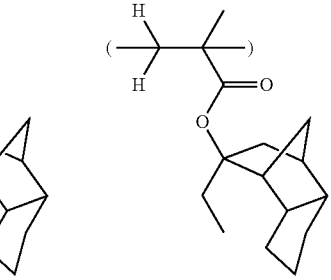
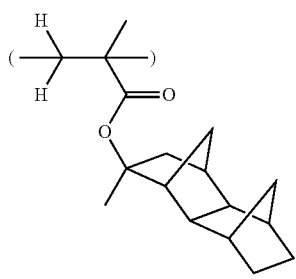

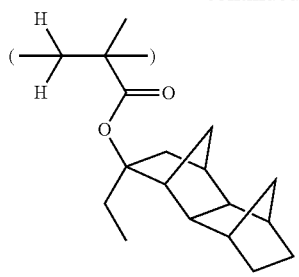
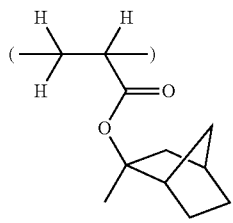
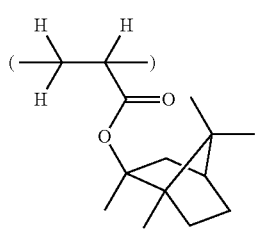
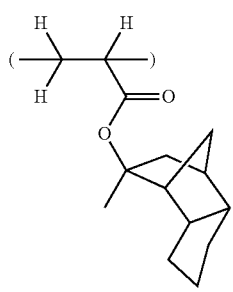
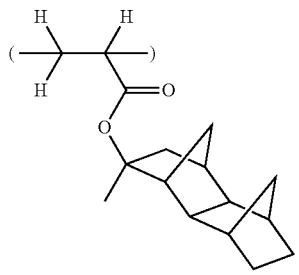
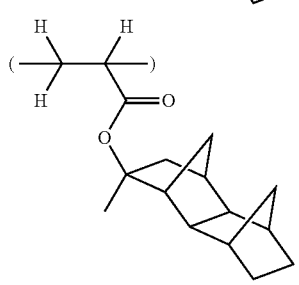
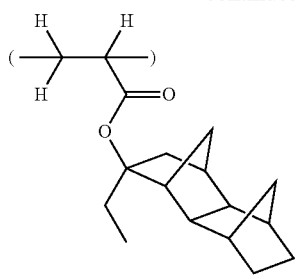
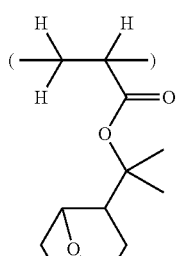
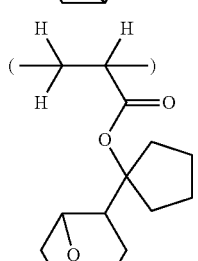
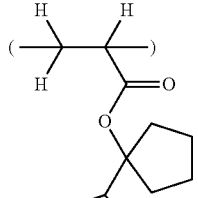
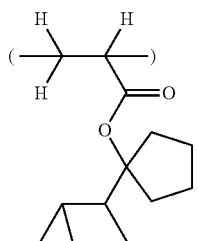
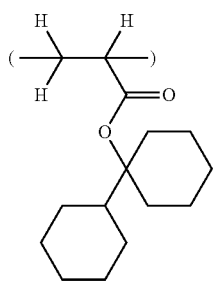

-continued
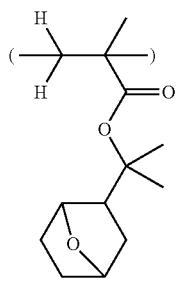 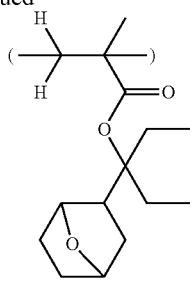
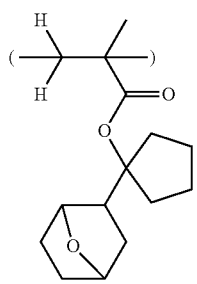 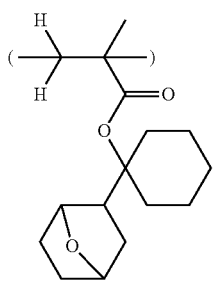
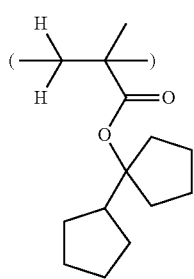 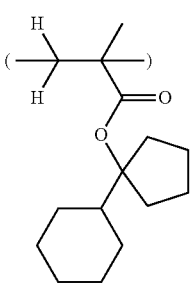
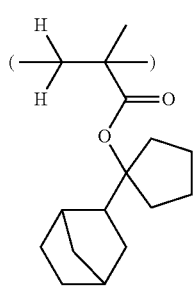 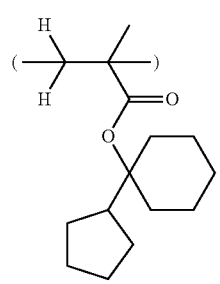
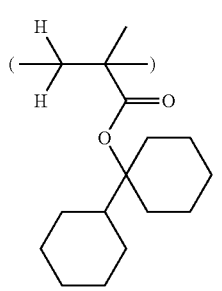 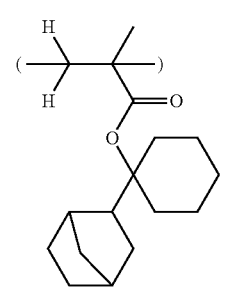
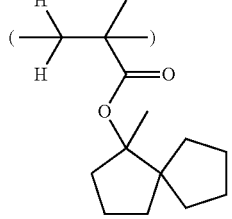 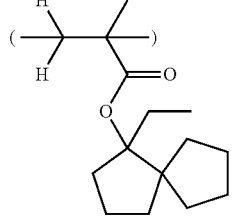
-continued
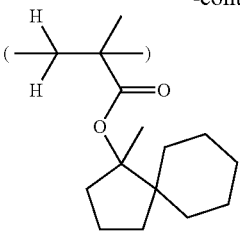 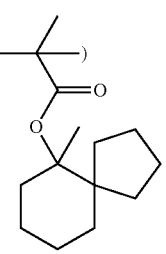
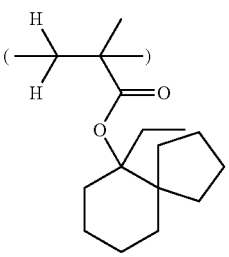 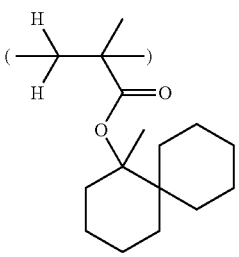
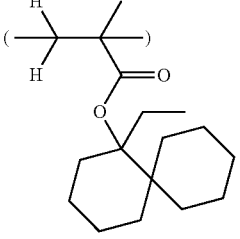
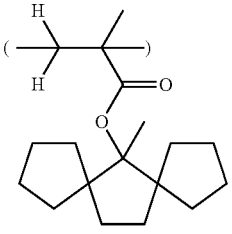 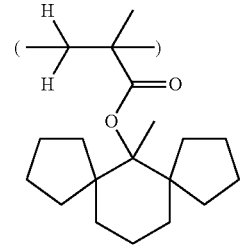
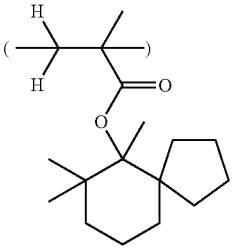
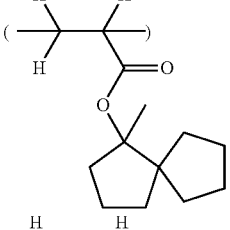 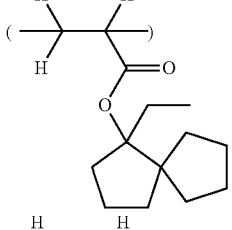
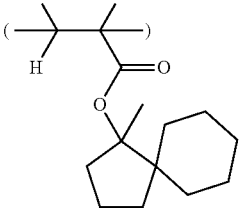

-continued

-continued
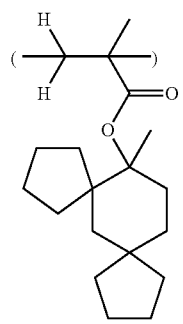 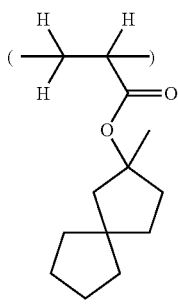 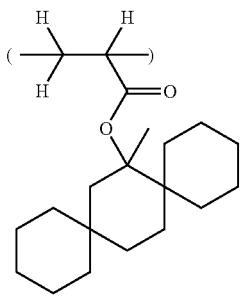
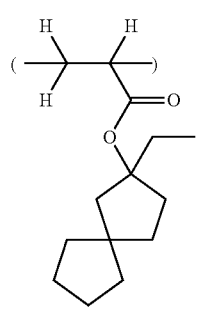 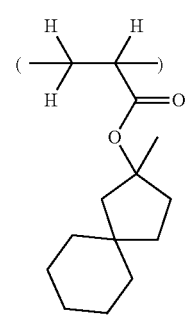 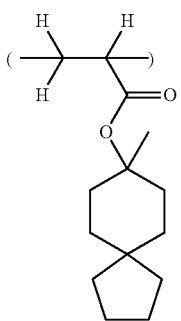 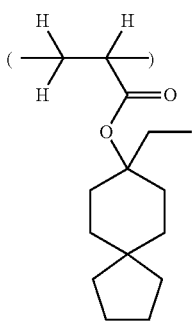
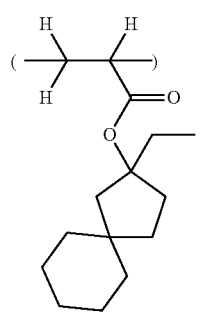 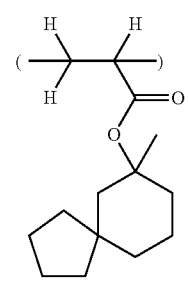 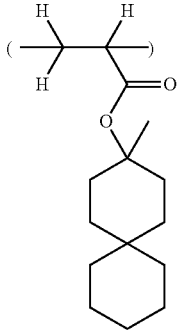 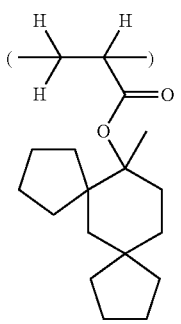
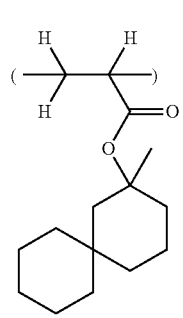 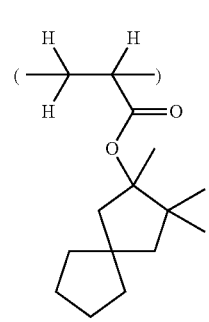 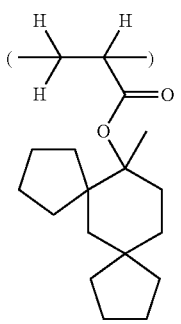 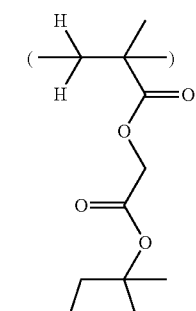
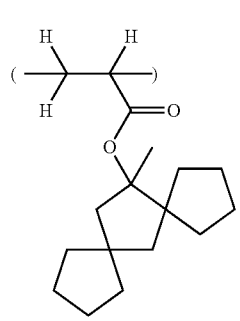 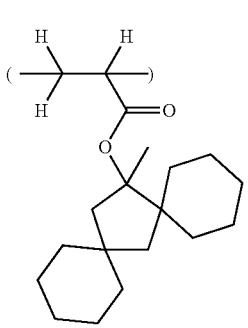 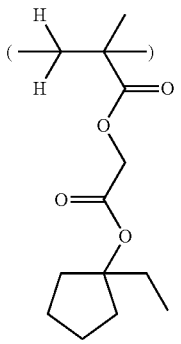 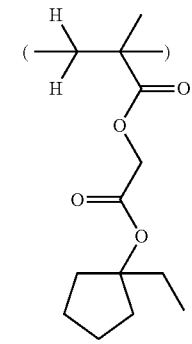

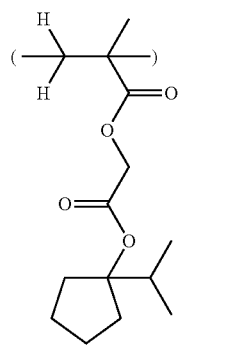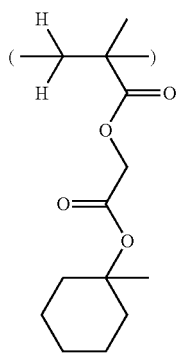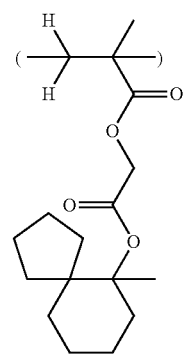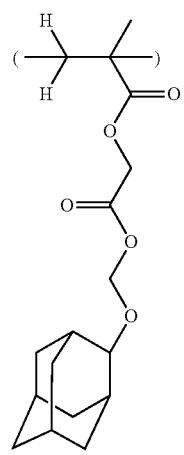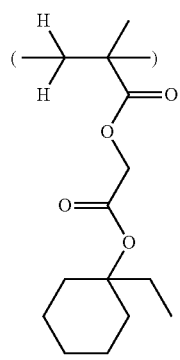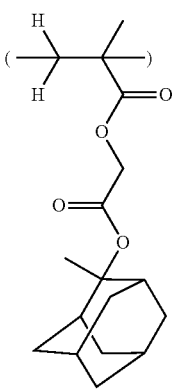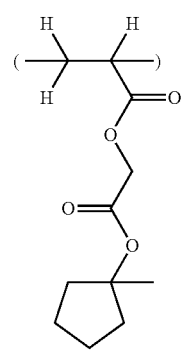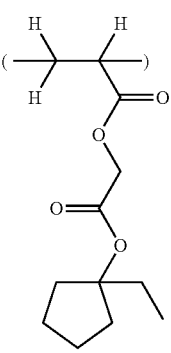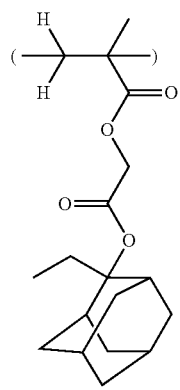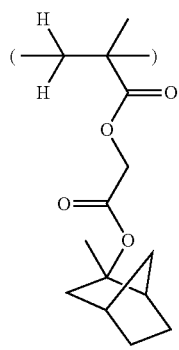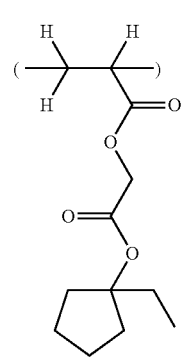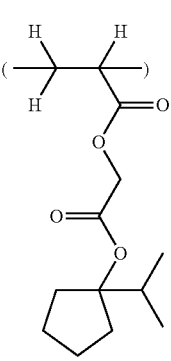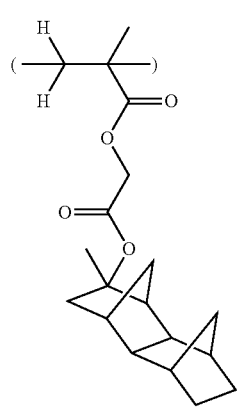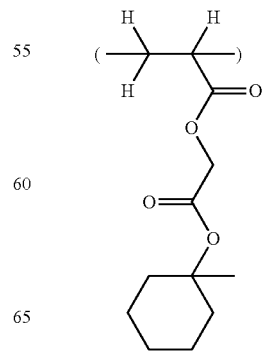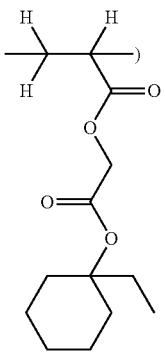

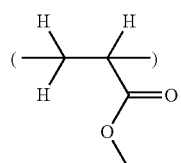
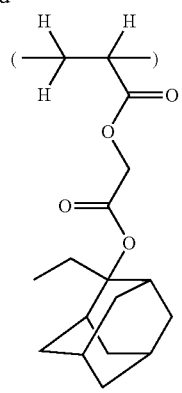
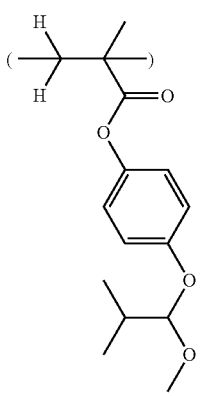
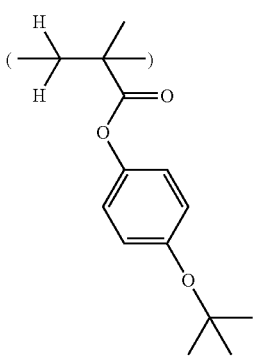
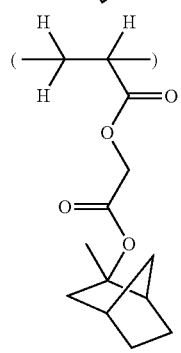
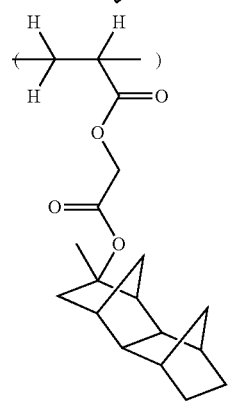
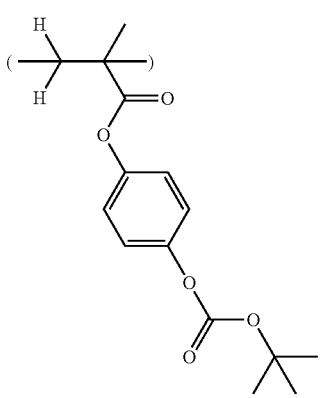
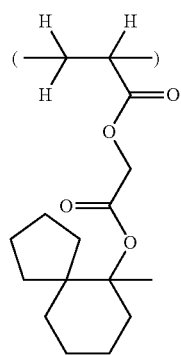
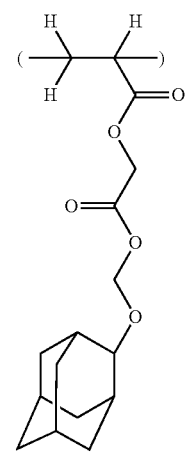
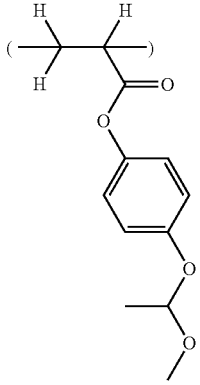
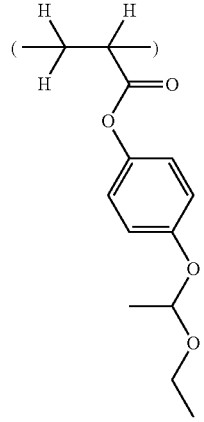
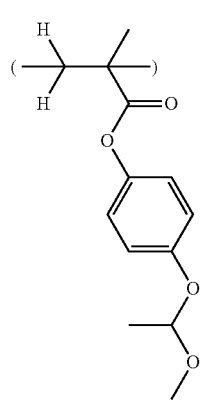
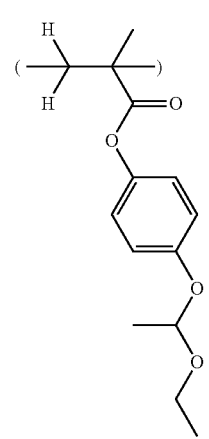
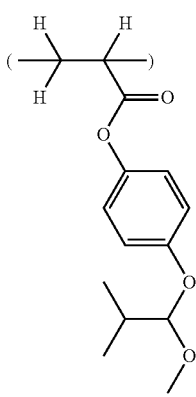
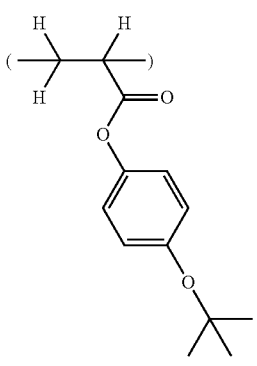

-continued
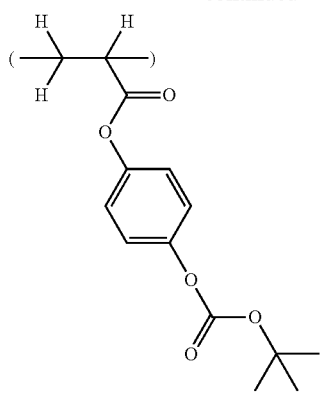
In addition to the recurring units of a structure adapted to generate an acid in response to high-energy radiation and the acid labile units, the preferred polymer (A) further comprises at least one recurring unit having an adhesive group of lactone ring. Illustrative, non-limiting examples of the lactone-containing unit are given below.
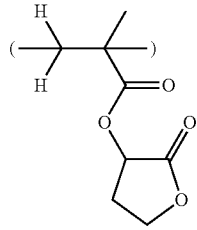
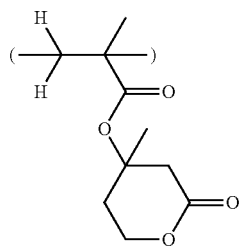
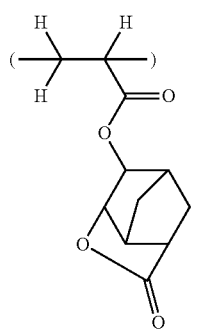
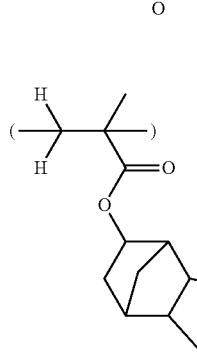
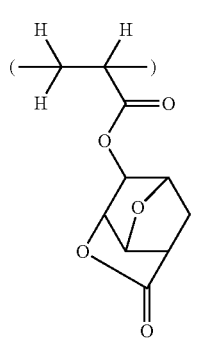
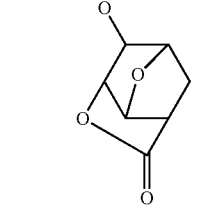

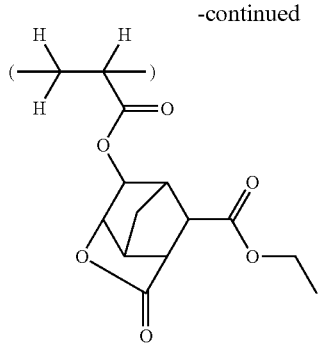
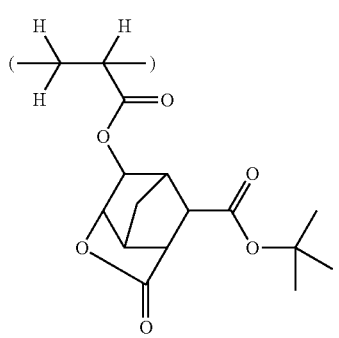
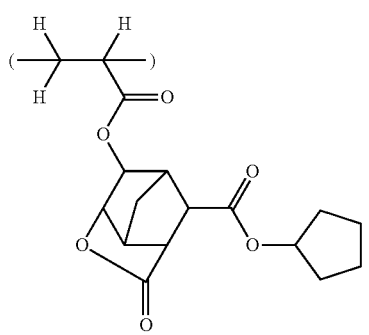
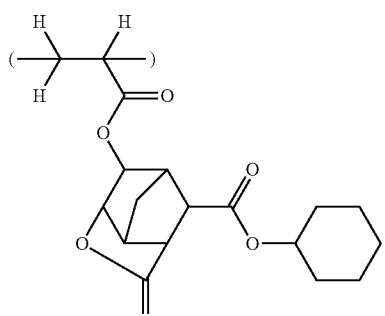
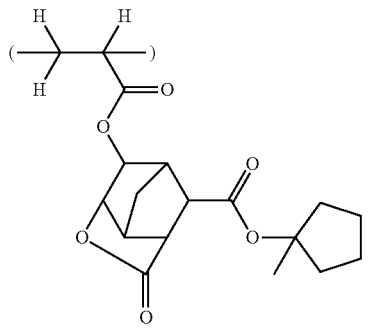
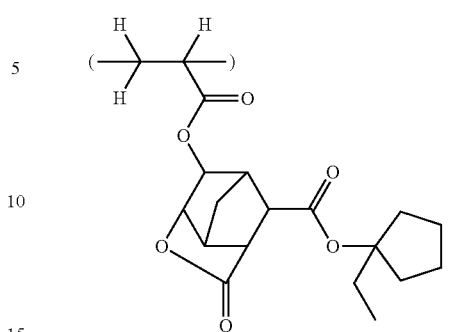
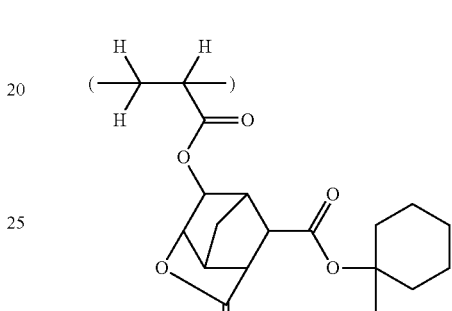
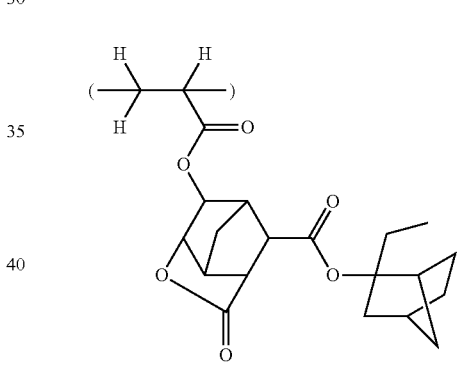
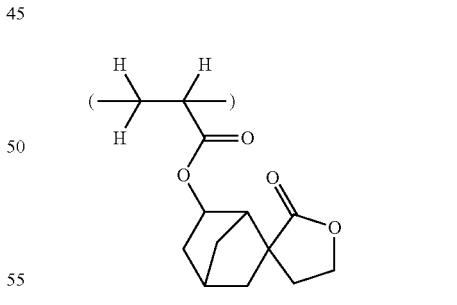
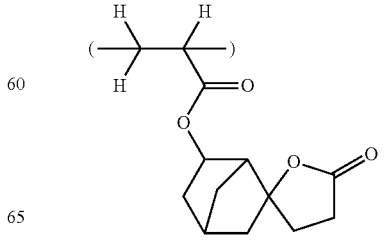

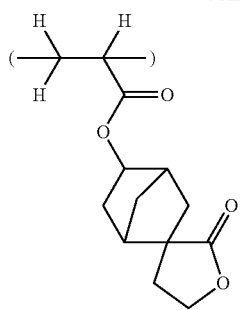
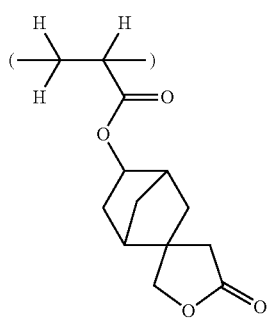
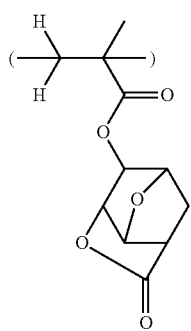
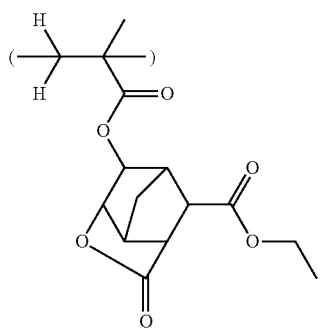
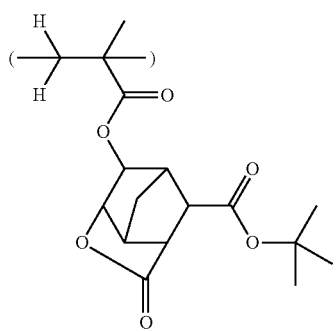
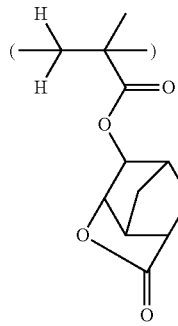
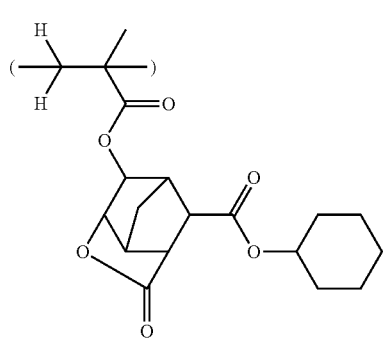
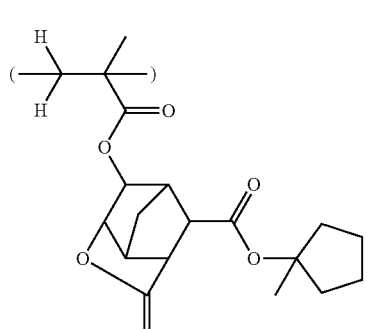
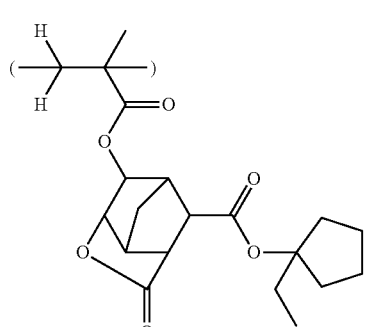
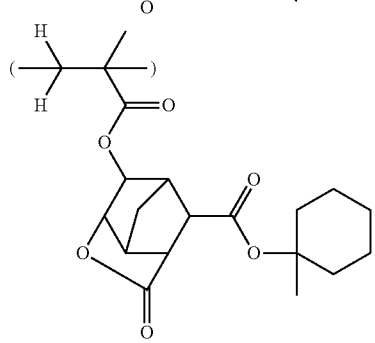

-continued
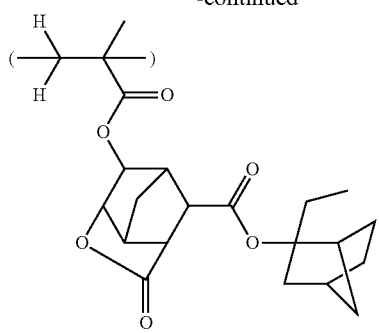
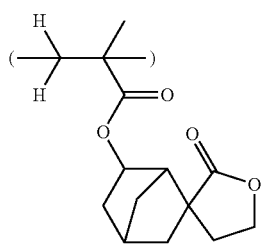
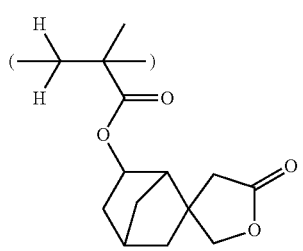
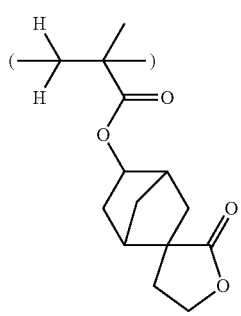
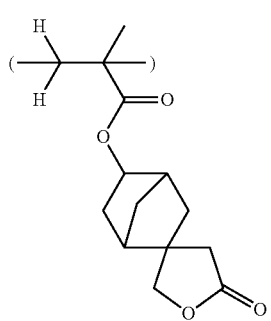
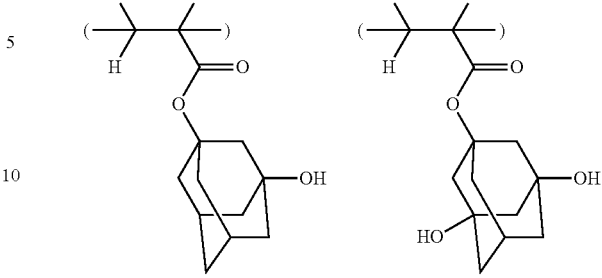
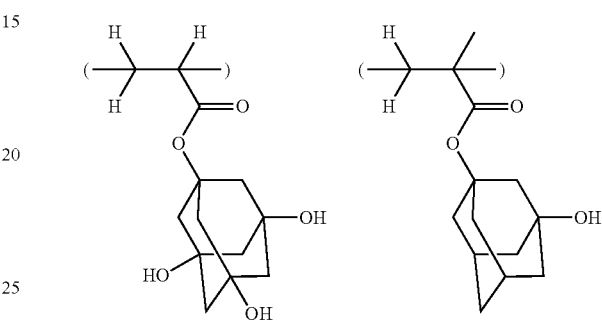
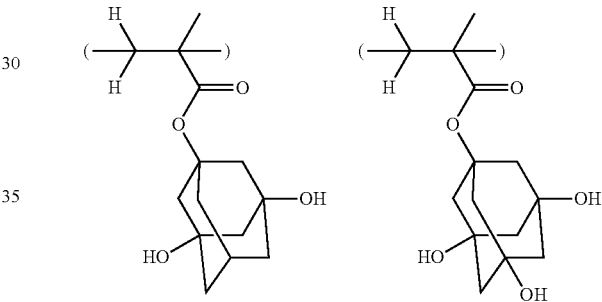
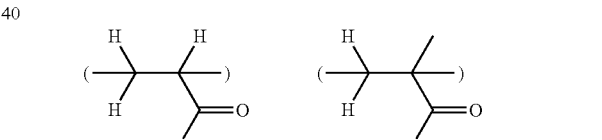
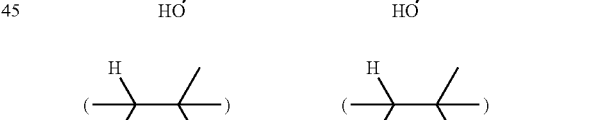
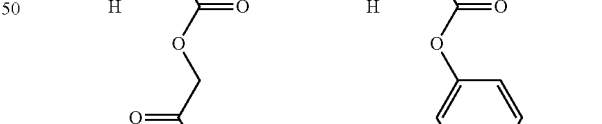
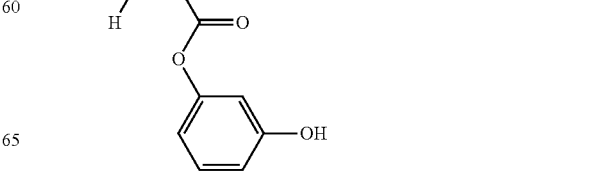
If desired, the polymer (A) may further comprise one or more additional recurring units, for example, units having a hydroxyl, carboxyl, fluoroalkyl or α-trifluoromethyl alcohol group. Illustrative, non-limiting examples of additional units are given below.

-continued
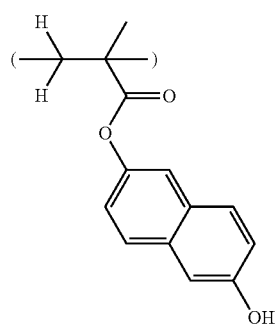
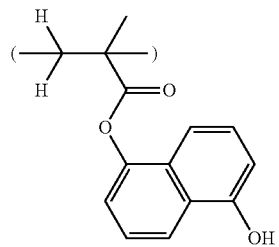
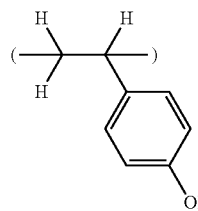
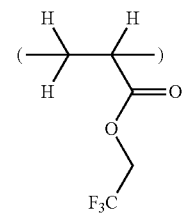
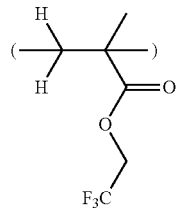
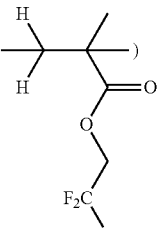
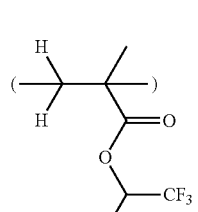
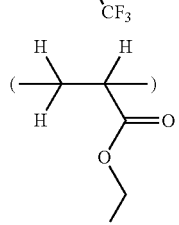
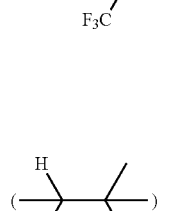
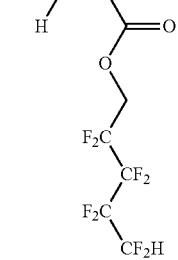
-continued
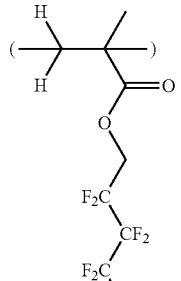
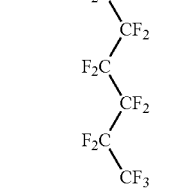
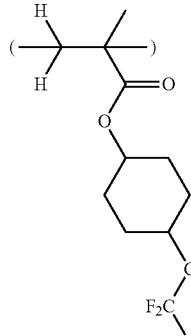
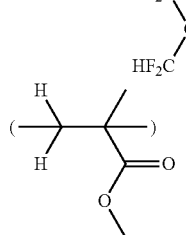
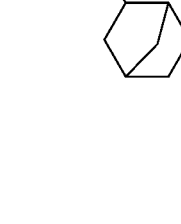
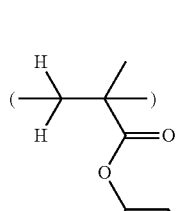

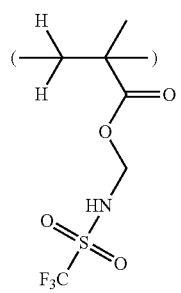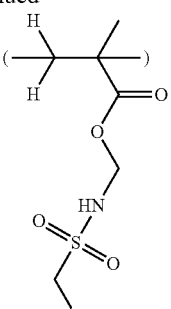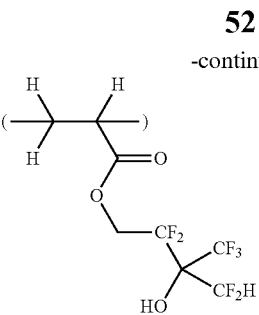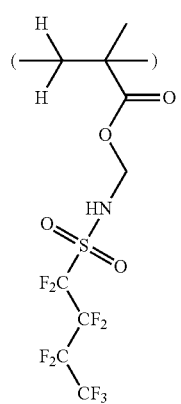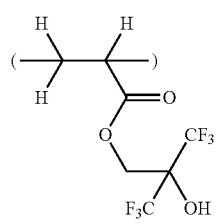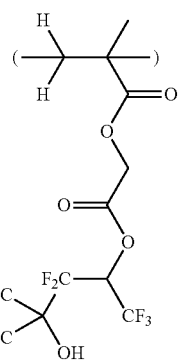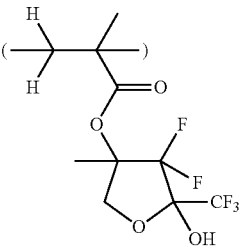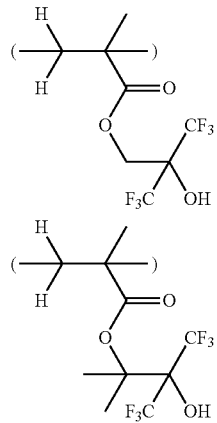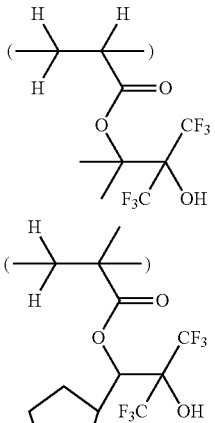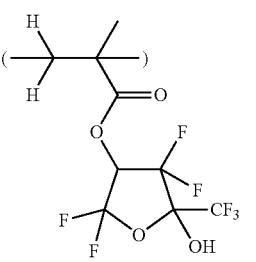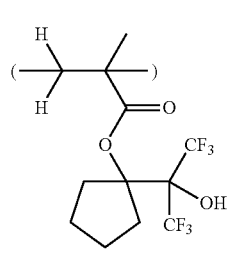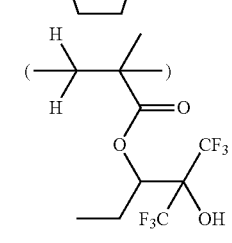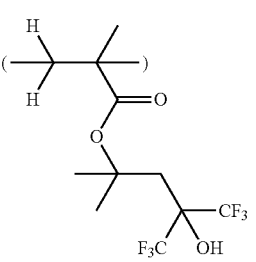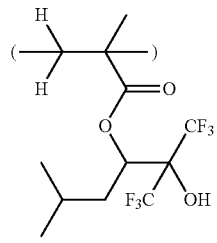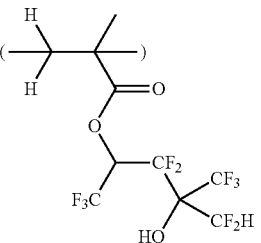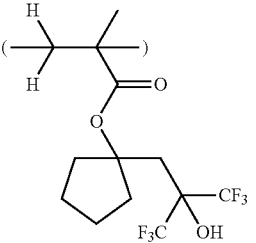

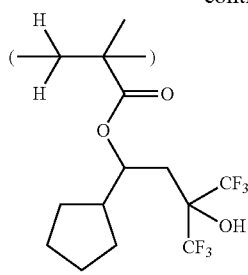

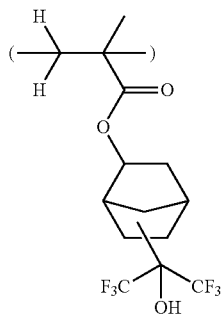

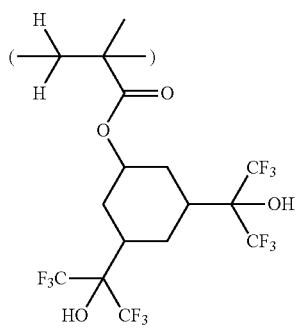

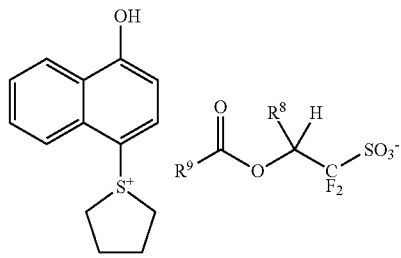

(2-1)

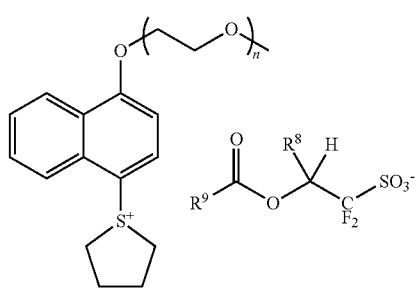

(2-2)

wherein $R^8$ is hydrogen or trifluoromethyl, $R^9$ is a straight, branched or cyclic, monovalent hydrocarbon group of 4 to 30 carbon atoms which may contain a heteroatom, and n is an integer of 1 to 4.

Examples of the hydrocarbon group of $R^9$ are given below, but not limited thereto.

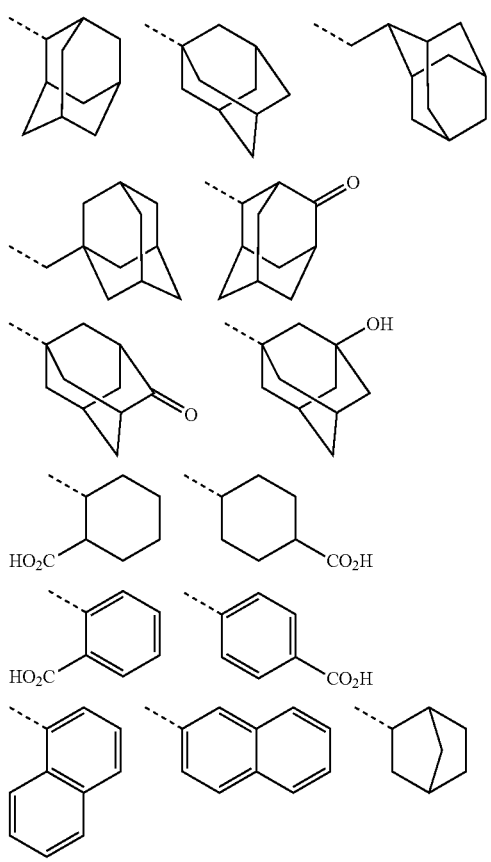

The compositional ratio of recurring units of which polymer (A) is constructed is preferably in the following range. Provided that a total content of recurring units of a structure adapted to generate an acid in response to high-energy radiation, having formula (1-1) or (1-2) is "a" mol %, a total content of acid labile units is "b" mol %, a total content of lactone-containing units is "c" mol %, and a total content of additional recurring units is "d" mol %, and a+b+c+d=100 mol %, the compositional ratio is preferably in the range: $0 < a \leq 30$, $0 < b \leq 70$, $0 \leq c \leq 70$, and $0 \leq d \leq 30$, and more preferably $1 \leq a \leq 10$, $20 \leq b \leq 70$, $20 \leq c \leq 60$, and $0 \leq d \leq 20$.

The polymer preferably has a weight average molecular weight (Mw) of 1,000 to 500,000, and more preferably 2,000 to 30,000 as measured by gel permeation chromatography (GPC) versus polystyrene standards. Outside the range, a polymer with a lower Mw is likely to dissolve in water whereas a polymer with a higher Mw has strong possibilities of alkali solubility being lost and defects being formed upon spin coating.

In addition to polymer (A), the positive resist composition comprises (B) a sulfonium salt having the general formula (2-1) or (2-2):

-continued

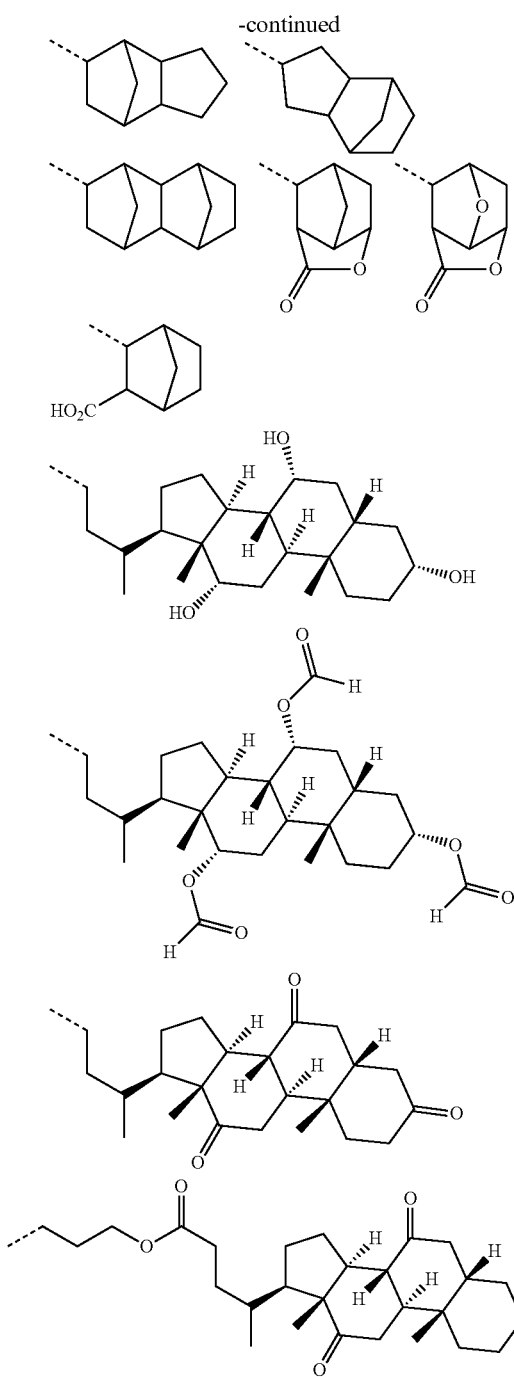

The sulfonium cation in formula (2-1) may be synthesized by a well-known method, specifically by reacting 1-naphthol with tetramethylene sulfoxide in methanol with the aid of hydrogen chloride gas. The sulfonium cation in formula (2-2) may also be synthesized by a well-known method. Specifically, a sulfonium cation wherein n=1 may be synthesized by reacting 2-methoxyethyl chloride and 1-naphthol under basic conditions to form 1-(2-methoxyethoxy)naphthalene. Subsequently this is reacted with tetramethylene sulfoxide in a diphosphorus pentoxide/methanesulfonic acid solution to form the sulfonium cation. A sulfonium cation wherein n=2, 3 or 4 may be similarly synthesized using a corresponding substituted alkyl halide.

The anion of the sulfonium salt having formula (2-1) or (2-2) may be synthesized according to the teachings of JP-A 2007-145797 and JP-A 2008-299069.

An ion exchange reaction between the cation and the anion may be carried out in an organic solvent alone or in admixture with water. The organic solvent is selected from dichloromethane, ethyl acetate, methyl isobutyl ketone, methanol, ethanol, acetonitrile, and the like.

Illustrative, non-limiting examples of the sulfonium salts having formulae (2-1) and (2-2) are shown below.

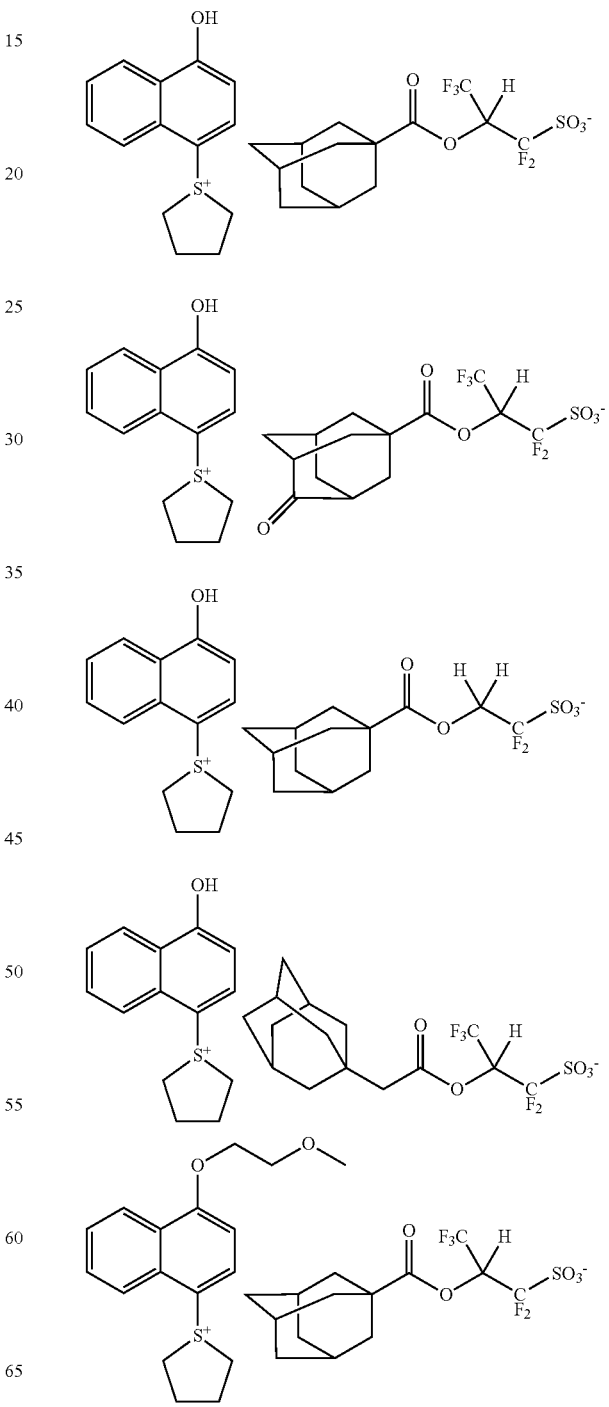

-continued

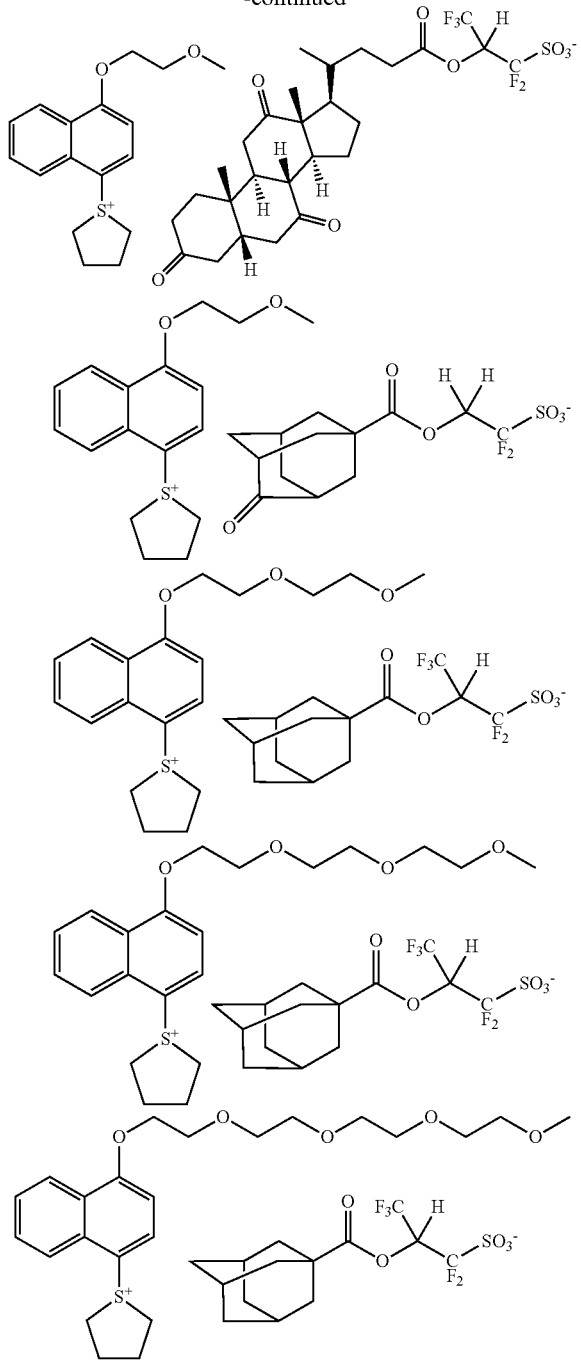

To the resist composition, sulfonium salt (B) may be added in any desired amount. Preferably sulfonium salt (B) is added in an amount of 0.1 to 30 parts, more preferably 2 to 20 parts by weight per 100 parts by weight of polymer (A) or the sum of polymer (A) and another polymer, if any. As long as the amount of sulfonium salt (B) is up to 30 parts by weight, the resist film has a sufficiently high transmittance and a least likelihood of resolution being degraded. The sulfonium salt (B) may be used alone or in admixture.

In a preferred embodiment, the resist composition comprises a quencher in addition to polymer (A) and sulfonium salt (B). The "quencher" as used herein is preferably a compound capable of suppressing the rate of diffusion when the acid generated by the acid generator diffuses within the resist film. The inclusion of quencher facilitates adjustment of resist sensitivity and holds down the rate of acid diffusion within the resist film, resulting in better resolution. In addition, it suppresses changes in sensitivity following exposure and reduces substrate and environment dependence, as well as improving the exposure latitude and the pattern profile.

Examples of suitable quenchers include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, carbamate derivatives, and ammonium salts.

Notably, highly nucleophilic compounds and strongly basic compounds are inadequate as the quencher because they can react with the sulfonium salt (B). Preferred quenchers are primary or secondary amines which are protected with tBOC (tert-butoxycarbonyl). Those compounds described in JP-A 2007-298569 and JP-A 2010-020204 are also preferred.

As the quencher used herein, (C) a nitrogen-containing organic compound having the general formula (3) is most preferred.

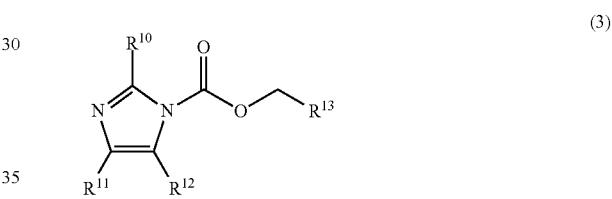

(3)

Herein $R^{10}$ is hydrogen, a straight, branched or cyclic $C_1$-$C_{15}$ alkyl group, or $C_6$-$C_{15}$ aryl group, $R^{11}$ and $R^{12}$ are each independently hydrogen, a straight, branched or cyclic $C_1$-$C_{10}$ alkyl group, or $C_6$-$C_{15}$ aryl group, or $R^{11}$ and $R^{12}$ may bond together to form a $C_6$-$C_{14}$ aromatic ring, and $R^{13}$ is a $C_6$-$C_{15}$ aryl group.

In formula (3), examples of the straight, branched or cyclic $C_1$-$C_{15}$ alkyl group or $C_6$-$C_{15}$ aryl group represented by $R^{10}$ include, but are not limited to, methyl, ethyl, propyl, isopropyl, undecanyl, and phenyl. Examples of the straight, branched or cyclic $C_1$-$C_{10}$ alkyl group or $C_6$-$C_{15}$ aryl group represented by $R^{11}$ and $R^{12}$ include, but are not limited to, methyl and phenyl. When $R^{11}$ and $R^{12}$ bond together to form a ring, a structure having the general formula (4) is exemplary of the ring although the ring is not limited thereto.

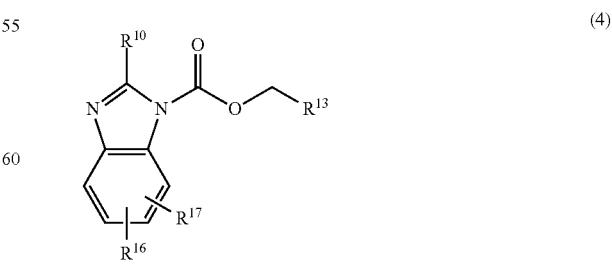

(4)

Herein $R^{10}$ and $R^{13}$ are as defined above, $R^{16}$ and $R^{17}$ are each independently hydrogen or a $C_1$-$C_6$ alkyl group.

$R^{13}$ is a $C_6$-$C_{15}$ aryl group which may be substituted with an alkoxy group, examples of which include phenyl and 4-methoxyphenyl, but are not limited thereto.
Illustrative, non-limiting examples of the compound having formula (3) are given below.
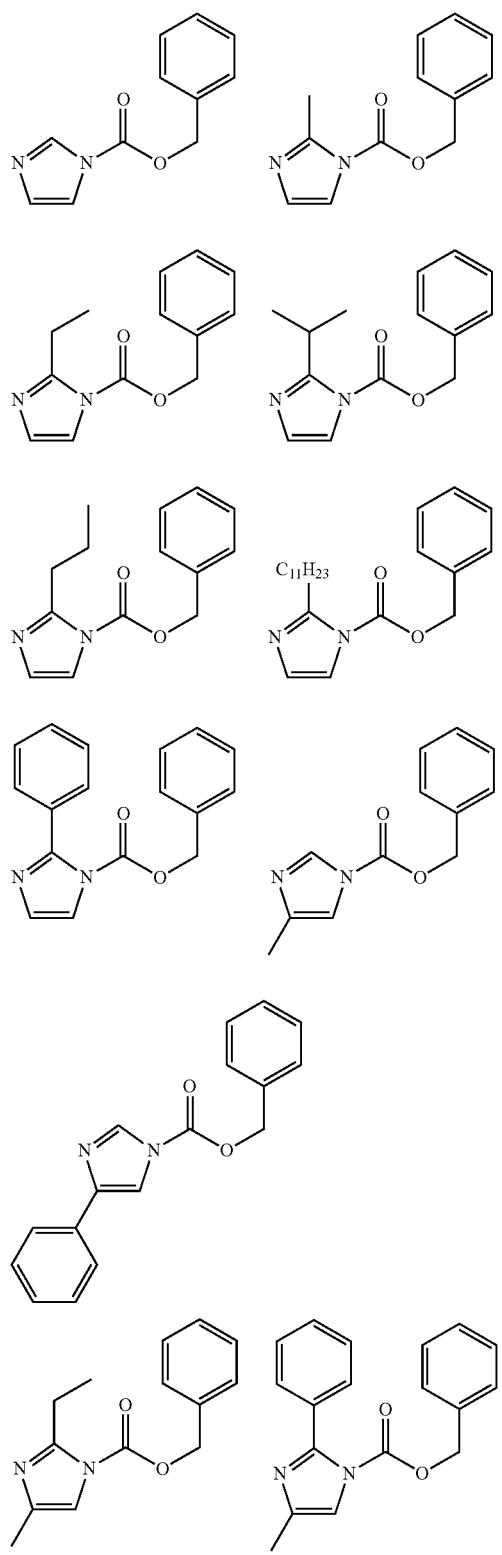
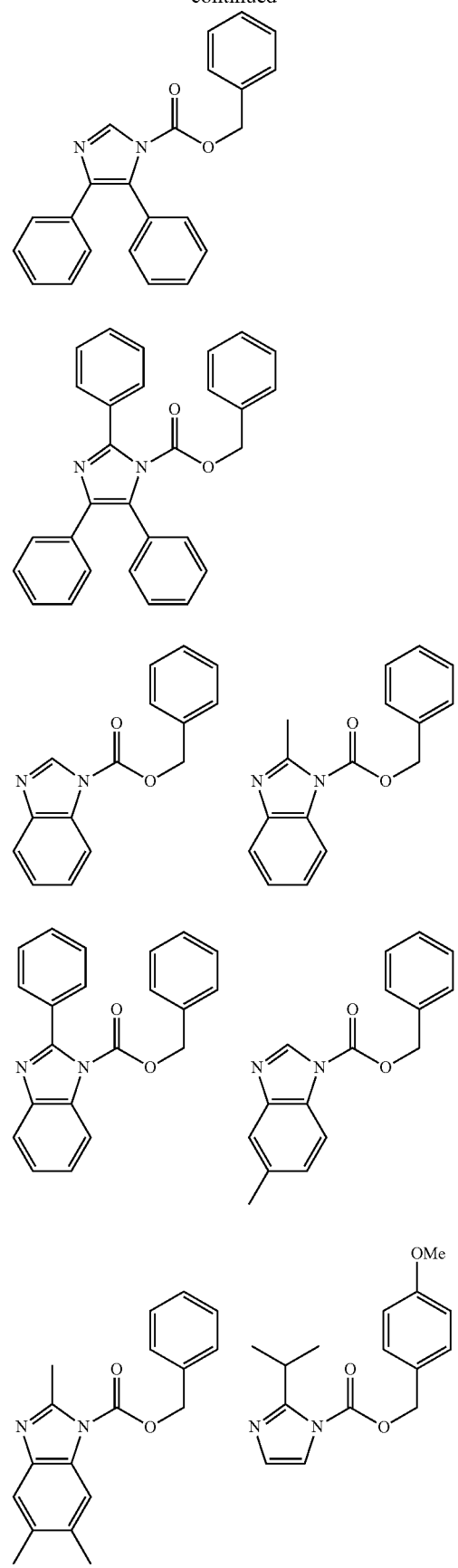

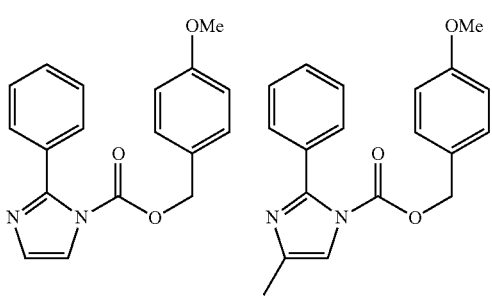

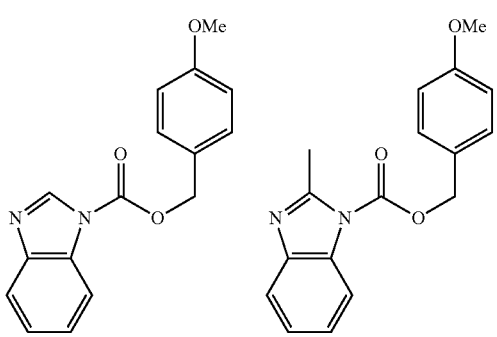

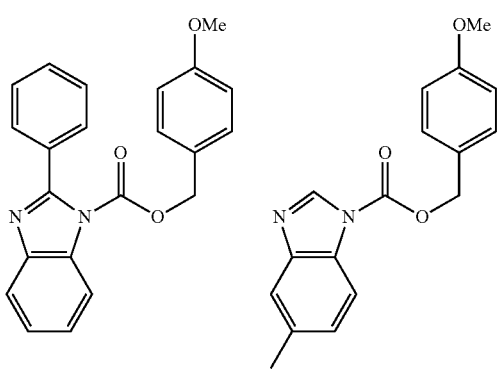

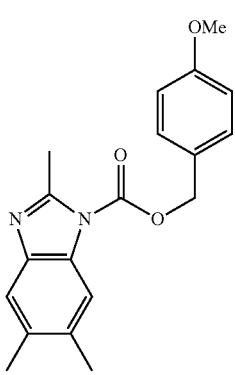

Note that Me stands for methyl.

The nitrogen-containing organic compound having formula (3) may be prepared, for example, according to the following reaction scheme although the preparation method is not limited thereto.

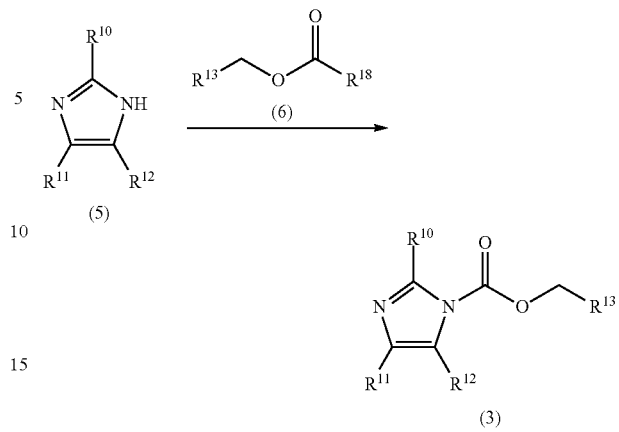

Herein $R^{10}$ to $R^{13}$ are as defined above, $R^{18}$ is a halogen atom or $-OR^{19}$ wherein $R^{19}$ is a group having the following formula (7):

wherein the broken line denotes a valence bond and $R^{13}$ is as defined above.

Generally, the carbamate-forming reaction using imidazole derivative (5) and arylmethoxycarbonyl-forming agent (6) as shown by the above reaction scheme is applicable to the synthesis of all compounds having formula (3).

The arylmethoxycarbonyl-forming agent (6) is preferably a halo-carbonic acid ester of formula (6) wherein $R^{18}$ is halogen or a dicarbonic acid diester of formula (6) wherein $R^{18}$ is $-OR^{19}$. When the halo-carbonic acid ester is used, the reaction is preferably carried out in a solventless system or in a solvent (e.g., methylene chloride, acetonitrile, diethyl ether, tetrahydrofuran, N,N-dimethylformamide, toluene or hexane), by sequentially or simultaneously adding imidazole derivative (5), a corresponding halo-carbonic acid ester (e.g., benzyl chlorocarbonate or 4-methoxybenzyl chlorocarbonate), and a base (e.g., triethylamine, pyridine, 2,6-lutidine or N,N-dimethylaniline), and optionally heating or cooling. When the dicarbonic acid diester is used, the reaction is preferably carried out in a solvent (e.g., methylene chloride, acetonitrile, diethyl ether, tetrahydrofuran, N,N-dimethylformamide, toluene or hexane), by sequentially or simultaneously adding imidazole derivative (5), a corresponding dicarbonic acid diester (e.g., dibenzyl dicarbonate or di(4-methoxybenzyl)dicarbonate), and a base (e.g., triethylamine, pyridine, 2,6-lutidine or N,N-dimethylaniline), and optionally heating or cooling. Although the amount of arylmethoxycarbonyl-forming agent (6) used varies with other conditions, an appropriate amount is 1.0 to 5.0 moles, more preferably 1.0 to 2.0 moles per mole of imidazole derivative (5). Although the amount of the base used varies with other conditions, an appropriate amount is 0 to 5.0 moles, more preferably 0 to 2.0 moles per mole of imidazole derivative (5). The reaction time is determined as appropriate by monitoring the reaction process by gas chromatography (GC) or silica gel thin-layer chromatography (TLC) because it is desirable from the yield aspect to drive the reaction to completion. Usually the reaction time is about 0.5 to about 24 hours. The desired nitrogen-containing organic compound (3) may be obtained from the reaction mixture by ordinary aqueous work-up. If necessary, the compound may be purified by standard techniques like distillation, chromatography, and re-crystallization. Sometimes, the reaction solution may be purified directly or after the salt resulting from reaction is filtered out, while bypassing the aqueous work-up.

It has been found that the nitrogen-containing organic compound (C) having formula (3) endows the resist composition with better shelf stability and contributes to an improvement in the lithography performance thereof without a possibility of reaction with the sulfonium salt (B) essentially present in the resist composition. The nitrogen-containing organic compound (C) has a high quencher ability, i.e., acid diffusion suppressing ability, despite low basicity and low nucleophilicity.

The resist composition may contain two or more quencher constituents selected from among the nitrogen-containing organic compounds having formula (3) and other quencher compounds.

A total amount of nitrogen-containing organic compounds having formula (3) added is preferably 0.1 to 8 parts, more preferably 0.5 to 5 parts by weight per 100 parts by weight of the base resin.

In addition to the polymer (A), the positive resist composition may further comprise another polymer. Specifically the other polymer used herein includes, but is not limited to, those polymers comprising units of the following formula (R1) and/or (R2) and preferably having a weight average molecular weight (Mw) of 1,000 to 100,000, and more preferably 3,000 to 30,000, as measured by GPC versus polystyrene standards.

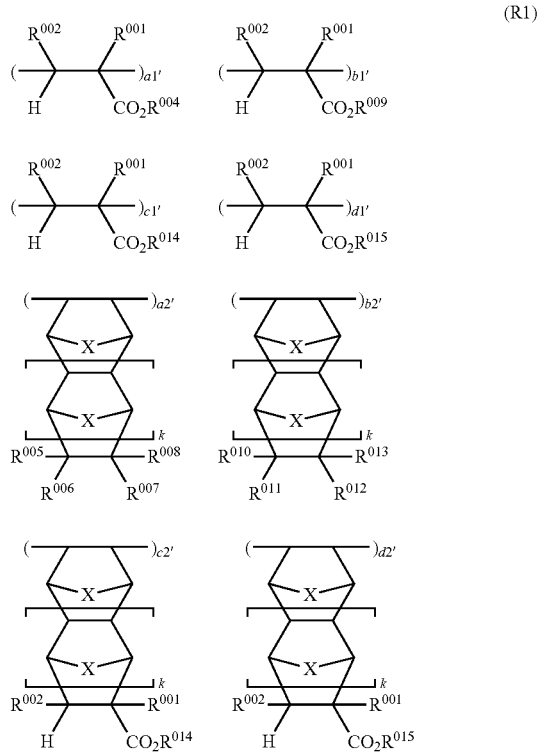

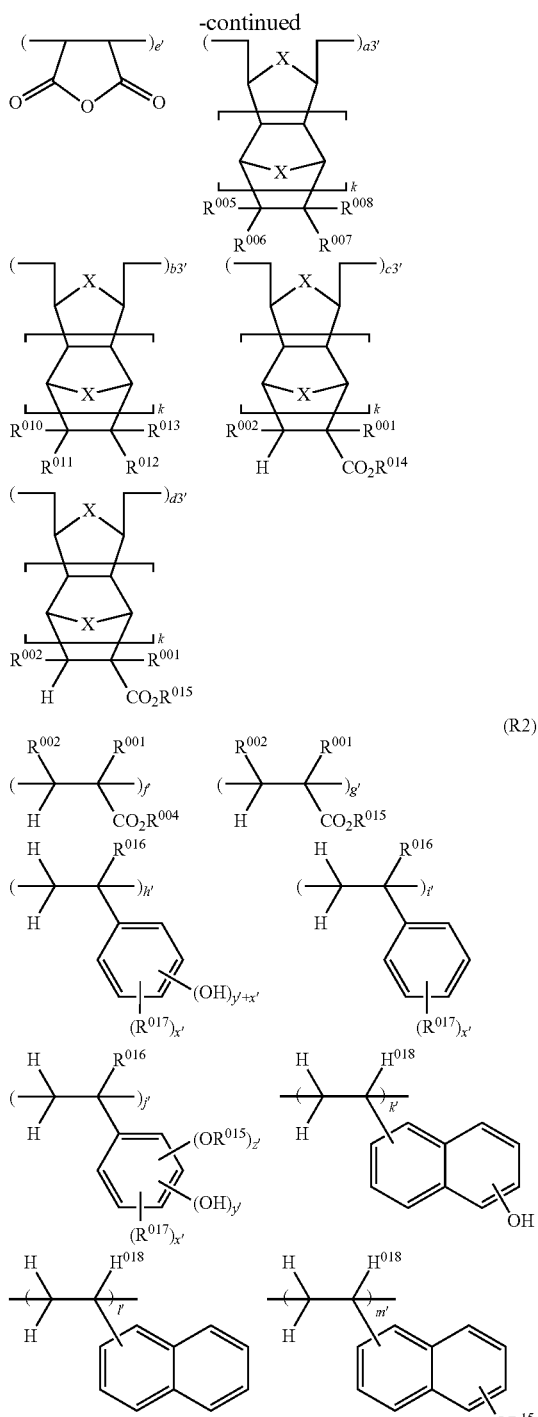

Herein, $R^{001}$ is hydrogen, methyl, or $-CH_2CO_2R^{003}$. $R^{002}$ is hydrogen, methyl or $-CO_2R^{003}$. $R^{003}$ is a straight, branched or cyclic $C_1$-$C_{15}$ alkyl group, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent $C_1$-$C_{15}$ hydrocarbon group having a fluorinated substituent group, carboxyl group or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, hydroxyhexafluoroisopropylcyclohexyl, and di(hydroxyhexafluoroisopropyl)cyclohexyl.

At least one of $R^{005}$ to $R^{008}$ represents a monovalent $C_1$-$C_{15}$ hydrocarbon group having a fluorinated substituent group, carboxyl group or hydroxyl group while the remaining R's independently represent hydrogen or straight, branched or cyclic $C_1$-$C_{15}$ alkyl groups. Examples of the monovalent $C_1$-$C_{15}$ hydrocarbon group having a fluorinated substituent group, carboxyl group or hydroxyl group include carboxyl, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, hydroxyhexafluoroisopropylcyclohexyloxycarbonyl, and di(hydroxyhexafluoroisopropyl)cyclohexyloxycarbonyl. Examples of the straight, branched or cyclic $C_1$-$C_{15}$ alkyl group are the same as exemplified for $R^{003}$.

Alternatively, a pair of $R^{005}$ and $R^{006}$, $R^{006}$ and $R^{007}$, or $R^{007}$ and $R^{008}$ may bond together to form a ring with the carbon atom(s) to which they are attached. In that event, at least one of $R^{005}$ to $R^{008}$ is a divalent $C_1$-$C_{15}$ hydrocarbon group having a fluorinated substituent group, carboxyl group or hydroxyl group, while the remaining are independently a single bond or a straight, branched or cyclic $C_1$-$C_{15}$ alkylene group. Examples of the divalent $C_1$-$C_{15}$ hydrocarbon group having a fluorinated substituent group, carboxyl group or hydroxyl group include the groups exemplified as the monovalent hydrocarbon group having a fluorinated substituent group, carboxyl group or hydroxyl group, with one hydrogen atom eliminated therefrom. Examples of the straight, branched or cyclic $C_1$-$C_{15}$ alkyl groups include the groups exemplified for $R^{003}$, with one hydrogen atom eliminated therefrom.

$R^{009}$ is a monovalent $C_3$-$C_{15}$ hydrocarbon group containing a —$CO_2$— partial structure, for example, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent $C_2$-$C_{15}$ hydrocarbon group containing a —$CO_2$— partial structure, while the remaining R's are independently hydrogen or straight, branched or cyclic $C_1$-$C_{15}$ alkyl groups. Examples of the monovalent $C_1$-$C_{15}$ hydrocarbon group containing a —$CO_2$— partial structure include 2-oxooxolan-3-yloxycarbonyl, 4,4-dimethyl-2-oxooxolan-3-yloxycarbonyl, is 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic $C_1$-$C_{15}$ alkyl groups are the same as exemplified for $R^{003}$.

Alternatively, a pair of $R^{010}$ and $R^{011}$, $R^{011}$ and $R^{012}$, or $R^{012}$ and $R^{013}$ may bond together to form a ring with the carbon atom(s) to which they are attached. In that event, at least one of $R^{010}$ to $R^{013}$ is a divalent $C_1$-$C_{15}$ hydrocarbon group containing a —$CO_2$— partial structure, while the remaining are independently a single bond or a straight, branched or cyclic $C_1$-$C_{15}$ alkylene group. Examples of the divalent $C_2$-$C_{15}$ hydrocarbon group containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group containing a —$CO_2$— partial structure, with one hydrogen atom eliminated therefrom. Examples of the straight, branched or cyclic $C_1$-$C_{15}$ alkylene groups include the groups exemplified for $R^{003}$, with one hydrogen atom eliminated therefrom.

$R^{014}$ is a polycyclic $C_7$-$C_{15}$ hydrocarbon group or an alkyl group containing a polycyclic hydrocarbon group, for example, norbornyl, bicyclo[3.3.1]nonyl, tricyclo[5.2.1.0$^{2,6}$] decyl, adamantyl, ethyladamantyl, butyladamantyl, norbornylmethyl, and adamantylmethyl.

$R^{015}$ is an acid labile group. X is —$CH_2$ or an oxygen atom. The subscript k is 0 or 1.

The acid labile groups represented by $R^{015}$ may be selected from a variety of such groups. Examples of the acid labile group are groups of formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms, as illustrated above as the acid labile group in polymer (A).

In formula (R2), $R^{016}$ and $R^{018}$ each are hydrogen or methyl. $R^{017}$ is a straight, branched or cyclic $C_1$-$C_8$ alkyl group.

In formula (R1), the subscripts a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1. In formula (R2), f', g', h', j', k', l', and m' are numbers from 0 to less than 1, satisfying f'+g'+h'+i'+j'+k'+l'+m'=1; x', y' and z' are each an integer of 0 to 3, satisfying 1≤x'+y'+z'≤5 and 1≤y'+z'≤3. In addition, one or more monomers selected from indenes, norbornadienes, acenaphthylenes and vinyl ethers may be copolymerized.

Examples of the recurring units incorporated at compositional ratio a1' in formula (R1) include units having a hydroxyl, carboxyl, fluoroalkyl or fluoroalcohol group as illustrated above as optional units in polymer (A), but are not limited thereto.

Examples of the recurring units incorporated at compositional ratio b1' in formula (R1) include units having an adhesive group of lactone ring as illustrated above as optional units in polymer (A), but are not limited thereto.

Examples of the recurring units incorporated at compositional ratio d1' in formula (R1) include acid labile units as illustrated above as the acid labile units in polymer (A), but are not limited thereto.

Examples of polymers comprising recurring units in compositional ratios a3', b3', c3' and d3' in formula (R1) are shown below, though not limited thereto.

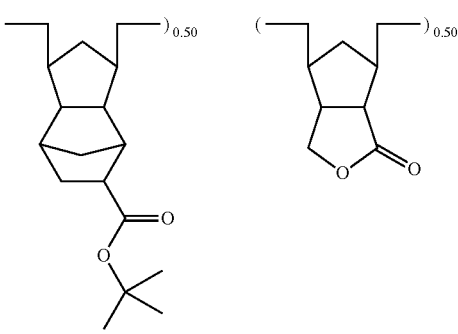

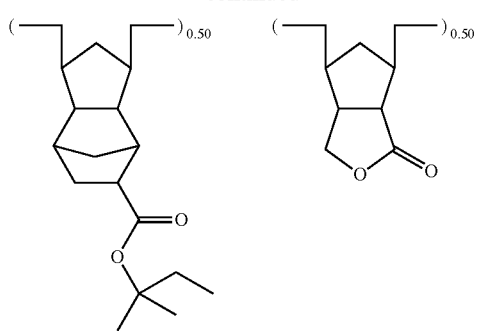
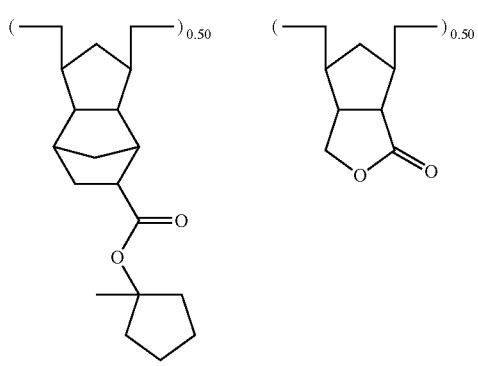
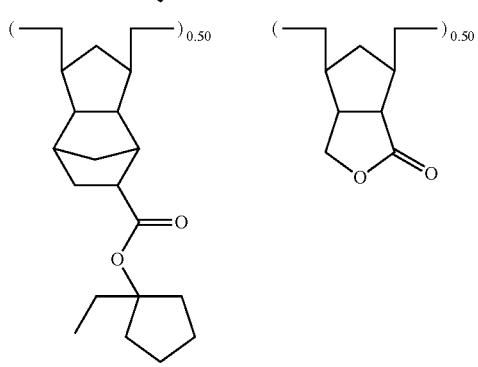
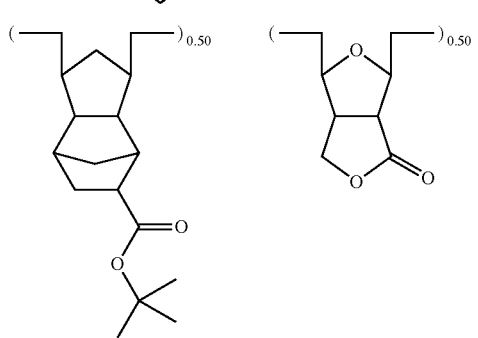
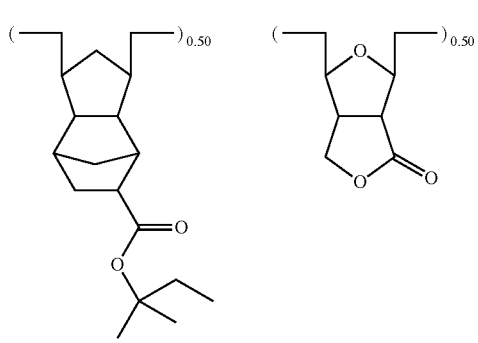
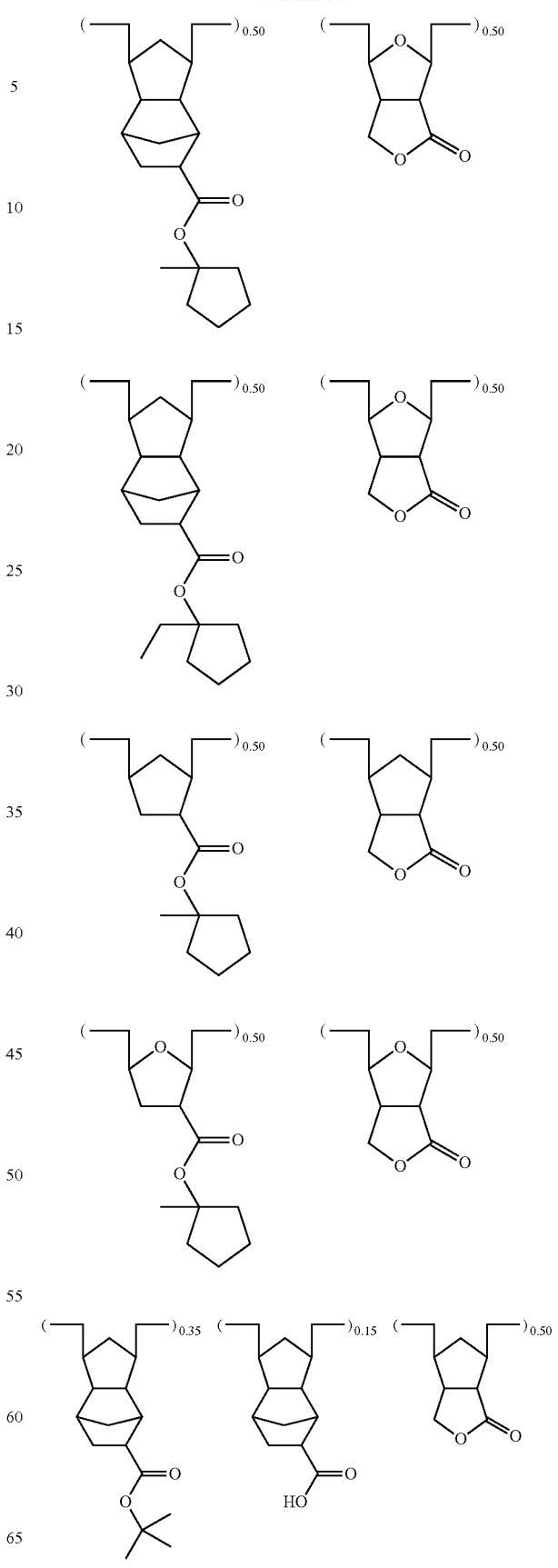

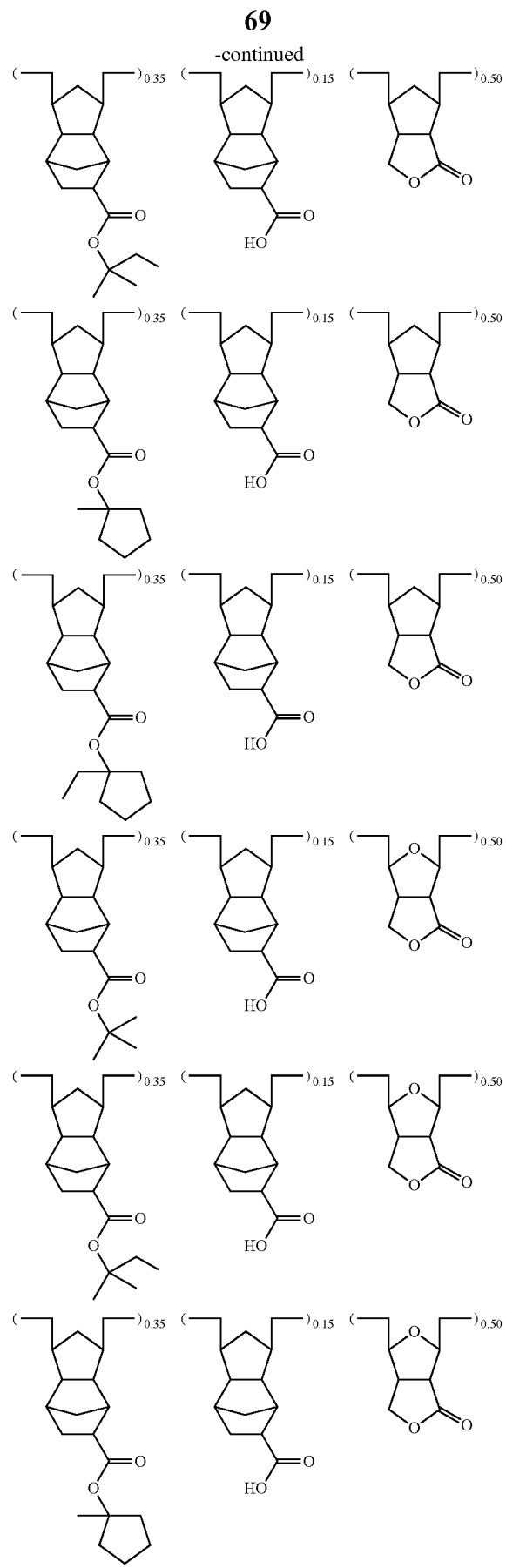
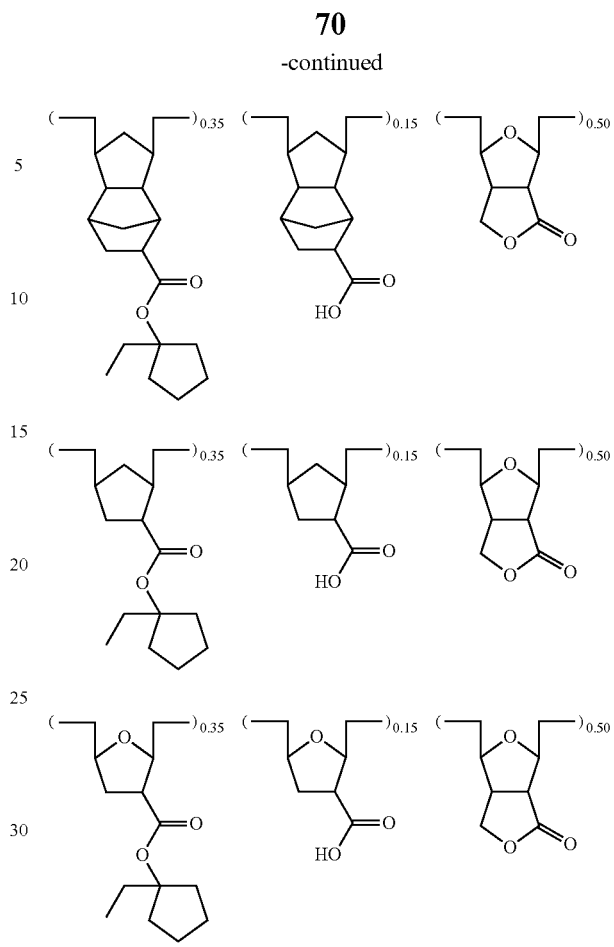

The inventive polymer (A) and the other polymer are preferably blended in a weight ratio from 100:0 to 30:70, more preferably from 100:0 to 50:50. If the blend ratio of polymer (A) is below this range, the resist composition may become poor in some of the desired properties. The performance of the resist composition can be adjusted by properly changing the blend ratio of polymer (A). The polymer used as the base resin is not limited to one type and a mixture of two or more polymers may be added. The use of plural polymers allows for easy adjustment of resist properties.

While the positive resist composition comprises (A) a polymer comprising recurring units of a structure adapted to generate an acid upon exposure to high-energy radiation and acid labile units and (B) a sulfonium salt having an acid generating ability, the composition may further comprises another acid generator capable of generating an acid upon exposure to high-energy radiation. Suitable photoacid generators which can be used herein include sulfonium salts, iodonium salts, N-sulfonyloxydicarboxylmide, and oxime-O-arylsulfonate acid generators as well as compounds having the following general formula (F), which corresponds to formula (F-1) in JP-A 2009-269953 (US 20090274978).

(F)

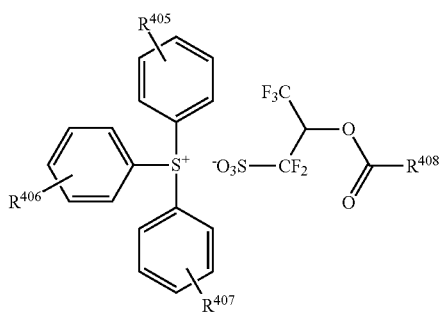

Herein $R^{405}$, $R^{406}$ and $R^{407}$ are each independently hydrogen or a monovalent, straight, branched or cyclic $C_1$-$C_{20}$ hydrocarbon group which may contain a heteroatom, preferably an alkyl or alkoxy group. Examples of the hydrocarbon group which may contain a heteroatom include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, butyladamantyl, and modified forms of the foregoing in which any carbon-carbon bond is interrupted by a heteroatom group such as —O—, —S—, —SO—, —SO$_2$—, —NH—, —C(=O)—, —C(=O)O—, or —C(=O)NH—, or any hydrogen atom is replaced by a functional group such as —OH, —NH—, —CHO, or —CO$_2$H. $R^{408}$ is a monovalent, straight, branched or cyclic $C_7$-$C_{30}$ hydrocarbon group which may contain a heteroatom.

It is noted that the use of non-fluorinated alkanesulfonic or arylsulfonic acid salts such as triphenylsulfonium 10-camphorsulfonate and triphenylsulfonium 4-toluenesulfonate should be avoided because they can detract from the stability of the present compound. It is recommended to use those compounds having formula (F-1) in JP-A 2009-269953, and non-onium salt PAGs such as imide sulfonates and oxime sulfonates.

In the resist composition, the PAG which is optionally used beside sulfonium salt (B) may be added in any desired amount as long as the objects of the invention are not compromised. An appropriate amount of the PAG is 0.1 to 20 parts, and more preferably 0.1 to 10 parts by weight per 100 parts by weight of the base resin (total of polymer (A) and optional polymer) in the composition. As long as the amount of the PAG which is optionally added beside sulfonium salt (B) is up to 20 parts by weight, the resist film has a sufficiently high transmittance to avoid any degradation of resolution. The PAGs may be used alone or in admixture of two or more. The transmittance of the resist film can be controlled by using a PAG having a low transmittance at the exposure wavelength and adjusting the amount of the PAG added.

In the resist composition, a compound which is decomposed with an acid to generate another acid, that is, acid amplifier compound may be added. For these compounds, reference should be made to JP-A 2009-269953. In the resist composition, an appropriate amount of the acid amplifier compound added is up to 2 parts, and especially up to 1 part by weight per 100 parts by weight of the base resin. Excessive amounts of the acid amplifier compound make diffusion control difficult, leading to degradation of resolution and pattern profile.

In the resist composition, an organic acid derivative or a compound having a Mw of up to 3,000 which changes solubility in alkaline developer under the action of an acid, known as dissolution inhibitor, may be added. With respect to these components, reference should be made to JP-A 2009-269953.

The organic solvent used herein may be any organic solvent in which the base resin, acid generator, and other components are soluble. Illustrative, non-limiting, examples of the organic solvent include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more. Of the above organic solvents, it is recommended to use diethylene glycol dimethyl ether, 1-ethoxy-2-propanol, PGMEA, and mixtures thereof because the acid generator is most soluble therein.

An appropriate amount of the organic solvent used is 200 to 4,000 parts, especially 400 to 3,000 parts by weight per 100 parts by weight of the base resin.

Optionally, the resist composition may further comprise a surfactant. With respect to the surfactant, reference should be made to JP-A 2009-269953. Reference may also be made to JP-A 2008-122932, JP-A 2010-134012, JP-A 2010-107695, JP-A 2009-276363, JP-A 2009-192784, JP-A 2009-191151, and JP-A 2009-098638. Any of conventional surfactants and alkali soluble surfactants may be used.

An appropriate amount of the surfactant added is 0.001 to 20 parts, more preferably 0.01 to 10 parts by weight per 100 parts by weight of the base resin. With respect to the amount, reference should be made to JP-A 2007-297590.

Process

A second embodiment is a pattern forming process using the resist composition described above. Pattern formation using the resist composition of the invention may be performed by well-known lithography processes. The process generally involves coating, prebaking, exposure, optional PEB, and development. If necessary, any additional steps may be added.

First the resist composition is applied onto a substrate for integrated circuitry fabrication (e.g., Si, SiO$_2$, SiN, SiON, TiN, WSi, BPSG, SOG, organic antireflective film, etc.) or a substrate for mask circuitry fabrication (e.g., Cr, CrO, CrON, MoSi, etc.) by a suitable coating technique such as spin coating. The coating is prebaked on a hot plate at a temperature of 60 to 150° C. for 1 to 10 minutes, preferably 80 to 140° C. for 1 to 5 minutes. The resulting resist film is generally 0.05 to 2.0 μm thick. Through a photomask having a desired pattern disposed over the substrate, the resist film is then exposed to high-energy radiation such as deep-UV, excimer laser or x-ray, or electron beam in an exposure dose preferably in the range of 1 to 200 mJ/cm$^2$, more preferably 10 to 100 mJ/cm$^2$. Alternatively, pattern formation may be performed by writing with an electron beam directly (not through a mask). Light exposure may be done by a conventional exposure process or in some cases, by an immersion process of providing liquid impregnation between the mask and the resist. In the case of immersion lithography, a protective coating which is insoluble in water may be used. The resist film is then post-exposure baked (PER) on a hot plate at 60 to 150° C. for 1 to 5 minutes, and preferably at 80 to 140° C. for 1 to 3 minutes.

Finally, development is carried out using as the developer an aqueous alkali solution, such as a 0.1 to 5 wt %, preferably 2 to 3 wt %, aqueous solution of tetramethylammonium hydroxide (TMAH), this being done by a conventional method such as dip, puddle, or spray development for a period of 0.1 to 3 minutes, and preferably 0.5 to 2 minutes. In this way the desired pattern is formed on the substrate. Of the various types of high-energy radiation that may be used, the resist composition of the invention is best suited to fine pattern formation with, in particular, deep-UV or excimer laser having a wavelength of 250 to 180 nm, x-ray, or electron beam. The desired pattern may not be obtainable outside the upper and lower limits of the above range.

The water-insoluble protective coating which is used in the immersion lithography is to prevent the resist film from being leached and to improve water slippage at the film surface and is generally divided into two types. The first type is an organic solvent-strippable protective coating which must be stripped, prior to alkaline development, with an organic solvent in which the resist film is not dissolvable. The second type is an alkali-soluble protective coating which is soluble in an alkaline developer so that it can be removed simultaneously with the removal of solubilized areas of the resist film. The protective coating of the second type is preferably of a material comprising a polymer having a 1,1,1,3,3,3-hexafluoro-2-propanol residue (which is insoluble in water and soluble in an alkaline developer) as a base in an alcohol solvent of at least 4 carbon atoms, an ether solvent of 8 to 12 carbon atoms or a mixture thereof. Alternatively, the aforementioned surfactant which is insoluble in water and soluble in an alkaline developer may be dissolved in an alcohol solvent of at least 4 carbon atoms, an ether solvent of 8 to 12 carbon atoms or a mixture thereof to form a solution, from which the protective coating of the second type is formed.

EXAMPLE

Examples and Comparative Examples are given below by way of illustration and not by way of limitation. Weight average molecular weight (Mw) and number average molecular weight (Mn) are measured by gel permeation chromatography (GPC), and a dispersity (Mw/Mn) is computed therefrom.

Synthesis Example

Polymers within the scope of polymer (A) were synthesized as follows.

Synthesis Example 1

Synthesis of Polymer 1

A flask in nitrogen blanket was charged with 7.98 g of triphenylsulfonium 1,1,3,3,3-pentafluoro-2-methacryloyloxy-propane-1-sulfonate (described in JP-A 2008-133448 or U.S. Pat. No. 7,569,326), 13.34 g of 4-ethyltetracyclo[6.2.1.1$^{3,6}$.0$^{2,7}$]dodecanyl methacrylate, 11.03 g of 2-oxotetrahydrofuran-3-yl methacrylate, 7.66 g of 3-hydroxy-1-adamantyl methacrylate, 1.11 g of 2,2'-azobisisobutyronitrile, and 70.0 g of methyl ethyl ketone (MEK) to form a monomer solution. Another flask in nitrogen blanket was charged with 23.0 g of MEK and heated at 80° C. with stirring, to which the monomer solution was added dropwise over 4 hours. After the completion of dropwise addition, the reaction solution was stirred for 2 hours for polymerization while maintaining the temperature of 80° C., and then cooled to room temperature.

With vigorous stirring, the polymerization solution was added dropwise to 400 g of hexane whereupon a copolymer precipitate was collected by filtration. The copolymer was washed twice with a solvent mixture of 45.4 g of MEK and 194.6 g of hexane. On vacuum drying at 50° C. for 20 hours, 38.7 g of the copolymer (Polymer 1) was obtained in white powder form. The copolymer was analyzed by $^{13}$C-NMR, finding a copolymer compositional ratio of 10/30/40/20 mol % in the described order of monomers. The Mw and Mw/Mn of the polymer were determined by GPC.

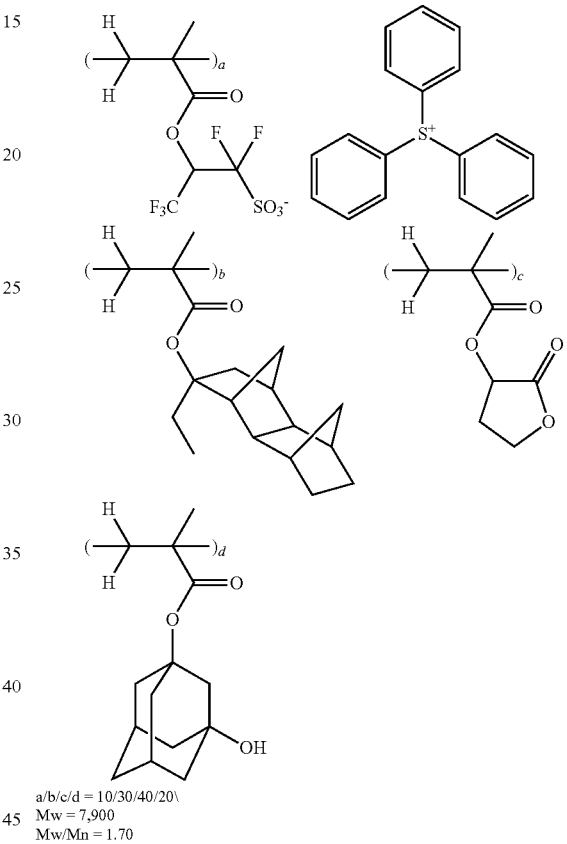

Polymer 1 a/b/c/d = 10/30/40/20\
Mw = 7,900
Mw/Mn = 1.70

Sulfonium salts within the scope of salt (B) were synthesized as follows.

Synthesis Example 2

Synthesis of 4-hydroxynaphthyl-1-tetrahydrothiophenium 2-(adamantane-1-carbonyloxy)-1,1,3,3,3-pentafluoropropane-sulfonate (PAG-B1)

First 10 g (0.069 mol) of 1-naphthol and 7.2 g (0.069 mol) of tetramethylene sulfoxide were dissolved in 50 g of methanol and cooled at −16° C. An excess amount of hydrogen chloride gas was fed into the solution at a temperature below 20° C. Nitrogen was bubbled into the solution to expel the excess of hydrogen chloride gas whereupon the reaction solution was concentrated. Water and diisopropyl ether were added to the concentrate, from which a water layer, aqueous solution of 4-hydroxynaphthyl-1-tetrahydrothiophenium chloride was separated. Next, the aqueous solution (corresponding to 0.023 mol) of 4-hydroxynaphthyl-1-tetrahydrothlophenium chloride was mixed with an aqueous solution (corresponding to 0.021 mol) of sodium 1,1,3,3,3-pentafluoro-2-(adamantane-1-carbonyloxy)propanesulfonate which was synthesized according to the formulation described in JP-A 2007-145797 (or U.S. Pat. No. 7,511,169). The mixture was extracted with 100 g of dichloromethane and 50 g of methyl isobutyl ketone. The organic layer was washed with water, the solvents were distilled off in vacuum, and isopropyl ether was added to the residue for crystallization. Subsequent filtration and drying gave the target compound. White crystal, 6.2 g, yield 43%.

Synthesis Example 3

Synthesis of 4-(2-methoxyethoxy)naphthalene-1-tetrahydro-thiophenium 2-(adamantane-1-carbonyloxy)-1,1,3,3,3-pentafluoropropanesulfonate (PAG-B2)

In 100 g of ethanol were dissolved 50.0 g (0.0347 mol) of 1-naphthol, 34.4 g (0.0364 mol) of 2-methoxyethyl chloride, 14.6 g (0.0364 mol) of sodium hydroxide, and 2.6 g (0.017 mol) of sodium iodide. The solution was heated and stirred at 80° C. for 8 hours. After cooling, the solution was combined with 100 g of water and 200 g of toluene, from which an organic layer was separated. It was washed 5 times with 100 g of 5 wt % sodium hydroxide aqueous solution and then 4 times with 100 g of water. The organic layer was concentrated, obtaining 45 g of oily matter. On vacuum distillation at 110° C. and 13 Pa, 41 g of 1-(2-methoxyethoxy)naphthalene was obtained (yield 58%). Next 5.0 g (0.024 mol) of 1-(2-methoxyethoxy)naphthalene was dispersed in 10 g of Eaton's Reagent (Aldrich, diphosphorus pentoxide/methanesulfonic acid solution), to which 5.1 g (0.049 mol) of tetramethylene sulfoxide was added dropwise and mixed. The solution was matured overnight at room temperature and combined with 30 g of water and 30 g of diisopropyl ether, from which a water layer was separated. The water layer was again washed with 30 g of diisopropyl ether. This aqueous solution was combined with an aqueous solution (corresponding to 0.007 mol) of sodium 1,1,3,3,3-pentafluoro-2-(adamantane-1-carbonyloxy)propanesulfonate which was synthesized according to the formulation described in JP-A 2007-145797, after which extraction was effected twice with 50 g of dichloromethane. The organic layer was washed with water, and the solvent was distilled off in vacuum. The residue was poured into isopropyl ether for crystallization. Subsequent filtration and drying gave the target compound. White crystal, 7.9 g, yield 94%.

Synthesis of Polymers 2 to 36

Polymers 2 to 36 were synthesized as in Synthesis Example 1. The composition and compositional ratio (mol %) of each polymer are shown in Table 1 together with its Mw and Mw/Mn. The structure of each recurring unit is shown in Tables 2 to 5. In Table 2, Monomers 1 to 7 correspond to units capable of generating an acid upon exposure to high-energy radiation, to be essentially incorporated in polymer (A). In Table 3, ALU-1 to 11 designate acid labile units to be essentially incorporated in polymer (A). Polymers 1 to 34 fall in the scope of the inventive polymer (A) whereas Polymers 35 and 36 are comparative polymers.

TABLE 1

|  | Unit 1 | Ratio | Unit 2 | Ratio | Unit 3 | Ratio | Unit 4 | Ratio | Unit 5 | Ratio | Mw | Mw/Mn |
|---|---|---|---|---|---|---|---|---|---|---|---|---|
| Polymer 1 | Monomer 1 | 10 | ALU-1 | 30 | Unit-1 | 40 | Unit-8 | 20 | | | 7,900 | 1.70 |
| Polymer 2 | Monomer 1 | 5 | ALU-1 | 40 | Unit-1 | 40 | Unit-8 | 15 | | | 8,200 | 1.98 |
| Polymer 3 | Monomer 1 | 2 | ALU-1 | 40 | Unit-1 | 43 | Unit-8 | 15 | | | 8,150 | 1.80 |
| Polymer 4 | Monomer 2 | 5 | ALU-1 | 40 | Unit-1 | 40 | Unit-8 | 15 | | | 8,220 | 1.81 |
| Polymer 5 | Monomer 3 | 8 | ALU-1 | 40 | Unit-1 | 40 | Unit-8 | 12 | | | 8,300 | 1.66 |
| Polymer 6 | Monomer 4 | 8 | ALU-1 | 40 | Unit-1 | 40 | Unit-8 | 12 | | | 7,610 | 1.75 |
| Polymer 7 | Monomer 5 | 2 | ALU-1 | 40 | Unit-1 | 43 | Unit-8 | 15 | | | 7,700 | 1.93 |
| Polymer 8 | Monomer 6 | 10 | ALU-1 | 40 | Unit-1 | 40 | Unit-8 | 10 | | | 8,140 | 1.71 |
| Polymer 9 | Monomer 7 | 5 | ALU-2 | 40 | Unit-1 | 40 | Unit-8 | 15 | | | 9,500 | 2.10 |
| Polymer 10 | Monomer 1 | 5 | ALU-2 | 40 | Unit-1 | 40 | Unit-8 | 15 | | | 8,550 | 1.60 |
| Polymer 11 | Monomer 1 | 5 | ALU-3 | 40 | Unit-1 | 40 | Unit-8 | 15 | | | 6,960 | 1.77 |
| Polymer 12 | Monomer 1 | 5 | ALU-4 | 40 | Unit-1 | 40 | Unit-8 | 15 | | | 7,520 | 1.91 |
| Polymer 13 | Monomer 1 | 5 | ALU-5 | 40 | Unit-1 | 40 | Unit-8 | 15 | | | 8,800 | 1.72 |
| Polymer 14 | Monomer 1 | 5 | ALU-6 | 40 | Unit-1 | 40 | Unit-8 | 15 | | | 7,980 | 1.66 |
| Polymer 15 | Monomer 1 | 5 | ALU-7 | 40 | Unit-1 | 40 | Unit-8 | 15 | | | 8,100 | 1.90 |
| Polymer 16 | Monomer 1 | 5 | ALU-1 | 40 | Unit-1 | 55 | | | | | 7,780 | 1.71 |
| Polymer 17 | Monomer 1 | 5 | ALU-4 | 50 | Unit-1 | 45 | | | | | 8,660 | 1.88 |
| Polymer 18 | Monomer 1 | 5 | ALU-1 | 10 | ALU-6 | 35 | Unit-1 | 40 | Unit-8 | 10 | 8,230 | 1.79 |
| Polymer 19 | Monomer 1 | 5 | ALU-1 | 15 | ALU-6 | 35 | Unit-1 | 45 | | | 7,750 | 1.75 |
| Polymer 20 | Monomer 1 | 5 | ALU-1 | 10 | ALU-7 | 40 | Unit-1 | 45 | | | 8,890 | 1.90 |
| Polymer 21 | Monomer 1 | 5 | ALU-4 | 10 | ALU-8 | 40 | Unit-1 | 45 | | | 6,830 | 1.80 |
| Polymer 22 | Monomer 1 | 5 | ALU-1 | 40 | Unit-1 | 40 | Unit-4 | 15 | | | 9,110 | 1.76 |
| Polymer 23 | Monomer 1 | 5 | ALU-7 | 50 | Unit-1 | 20 | Unit-4 | 25 | | | 8,220 | 1.69 |
| Polymer 24 | Monomer 1 | 5 | ALU-7 | 55 | Unit-1 | 15 | Unit-5 | 25 | | | 8,300 | 1.72 |
| Polymer 25 | Monomer 1 | 5 | ALU-4 | 45 | Unit-3 | 40 | Unit-8 | 10 | | | 9,440 | 1.80 |
| Polymer 26 | Monomer 1 | 5 | ALU-1 | 5 | ALU-7 | 55 | Unit-1 | 15 | Unit-5 | 20 | 8,540 | 1.74 |
| Polymer 27 | Monomer 1 | 5 | ALU-9 | 10 | ALU-8 | 30 | Unit-2 | 45 | Unit-6 | 10 | 8,600 | 1.68 |
| Polymer 28 | Monomer 1 | 2 | ALU-1 | 40 | Unit-1 | 43 | Unit-8 | 10 | Unit-10 | 5 | 9,200 | 1.78 |
| Polymer 29 | Monomer 1 | 2 | ALU-1 | 40 | Unit-1 | 43 | Unit-8 | 10 | Unit-11 | 5 | 7,680 | 1.61 |
| Polymer 30 | Monomer 1 | 2 | ALU-1 | 40 | Unit-1 | 43 | Unit-8 | 10 | Unit-13 | 5 | 8,270 | 1.92 |
| Polymer 31 | Monomer 1 | 5 | ALU-7 | 50 | Unit-5 | 40 | Unit-10 | 5 | | | 8,390 | 1.83 |
| Polymer 32 | Monomer 1 | 5 | ALU-7 | 50 | Unit-5 | 35 | Unit-12 | 10 | | | 9,250 | 2.12 |
| Polymer 33 | Monomer 1 | 5 | ALU-1 | 10 | ALU-6 | 35 | Unit-7 | 40 | Unit-9 | 10 | 6,220 | 1.65 |
| Polymer 34 | Monomer 2 | 5 | ALU-10 | 10 | ALU-11 | 35 | Unit-7 | 40 | Unit-9 | 10 | 6,650 | 1.67 |
| Polymer 35 | | | ALU-1 | 40 | Unit-1 | 40 | Unit-8 | 20 | | | 7,820 | 1.78 |
| Polymer 36 | | | ALU-7 | 50 | Unit-1 | 20 | Unit-4 | 30 | | | 8,360 | 1.80 |

TABLE 2
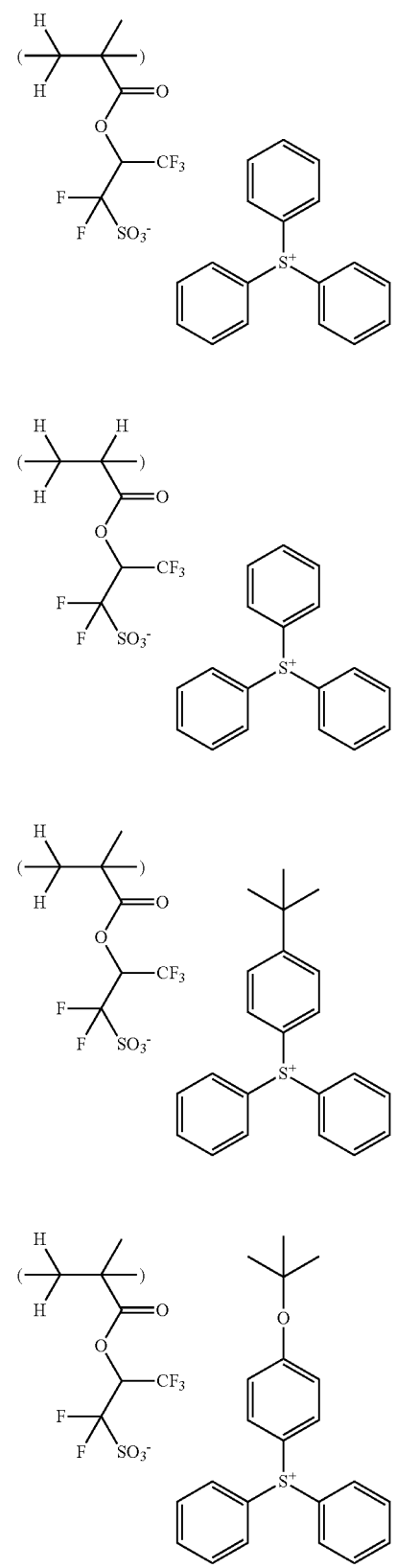
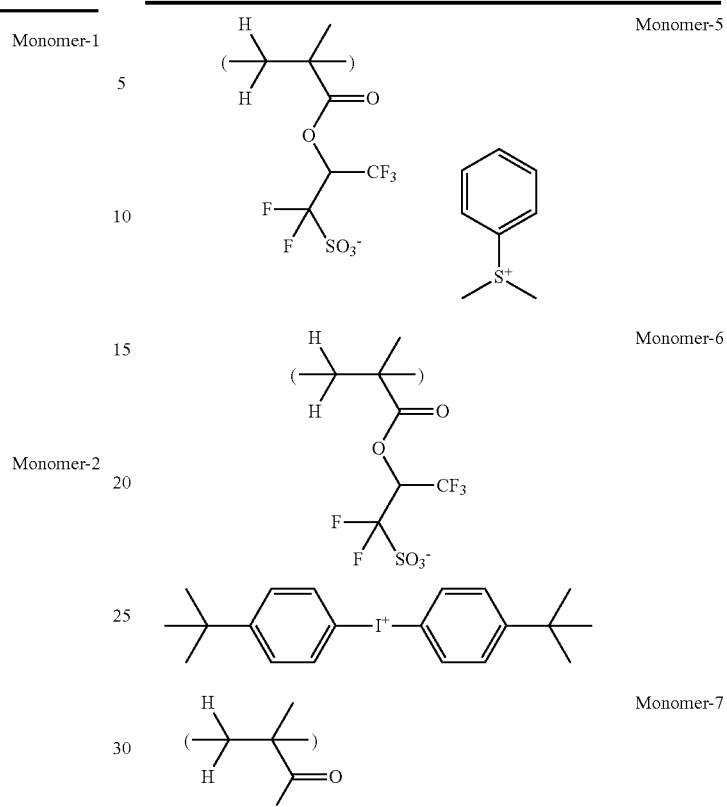
TABLE 3
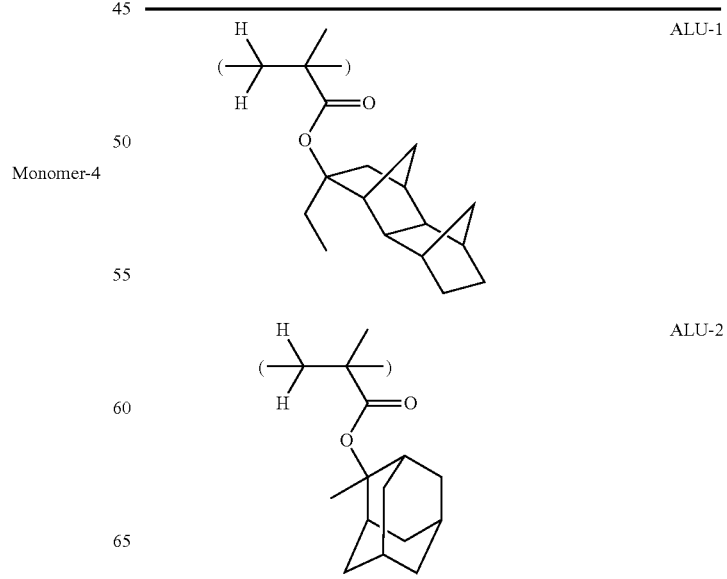

TABLE 3-continued
| | |
|---|---|
| 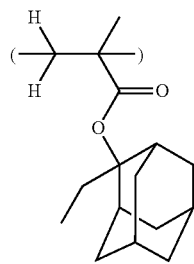 | ALU-3 |
| 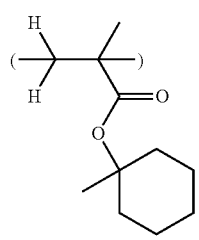 | ALU-4 |
| 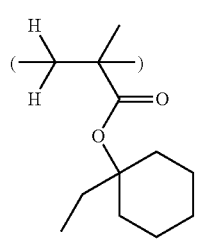 | ALU-5 |
| 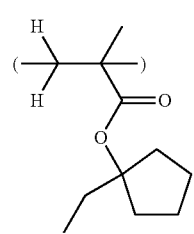 | ALU-6 |
| 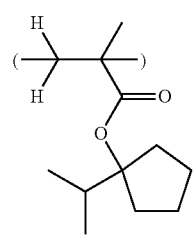 | ALU-7 |
| 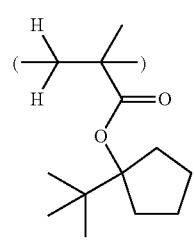 | ALU-8 |
TABLE 3-continued
| | |
|---|---|
| 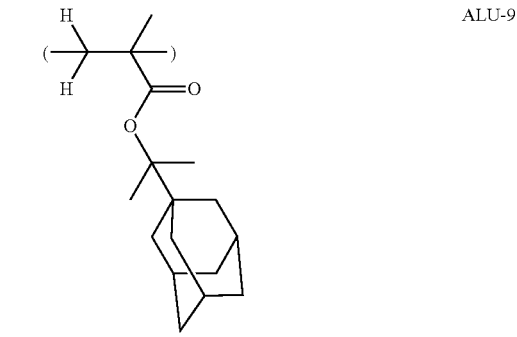 | ALU-9 |
| 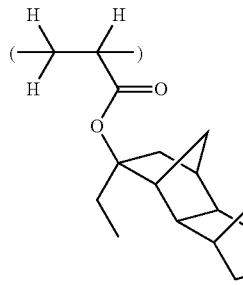 | ALU-10 |
| 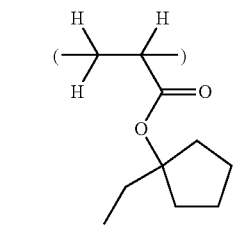 | ALU-11 |
TABLE 4
| | |
|---|---|
| 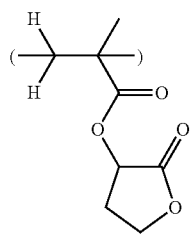 | Unit-1 |
| 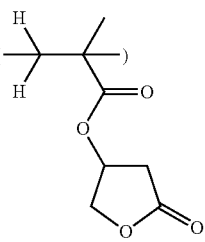 | Unit-2 |

TABLE 4-continued
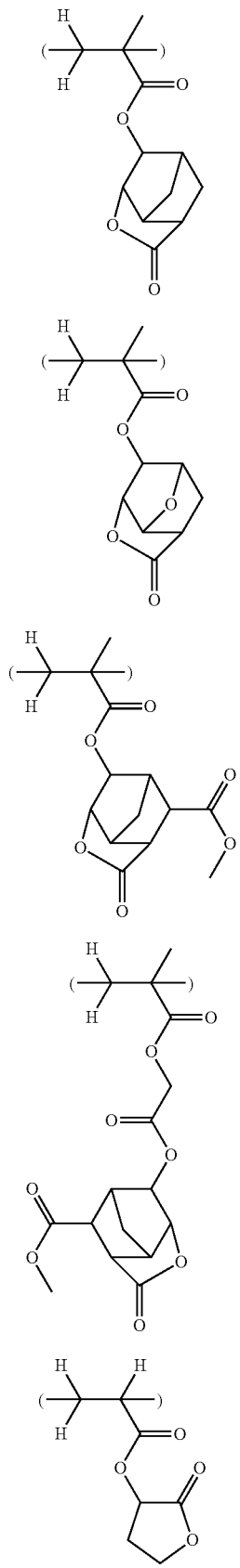
Unit-3
Unit-4
Unit-5
Unit-6
Unit-7
TABLE 5
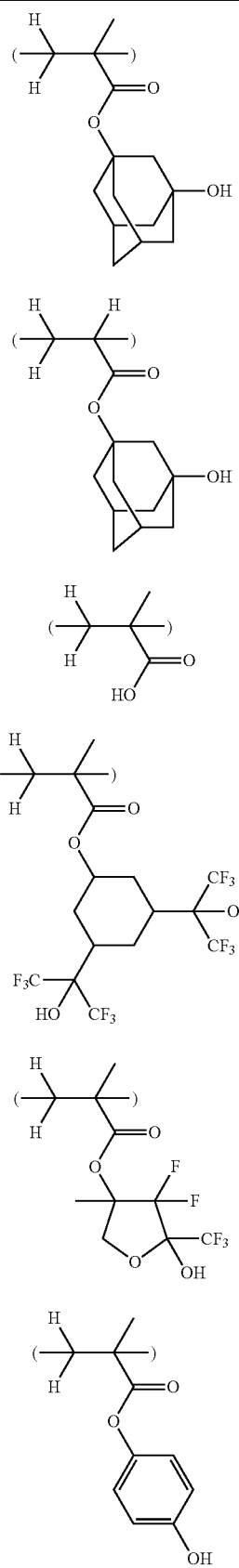
Unit-8
Unit-9
Unit-10
Unit-11
Unit-12
Unit-13

Examples 1-1 to 1-52 & Comparative Examples 1-1 to 1-11

[Preparation of Resist Material]

Resist compositions PR-1 to 52 (Examples 1-1 to 1-52) as formulated in Tables 6 and 7 were prepared by dissolving the polymer, photoacid generator and quencher in a solvent, and filtering through a Teflon® filter having a pore size of 0.2 μm. Comparative Resist compositions PR-53 to 63 (Comparative Examples 1-1 to 1-11) as formulated in Table 8 were similarly prepared. The PAGs in Tables 6 to 8 have the structures shown in Tables 9 and 10, and the nitrogen-containing organic compounds as quencher have the structures shown in Table 11. Of the photoacid generators in Table 9, PAG-B1 to B10 fall in the scope of sulfonium salt (B) essentially present in the inventive resist composition. Of the quenchers in Table 11, Q-C1 to C4 fall in the scope of nitrogen-containing organic compound (C) preferably present in the inventive resist composition.

TABLE 6

| Resist | Polymer (pbw) | PAG (pbw) | Quencher (pbw) | Solvent (pbw) |
|---|---|---|---|---|
| PR-1 | Polymer-1 (100) | PAG-B1 (9.7) | Q-C4 (2.8) | PGMEA(2,700) GBL(300) |
| PR-2 | Polymer-2 (100) | PAG-B1 (9.7) | Q-C1 (1.7) | PGMEA(2,700) GBL(300) |
| PR-3 | Polymer-2 (100) | PAG-B1 (9.7) | Q-C2 (2.1) | PGMEA(2,700) GBL(300) |
| PR-4 | Polymer-2 (100) | PAG-B1 (9.7) | Q-C3 (2.2) | PGMEA(2,700) GBL(300) |
| PR-5 | Polymer-2 (100) | PAG-B1 (9.7) | Q-C4 (2.8) | PGMEA(2,700) GBL(300) |
| PR-6 | Polymer-2 (100) | PAG-B2 (10.6) | Q-C4 (2.8) | PGMEA(2,700) GBL(300) |
| PR-7 | Polymer-2 (100) | PAG-B3 (11.2) | Q-C4 (2.8) | PGMEA(2,700) GBL(300) |
| PR-8 | Polymer-2 (100) | PAG-B4 (11.9) | Q-C4 (2.8) | PGMEA(2,700) GBL(300) |
| PR-9 | Polymer-2 (100) | PAG-B5 (8.6) | Q-C4 (2.8) | PGMEA(2,700) GBL(300) |
| PR-10 | Polymer-2 (100) | PAG-B6 (9.3) | Q-C4 (2.8) | PGMEA(2,700) GBL(300) |
| PR-11 | Polymer-2 (100) | PAG-B7 (9.9) | Q-C4 (2.8) | PGMEA(2,700) GBL(300) |
| PR-12 | Polymer-2 (100) | PAG-B8 (10.8) | Q-C4 (2.8) | PGMEA(2,700) GBL(300) |
| PR-13 | Polymer-2 (100) | PAG-B9 (14.0) | Q-C4 (2.8) | PGMEA(2,700) GBL(300) |
| PR-14 | Polymer-2 (100) | PAG-B10 (14.3) | Q-C4 (2.8) | PGMEA(2,700) GBL(300) |
| PR-15 | Polymer-2 (100) | PAG-B2 (5.3) PAG-B9 (7.0) | Q-C4 (2.8) | PGMEA(2,700) GBL(300) |
| PR-16 | Polymer-2 (100) | PAG-B2 (5.3) PAG-R3 (5.1) | Q-C4 (2.8) | PGMEA(2,700) GBL(300) |
| PR-17 | Polymer-3 (100) | PAG-B1 (9.7) | Q-C4 (2.8) | PGMEA(2,700) GBL(300) |
| PR-18 | Polymer-4 (100) | PAG-B1 (9.7) | Q-C4 (2.8) | PGMEA(2,700) GBL(300) |
| PR-19 | Polymer-5 (100) | PAG-B1 (9.7) | Q-C4 (2.8) | PGMEA(2,700) GBL(300) |
| PR-20 | Polymer-6 (100) | PAG-B1 (9.7) | Q-C4 (2.8) | PGMEA(2,700) GBL(300) |
| PR-21 | Polymer-7 (100) | PAG-B1 (9.7) | Q-C4 (2.8) | PGMEA(2,700) GBL(300) |
| PR-22 | Polymer-8 (100) | PAG-B1 (9.7) | Q-C4 (2.8) | PGMEA(2,700) GBL(300) |
| PR-23 | Polymer-9 (100) | PAG-B1 (9.7) | Q-C4 (2.8) | PGMEA(2,700) GBL(300) |
| PR-24 | Polymer-10 (100) | PAG-B1 (9.7) | Q-C4 (2.8) | PGMEA(2,700) GBL(300) |
| PR-25 | Polymer-11 (100) | PAG-B1 (9.7) | Q-C4 (2.8) | PGMEA(2,700) GBL(300) |
| PR-26 | Polymer-12 (100) | PAG-B1 (9.7) | Q-C4 (2.8) | PGMEA(2,700) GBL(300) |

TABLE 7

| Resist | Polymer (pbw) | PAG (pbw) | Quencher (pbw) | Solvent (pbw) |
|---|---|---|---|---|
| PR-27 | Polymer-13 (100) | PAG-B1 (9.7) | Q-C4 (2.8) | PGMEA(2,700) GBL(300) |
| PR-28 | Polymer-14 (100) | PAG-B1 (9.7) | Q-C4 (2.8) | PGMEA(2,700) GBL(300) |
| PR-29 | Polymer-15 (100) | PAG-B1 (9.7) | Q-C4 (2.8) | PGMEA(2,700) GBL(300) |
| PR-30 | Polymer-16 (100) | PAG-B1 (9.7) | Q-C4 (2.8) | PGMEA(2,700) GBL(300) |
| PR-31 | Polymer-17 (100) | PAG-B1 (9.7) | Q-C4 (2.8) | PGMEA(2,700) GBL(300) |
| PR-32 | Polymer-18 (100) | PAG-B1 (9.7) | Q-C4 (2.8) | PGMEA(2,700) GBL(300) |
| PR-33 | Polymer-19 (100) | PAG-B1 (9.7) | Q-C4 (2.8) | PGMEA(2,700) GBL(300) |
| PR-34 | Polymer-20 (100) | PAG-B1 (9.7) | Q-C4 (2.8) | PGMEA(2,700) GBL(300) |
| PR-35 | Polymer-21 (100) | PAG-B1 (9.7) | Q-C4 (2.8) | PGMEA(2,700) GBL(300) |
| PR-36 | Polymer-22 (100) | PAG-B1 (9.7) | Q-C4 (2.8) | PGMEA(2,700) GBL(300) |
| PR-37 | Polymer-23 (100) | PAG-B1 (9.7) | Q-C4 (2.8) | PGMEA(2,700) GBL(300) |
| PR-38 | Polymer-24 (100) | PAG-B1 (9.7) | Q-C4 (2.8) | PGMEA(2,700) GBL(300) |
| PR-39 | Polymer-25 (100) | PAG-B1 (9.7) | Q-C4 (2.8) | PGMEA(2,700) GBL(300) |
| PR-40 | Polymer-26 (100) | PAG-B1 (9.7) | Q-C4 (2.8) | PGMEA(2,700) GBL(300) |
| PR-41 | Polymer-27 (100) | PAG-B1 (9.7) | Q-C4 (2.8) | PGMEA(2,700) GBL(300) |
| PR-42 | Polymer-28 (100) | PAG-B1 (9.7) | Q-C4 (2.8) | PGMEA(2,700) GBL(300) |
| PR-43 | Polymer-29 (100) | PAG-B1 (9.7) | Q-C4 (2.8) | PGMEA(2,700) GBL(300) |
| PR-44 | Polymer-30 (100) | PAG-B1 (9.7) | Q-C4 (2.8) | PGMEA(2,700) GBL(300) |
| PR-45 | Polymer-31 (100) | PAG-B1 (9.7) | Q-C4 (2.8) | PGMEA(2,700) GBL(300) |
| PR-46 | Polymer-32 (100) | PAG-B1 (9.7) | Q-C4 (2.8) | PGMEA(2,700) GBL(300) |
| PR-47 | Polymer-33 (100) | PAG-B1 (9.7) | Q-C4 (2.8) | PGMEA(2,700) GBL(300) |
| PR-48 | Polymer-34 (100) | PAG-B1 (9.7) | Q-C4 (2.8) | PGMEA(2,700) GBL(300) |
| PR-49 | Polymer-2 (100) | PAG-B1 (9.7) | Q-R1 (2.4) | PGMEA(2,700) GBL(300) |
| PR-50 | Polymer-2 (100) | PAG-B1 (9.7) | Q-R2 (1.3) | PGMEA(2,700) GBL(300) |
| PR-51 | Polymer-2 (100) | PAG-B1 (9.7) | Q-R3 (1.6) | PGMEA(2,700) GBL(300) |
| PR-52 | Polymer-2 (100) | PAG-B1 (9.7) | Q-R4 (2.5) | PGMEA(2,700) GBL(300) |

TABLE 8

| Resist | Polymer (pbw) | PAG (pbw) | Quencher (pbw) | Solvent (pbw) |
|---|---|---|---|---|
| PR-53 | Polymer-35 (100) | PAG-B1 (9.7) | Q-C4 (2.8) | PGMEA(2,700) GBL(300) |
| PR-54 | Polymer-36 (100) | PAG-B1 (9.7) | Q-C4 (2.8) | PGMEA(2,700) GBL(300) |

TABLE 8-continued

| Resist | Polymer (pbw) | PAG (pbw) | Quencher (pbw) | Solvent (pbw) |
|---|---|---|---|---|
| PR-55 | Polymer-2 (100) | PAG-R1 (8.2) | Q-C4 (2.8) | PGMEA(2,700) GBL(300) |
| PR-56 | Polymer-2 (100) | PAG-R2 (8.4) | Q-C4 (2.8) | PGMEA(2,700) GBL(300) |
| PR-57 | Polymer-2 (100) | PAG-R3 (10.1) | Q-C4 (2.8) | PGMEA(2,700) GBL(300) |
| PR-58 | Polymer-2 (100) | PAG-R4 (9.1) | Q-C4 (2.8) | PGMEA(2,700) GBL(300) |
| PR-59 | Polymer-2 (100) | PAG-R5 (9.2) | Q-C4 (2.8) | PGMEA(2,700) GBL(300) |
| PR-60 | Polymer-2 (100) | PAG-R6 (10.5) | Q-C4 (2.8) | PGMEA(2,700) GBL(300) |
| PR-61 | Polymer-35 (100) | PAG-B1 (9.7) | Q-R3 (1.6) | PGMEA(2,700) GBL(300) |
| PR-62 | Polymer-35 (100) | PAG-B1 (9.7) | Q-R4 (2.5) | PGMEA(2,700) GBL(300) |
| PR-63 | Polymer-2 (100) | PAG-R3 (10.1) | Q-R4 (2.5) | PGMEA(2,700) GBL(300) |

TABLE 9

PAG-B1

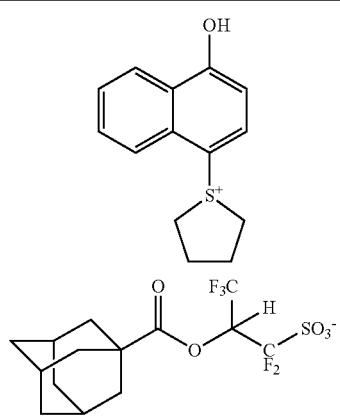

PAG-B2

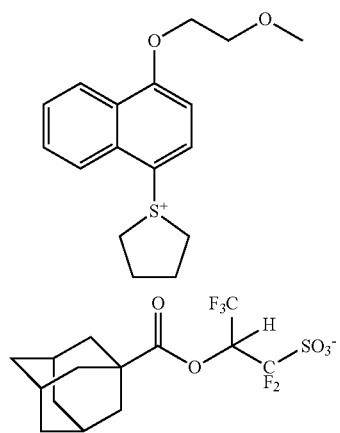

TABLE 9-continued

PAG-B3

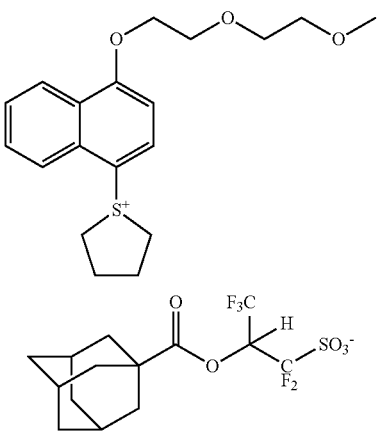

PAG-B4

PAG-B5

TABLE 9-continued
PAG-B6
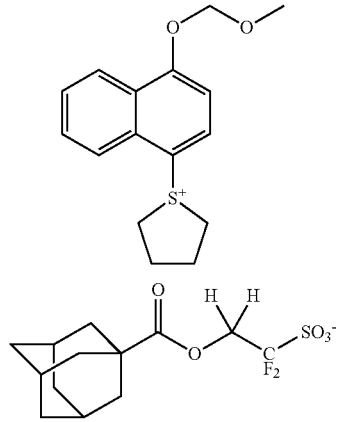
PAG-B7
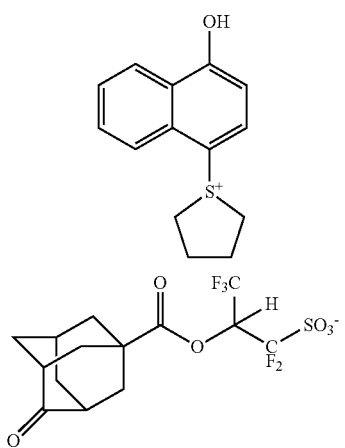
PAG-B8
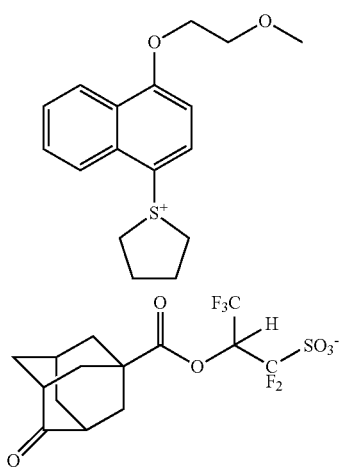
TABLE 9-continued
PAG-B9
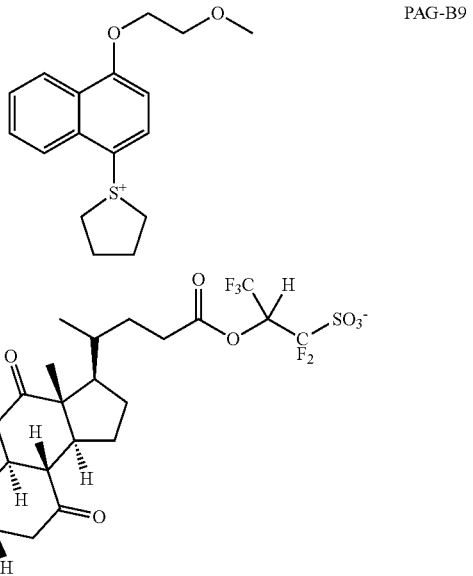
PAG-B10
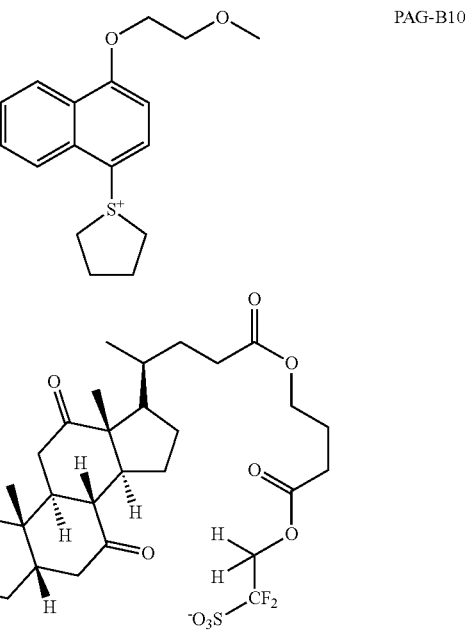
TABLE 10
PAG-R1
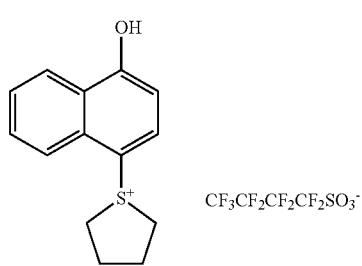

TABLE 10-continued
PAG-R2
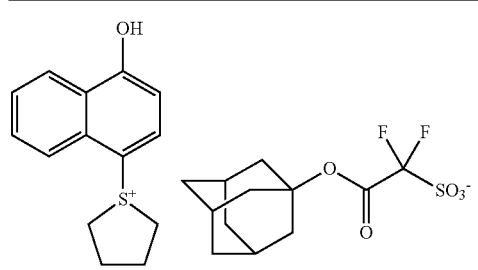
PAG-R3
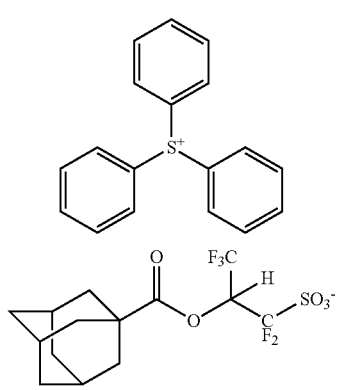
PAG-R4
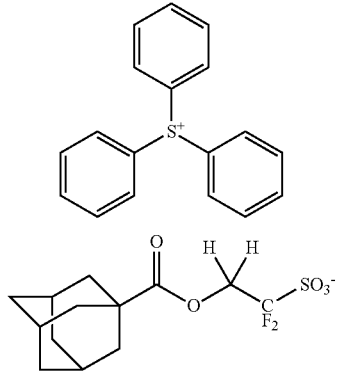
PAG-R5
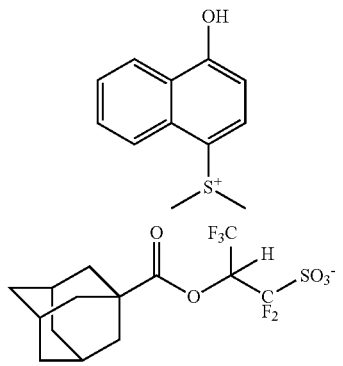
TABLE 10-continued
PAG-R6
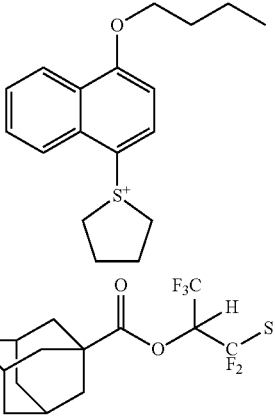
TABLE 11
Q-C1
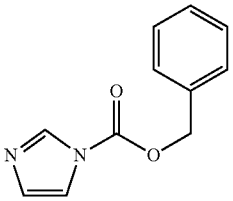 [SMILES: O=C(OCc1ccccc1)n1ccnc1]
Q-C2
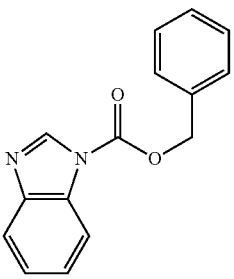 [SMILES: O=C(OCc1ccccc1)n1cnc2ccccc21]
Q-C3
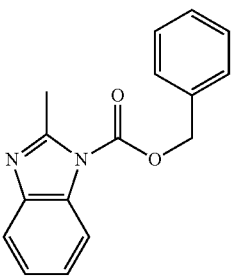 [SMILES: Cc1nc2ccccc2n1C(=O)OCc1ccccc1]
Q-C4
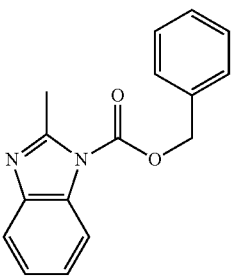 [SMILES: Cc1nc2ccccc2n1C(=O)OCc1ccccc1]

TABLE 11-continued

| | |
|---|---|
| 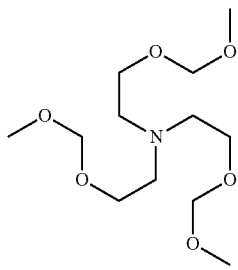 | Q-R1 |
| 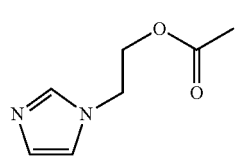 | Q-R2 |
| 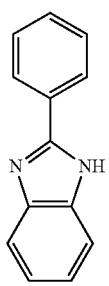 [SMILES: c1ccc(-c2nc3ccccc3[nH]2)cc1] | Q-R3 |
| 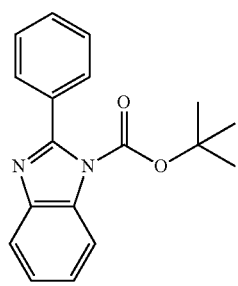 [SMILES: CC(C)(C)OC(=O)n1c(-c2ccccc2)nc2ccccc21] | Q-R4 |

It is noted that the solvents in Tables 6 to 8 are identified below.

PGMEA: propylene glycol monomethyl ether acetate

GBL: γ-butyrolactone

All the resist compositions in Tables 6 to 8 contained 5.0 parts by weight of an alkali-soluble surfactant SF-1 and 0.1 part by weight of a surfactant A, which are identified below.

Alkali-Soluble Surfactant SF-1:

poly(3,3,3-trifluoro-2-hydroxy-1,1-dimethyl-2-trifluoromethylpropyl methacrylate/1,1,1-trifluoro-2-hydroxy-6-methyl-2-trifluoro-methylhept-4-yl methacrylate) (Described in JP-A 2008-122932)

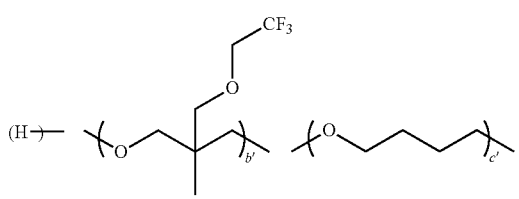

SF-1
$a = 0.5, b = 0.5,$
Mw = 7,300

Surfactant A: 3-methyl-3-(2,2,2-trifluoroethoxymethyl)oxetane/tetrahydrofuran/2,2-dimethyl-1,3-propane diol (Omnova Solutions, Inc.)

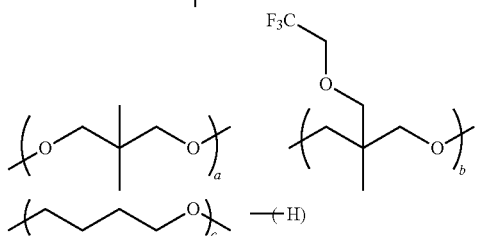

$a:(b + b'):(c + c') = 1:4-7:0.01-1$ (molar ratio)
Mw = 1,500

Examples 2-1 to 2-52 & Comparative Examples 2-1 to 2-11

An antireflective coating solution (ARC-29A by Nissan Chemical Industries Co., Ltd.) was coated onto a silicon substrate and baked at 200° C. for 60 seconds to form an ARC film of 100 nm thick. The resist solution was spin coated onto the ARC film and baked on a hot plate at 100° C. for 60 seconds to form a resist film of 90 nm thick. The resist film was exposed according to the ArF immersion lithography using an ArF excimer laser scanner NSR-S610C (Nikon Corp., NA 1.30, quadrupole illumination, 6% halftone phase shift mask). The resist film was baked (PEB) at an arbitrary temperature for 60 seconds and developed with a 2.38 wt % aqueous solution of tetramethylammonium hydroxide for 60 seconds.

The resist was evaluated by observing a 60-nm trench (space)/160-nm pitch pattern under an electron microscope. The optimum dose (Eop) was a dose (mJ/cm$^2$) which provided a trench width of 60 nm. The profile of a pattern at the optimum dose was compared and judged passed or rejected according to the following criterion.

Good: pattern with perpendicular sidewall, satisfactory profile

Substantially insoluble surface layer:

surface layer of trench pattern is rather clogged, unsatisfactory profile

Tapered: a strong tendency that trench width becomes narrower toward the substrate, unsatisfactory profile The roughness (nm) of trench edge at the optimum dose was numerated for ease of comparison by determining a variation of trench width (measuring at 30 points and computing a 3σ value).

A DOF (nm) was obtained by examining the focus dependency of trench width at the optimum dose and determining a focus range in which trenches were resolved.

The shelf stability of a resist solution was evaluated by comparing the initial optimum dose (Eop) of a resist solution as prepared with the optimum dose (Eop) of a resist solution aged at 30° C. for one month. A change of sensitivity was calculated according to the following equation.

Sensitivity change (%)=[(*Eop* after 1 month)−(initial *Eop*)]/(initial *Eop*)×100

A negative value indicates that the resist has increased its sensitivity during aging. A smaller absolute value indicates a least change with time of components in the resist and hence better shelf stability.

The PEB temperature and evaluation results of the resist compositions in Tables 6 and 7 are tabulated in Tables 12 and 13. The PEB temperature and evaluation results of the comparative resist compositions in Table 8 are tabulated in Table 14.

TABLE 12

| | Resist | PEB (° C.) | Eop (mJ/cm²) | Profile | Roughness (nm) | DOF (nm) | Sensitivity change (%) |
|---|---|---|---|---|---|---|---|
| Example 2-1 | PR-1 | 100 | 18 | good | 4.5 | 80 | 0 |
| Example 2-2 | PR-2 | 95 | 31 | good | 4.2 | 85 | 0 |
| Example 2-3 | PR-3 | 95 | 21 | good | 4.2 | 85 | 0 |
| Example 2-4 | PR-4 | 95 | 29 | good | 4.3 | 90 | 0 |
| Example 2-5 | PR-5 | 95 | 30 | good | 4.1 | 80 | 0 |
| Example 2-6 | PR-6 | 95 | 26 | good | 4.4 | 80 | 0 |
| Example 2-7 | PR-7 | 95 | 26 | good | 4.7 | 80 | 0 |
| Example 2-8 | PR-8 | 95 | 25 | good | 4.9 | 85 | 0 |
| Example 2-9 | PR-9 | 95 | 33 | good | 4.5 | 80 | 0 |
| Example 2-10 | PR-10 | 95 | 28 | good | 4.4 | 80 | 0 |
| Example 2-11 | PR-11 | 95 | 32 | good | 4.3 | 80 | 0 |
| Example 2-12 | PR-12 | 95 | 29 | good | 4.8 | 85 | 0 |
| Example 2-13 | PR-13 | 95 | 38 | good | 4.4 | 80 | 0 |
| Example 2-14 | PR-14 | 95 | 35 | good | 5.2 | 90 | 0 |
| Example 2-15 | PR-15 | 95 | 33 | good | 5.0 | 90 | 0 |
| Example 2-16 | PR-16 | 95 | 28 | good | 4.9 | 80 | 0 |
| Example 2-17 | PR-17 | 95 | 42 | good | 4.6 | 80 | 0 |
| Example 2-18 | PR-18 | 95 | 30 | good | 4.0 | 85 | 0 |
| Example 2-19 | PR-19 | 95 | 33 | good | 4.5 | 80 | 0 |
| Example 2-20 | PR-20 | 95 | 37 | good | 4.8 | 80 | 0 |
| Example 2-21 | PR-21 | 95 | 48 | good | 5.1 | 75 | 0 |
| Example 2-22 | PR-22 | 95 | 45 | good | 5.6 | 75 | 0 |
| Example 2-23 | PR-23 | 110 | 29 | good | 4.2 | 95 | 0 |
| Example 2-24 | PR-24 | 110 | 29 | good | 4.2 | 95 | 0 |
| Example 2-25 | PR-25 | 105 | 30 | good | 4.6 | 80 | 0 |
| Example 2-26 | PR-26 | 105 | 33 | good | 4.0 | 100 | 0 |

TABLE 13

| | Resist | PEB (° C.) | Eop (mJ/cm²) | Profile | Roughness (nm) | DOF (nm) | Sensitivity change (%) |
|---|---|---|---|---|---|---|---|
| Example 2-27 | PR-27 | 100 | 32 | good | 4.2 | 95 | 0 |
| Example 2-28 | PR-28 | 100 | 30 | good | 4.1 | 100 | 0 |
| Example 2-29 | PR-29 | 95 | 29 | good | 4.0 | 105 | 0 |
| Example 2-30 | PR-30 | 90 | 27 | good | 4.6 | 85 | 0 |
| Example 2-31 | PR-31 | 95 | 28 | good | 3.8 | 95 | 0 |
| Example 2-32 | PR-32 | 95 | 30 | good | 4.2 | 90 | 0 |
| Example 2-33 | PR-33 | 85 | 31 | good | 4.3 | 95 | 0 |
| Example 2-34 | PR-34 | 80 | 31 | good | 4.4 | 90 | 0 |
| Example 2-35 | PR-35 | 80 | 27 | good | 4.6 | 85 | 0 |
| Example 2-36 | PR-36 | 90 | 25 | good | 4.5 | 80 | 0 |
| Example 2-37 | PR-37 | 95 | 29 | good | 4.2 | 100 | 0 |
| Example 2-38 | PR-38 | 95 | 30 | good | 4.3 | 105 | 0 |
| Example 2-39 | PR-39 | 105 | 34 | good | 4.0 | 95 | 0 |
| Example 2-40 | PR-40 | 90 | 29 | good | 4.7 | 85 | 0 |
| Example 2-41 | PR-41 | 95 | 29 | good | 4.9 | 80 | 0 |
| Example 2-42 | PR-42 | 95 | 35 | good | 4.2 | 80 | 0 |
| Example 2-43 | PR-43 | 95 | 36 | good | 4.3 | 85 | 0 |
| Example 2-44 | PR-44 | 95 | 36 | good | 4.3 | 75 | 0 |
| Example 2-45 | PR-45 | 105 | 29 | good | 4.7 | 105 | 0 |
| Example 2-46 | PR-46 | 100 | 28 | good | 4.3 | 90 | 0 |
| Example 2-47 | PR-47 | 75 | 33 | good | 4.8 | 85 | 0 |
| Example 2-48 | PR-48 | 70 | 31 | good | 4.4 | 80 | 0 |

TABLE 13-continued

|  | Resist | PEB (° C.) | Eop (mJ/cm²) | Profile | Roughness (nm) | DOF (nm) | Sensitivity change (%) |
|---|---|---|---|---|---|---|---|
| Example 2-49 | PR-49 | 100 | 32 | good | 4.5 | 75 | −3.4 |
| Example 2-50 | PR-50 | 100 | 28 | good | 5.2 | 75 | −2.1 |
| Example 2-51 | PR-51 | 100 | 30 | good | 5.1 | 75 | −1.6 |
| Example 2-52 | PR-52 | 100 | 30 | good | 5.0 | 70 | 0 |

TABLE 14

|  | Resist | PEB (° C.) | Eop (mJ/cm²) | Profile | Roughness (nm) | DOF (nm) | Sensitivity change (%) |
|---|---|---|---|---|---|---|---|
| Comparative Example 2-1 | PR-53 | 100 | 29 | substantially insoluble surface layer | 8.2 | 10 | 0 |
| Comparative Example 2-2 | PR-54 | 95 | 28 | substantially insoluble surface layer | 7.5 | 20 | 0 |
| Comparative Example 2-3 | PR-55 | 100 | 26 | tapered | 6.6 | 30 | 0 |
| Comparative Example 2-4 | PR-56 | 100 | 22 | tapered | 6.5 | 25 | 0 |
| Comparative Example 2-5 | PR-57 | 100 | 23 | tapered | 6.8 | 15 | 0 |
| Comparative Example 2-6 | PR-58 | 100 | 24 | tapered | 6.5 | 20 | 0 |
| Comparative Example 2-7 | PR-59 | 100 | 50 | tapered | 6.4 | 25 | 0 |
| Comparative Example 2-8 | PR-60 | 100 | 44 | substantially insoluble surface layer | 7.9 | 10 | 0 |
| Comparative Example 2-9 | PR-61 | 100 | 42 | substantially insoluble surface layer | 8.1 | 10 | −1.8 |
| Comparative Example 2-10 | PR-62 | 100 | 43 | substantially insoluble surface layer | 7.0 | 15 | 0 |
| Comparative Example 2-11 | PR-63 | 100 | 31 | tapered | 6.0 | 30 | 0 |

As seen from the data in Tables 12 to 14, resist compositions comprising both polymer (A) and sulfonium salt (B) within the scope of the invention form trench patterns which are improved in profile, roughness and DOF. As also seen from the data in Tables 12 to 14, when not both polymer (A) and sulfonium salt (B) within the scope of the invention are used, i.e., either polymer (A) or sulfonium salt (B) is used, no improvements in performance are observable.

A comparison of Examples 2-2 to 2-5 in Table 12 with Examples 2-49 to 2-52 in Table 13 reveals that when a specific nitrogen-containing organic compound (C) is blended in addition to polymer (A) and sulfonium salt (B) according to the preferred embodiment of the invention, better results are obtainable with respect to the roughness and DOF of trench patterns and the shelf stability of resist solutions.

While the invention has been illustrated and described in typical embodiments, it is not intended to be limited to the details shown. Any modified embodiments having substantially the same features and achieving substantially the same results as the technical idea disclosed herein are within the spirit and scope of the invention. For example, although the resist composition is described mainly as being processed by the immersion lithography, the resist composition is equally effective when processed by conventional lithography other than the immersion lithography.

Japanese Patent Application No. 2010-262389 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A positive resist composition comprising
(A) a polymer comprising recurring units of a structure adapted to generate an acid in response to high-energy radiation selected from UV, deep UV, electron beam, x-ray, excimer laser, γ-ray and synchrotron radiation, having the general formula (1-1) or (1-2) and acid labile units, the polymer having an alkali solubility that increases under the action of an acid, and
(B) a sulfonium salt having the general formula (2-1) or (2-2),

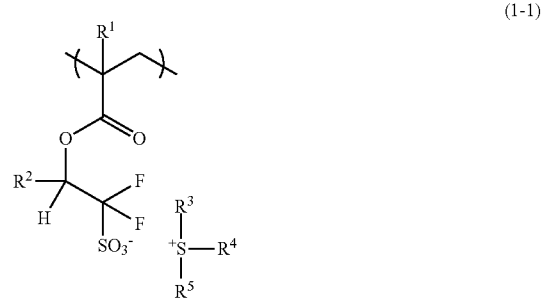

-continued

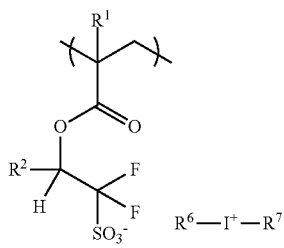

(1-2)

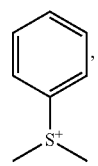

wherein $R^1$ is hydrogen or methyl, $R^2$ is hydrogen or trifluoromethyl, $R^3$, $R^4$, and $R^5$ are each independently a substituted or unsubstituted, straight, branched or cyclic $C_1$-$C_{10}$ alkyl, alkenyl or oxoalkyl group, or substituted or unsubstituted $C_6$-$C_{18}$ aryl, aralkyl or aryloxoalkyl group, any two of $R^3$, $R^4$, and $R^5$ may bond together to form a ring with the sulfur atom, $R^6$ and $R^7$ are each independently a substituted or unsubstituted $C_6$-$C_{18}$ aryl group,

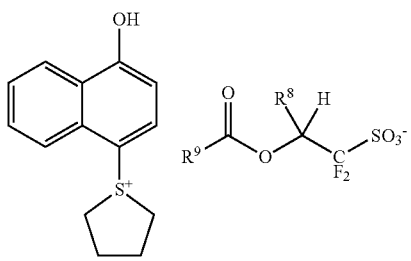

(2-1)

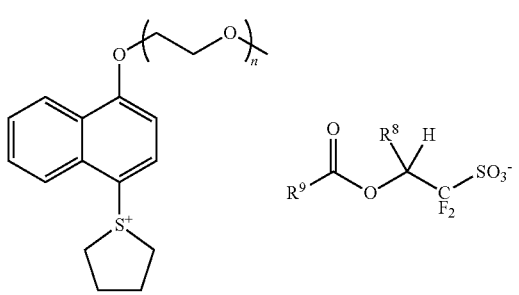

(2-2)

wherein $R^8$ is hydrogen or trifluoromethyl, $R^9$ is a straight, branched or cyclic, monovalent hydrocarbon group of 4 to 30 carbon atoms which may contain a heteroatom, and n is an integer of 1 to 4.

2. The resist composition of claim 1 wherein the polymer further comprises recurring units of a lactone ring-containing structure.

3. The resist composition of claim 1, further comprising
(C) a nitrogen-containing organic compound having the general formula (3):

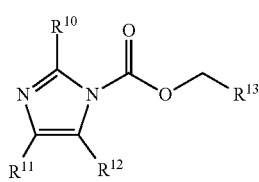

(3)

wherein $R^{10}$ is hydrogen, a straight, branched or cyclic $C_1$-$C_{15}$ alkyl group, or $C_6$-$C_{15}$ aryl group, $R^{11}$ and $R^{12}$ are each independently hydrogen, a straight, branched or cyclic $C_1$-$C_{10}$ alkyl group, or $C_6$-$C_{15}$ aryl group, or $R^{11}$ and $R^{12}$ may bond together to form a $C_6$-$C_{14}$ aromatic ring, and $R^{13}$ is a $C_6$-$C_{15}$ aryl group.

4. The resist composition of claim 1, wherein the recurring units having the general formula (1-1) or (1-2) are selected from the following recurring units:

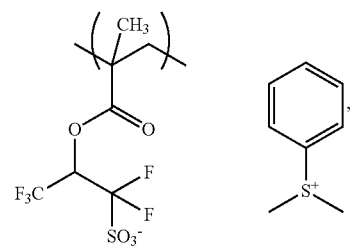

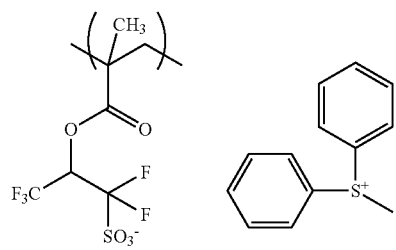

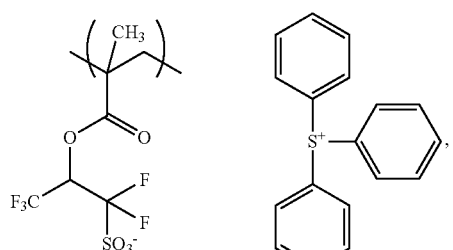

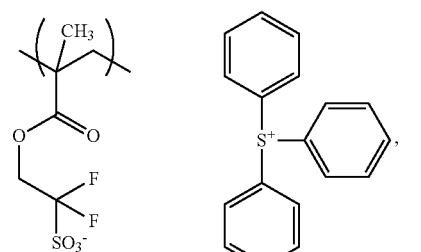

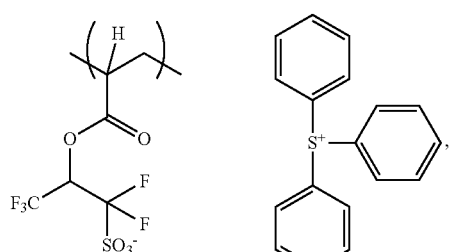

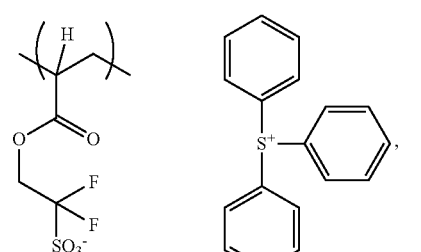

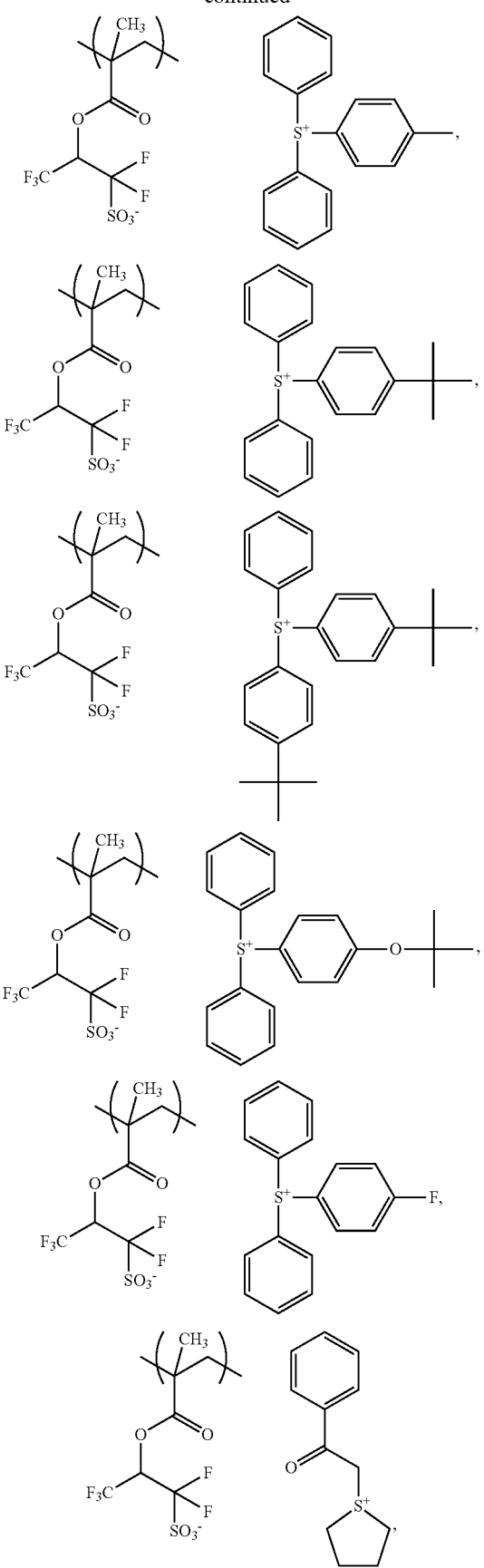
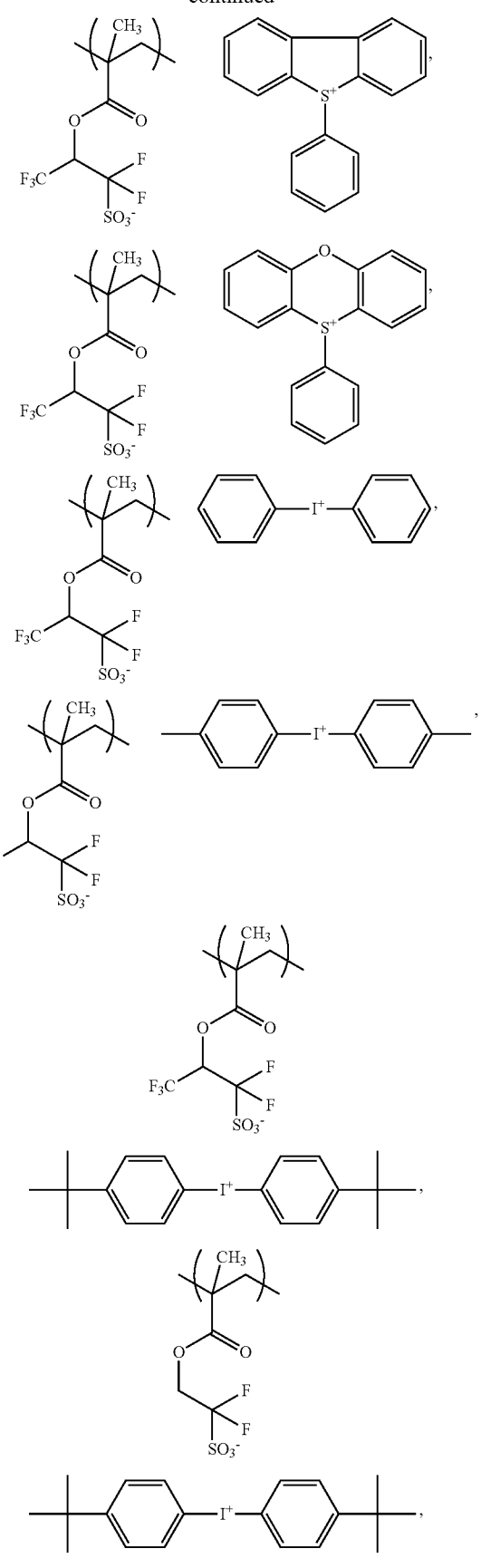

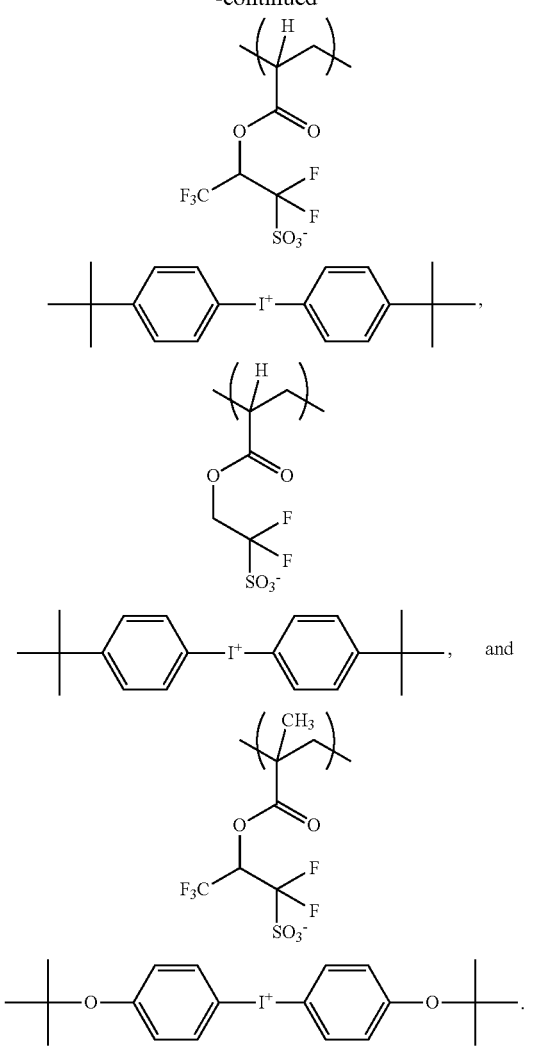
5. The resist composition of claim 1, wherein the sulfonium salt having formulae (2-1) or (2-2) is selected from the group consisting of the following sulfonium salts:
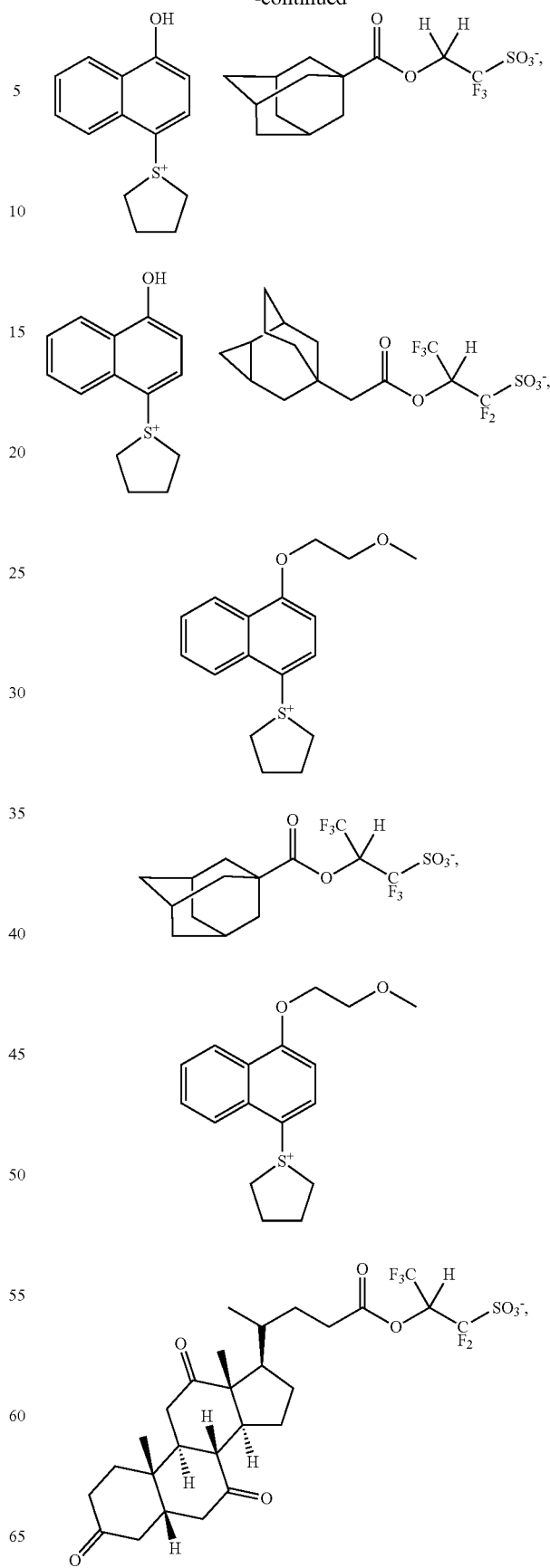

103
-continued
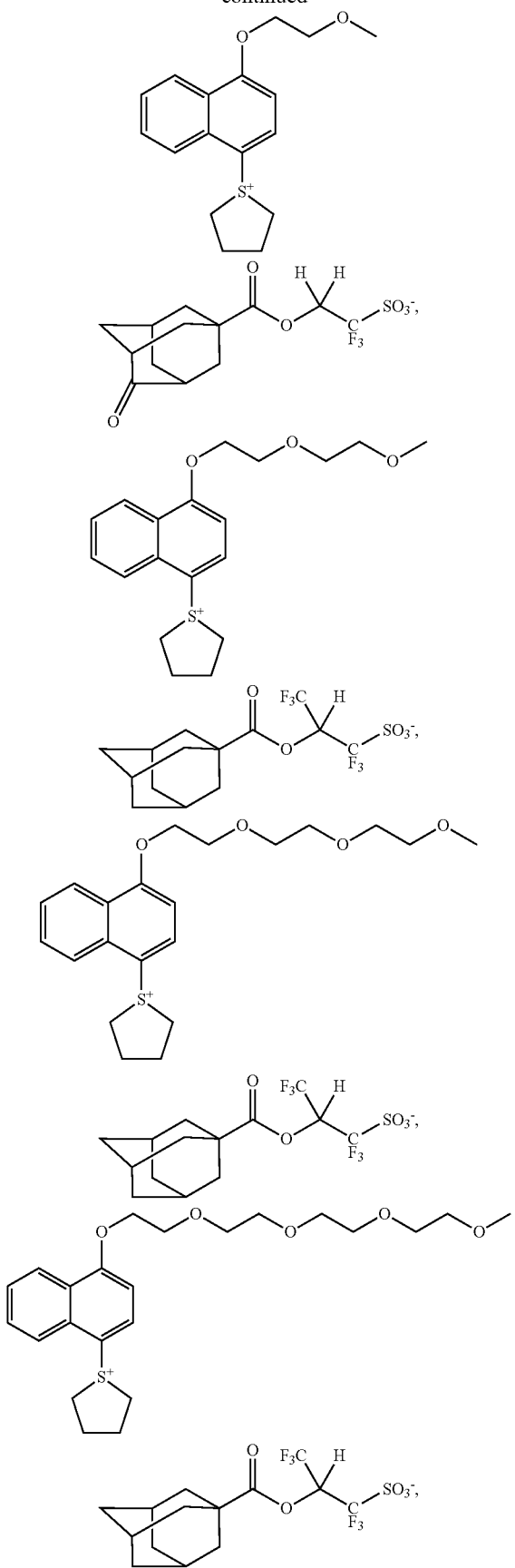
104
-continued
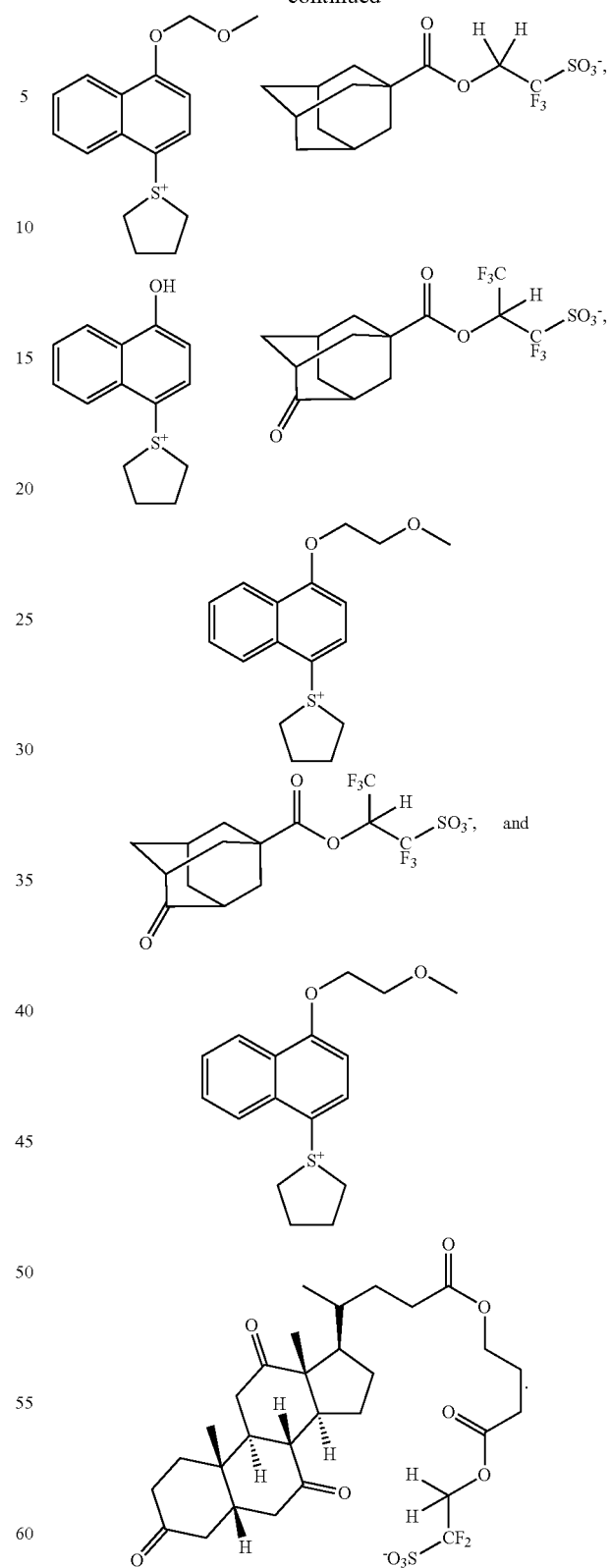
6. The resist composition of claim 3, wherein the nitrogen-containing organic compound having the general formula (3) is selected from the group consisting of the following compounds:

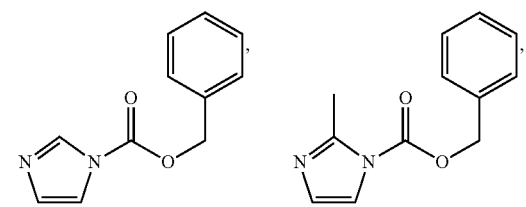
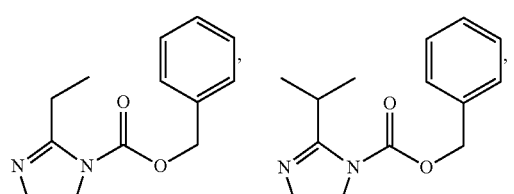
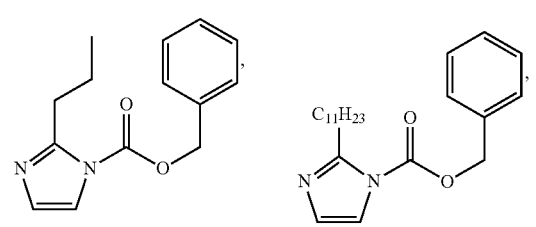
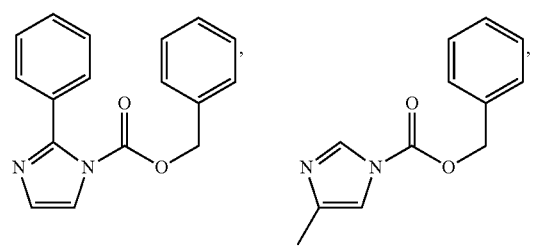
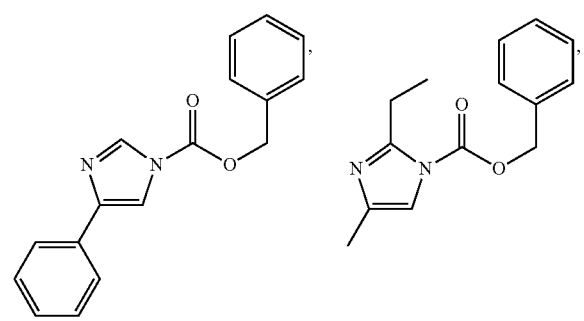
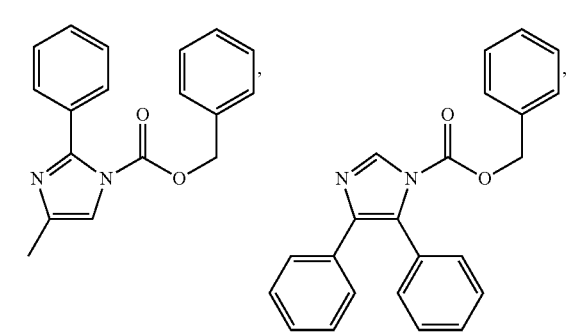
-continued
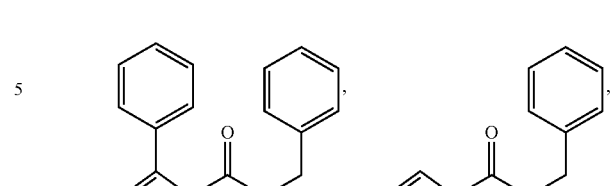
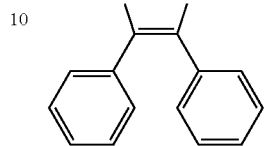
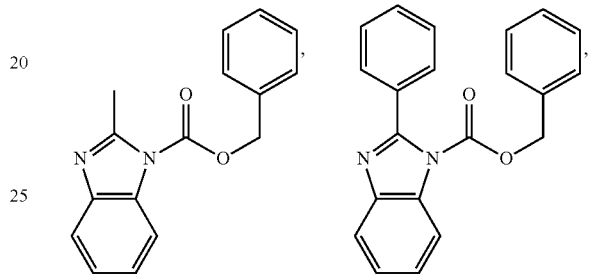
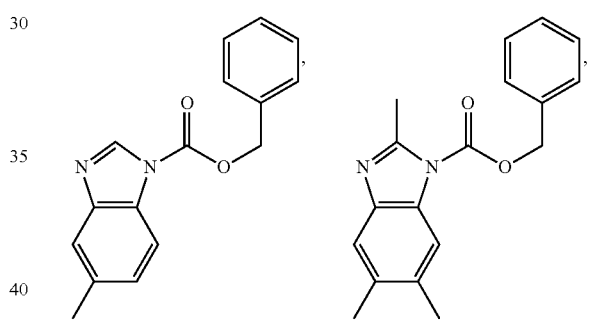
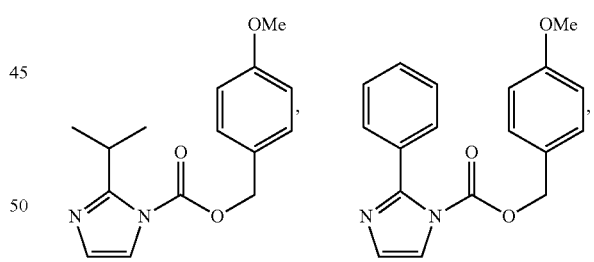
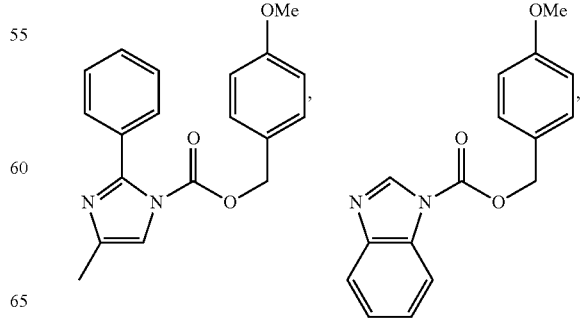

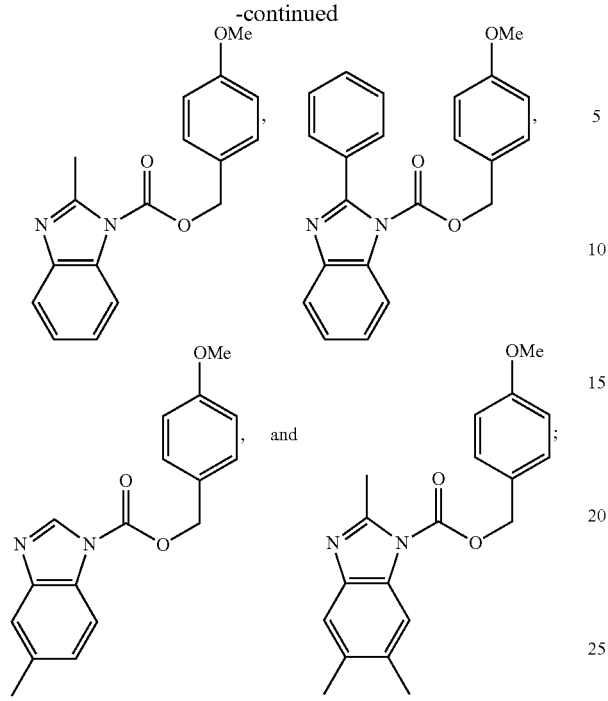
wherein Me stands for methyl.
* * * * *